(12) United States Patent
Konuma et al.

(10) Patent No.: US 9,257,651 B2
(45) Date of Patent: Feb. 9, 2016

(54) ORGANIC ELECTROLUMINESCENCE ELEMENT AND METHOD FOR MANUFACTURING ORGANIC ELECTROLUMINESCENCE ELEMENT

(75) Inventors: Taro Konuma, Tokyo (JP); Kazutoshi Murota, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 585 days.

(21) Appl. No.: 13/703,676

(22) PCT Filed: May 18, 2011

(86) PCT No.: PCT/JP2011/061394
§ 371 (c)(1),
(2), (4) Date: Dec. 12, 2012

(87) PCT Pub. No.: WO2011/158592
PCT Pub. Date: Dec. 22, 2011

(65) Prior Publication Data
US 2013/0087778 A1    Apr. 11, 2013

(30) Foreign Application Priority Data
Jun. 18, 2010    (JP) ................ 2010-139129

(51) Int. Cl.
*H01L 51/50*    (2006.01)
*H01L 51/00*    (2006.01)
*C09K 11/06*    (2006.01)
*H05B 33/14*    (2006.01)
(Continued)

(52) U.S. Cl.
CPC ............ *H01L 51/0032* (2013.01); *C09K 11/06* (2013.01); *H01L 51/0002* (2013.01);
(Continued)

(58) Field of Classification Search
CPC .......... C09K 11/06; C09K 2211/1048; C09K 2211/1088; H01L 51/0002; H01L 51/0032; H01L 51/0037; H01L 51/005; H01L 51/0072; H01L 51/0073; H01L 51/0077; H01L 51/0085; H01L 51/5076; H01L 51/54; H05B 33/14
See application file for complete search history.

(56) References Cited

U.S. PATENT DOCUMENTS

2002/0094452 A1* 7/2002 Ueda et al. .................... 428/690
2004/0106005 A1* 6/2004 Hamada et al. ............... 428/690
(Continued)

FOREIGN PATENT DOCUMENTS

JP    06-207170    7/1994
JP    07-041759    2/1995
(Continued)

OTHER PUBLICATIONS

Asakawa et al., Chem. Eur. J., (1997), vol. 3, No. 7, pp. 1136-1150.*
(Continued)

*Primary Examiner* — Dawn L. Garrett
(74) *Attorney, Agent, or Firm* — Lucas & Mercanti, LLP

(57) ABSTRACT

Disclosed are: an organic electroluminescent element which has high power efficiency, excellent resistance to luminance decrease due to continuous operation and excellent storage stability at high temperatures, while being reduced in chromatically change of color developing light; and a method for manufacturing the organic electroluminescent element. Specifically disclosed is an organic electroluminescent element that has a positive electrode and a negative electrode on a supporting substrate, while comprising an organic layer, which contains at least one light-emitting layer, between the positive electrode and the negative electrode. The organic electroluminescent element is characterized in that at least one layer in the organic layer contains a crown ether compound and a compound having a dibenzofuran skeleton.

9 Claims, 1 Drawing Sheet

(52) U.S. Cl.
CPC .......... *H01L51/005* (2013.01); *H01L 51/0072* (2013.01); *H01L 51/0073* (2013.01); *H01L 51/0077* (2013.01); *H05B 33/14* (2013.01); *C08G 2261/3162* (2013.01); *C08G 2261/512* (2013.01); *C09K 2211/1048* (2013.01); *C09K 2211/1088* (2013.01); *H01L 51/0037* (2013.01); *H01L 51/0085* (2013.01); *H01L 51/5076* (2013.01)

(56) References Cited

U.S. PATENT DOCUMENTS

| | | | |
|---|---|---|---|
| 2006/0115681 A1* | 6/2006 | Kambe et al. | 428/690 |
| 2009/0081357 A1* | 3/2009 | Taka et al. | 427/66 |
| 2012/0193619 A1* | 8/2012 | Taka et al. | 257/40 |

FOREIGN PATENT DOCUMENTS

| | | |
|---|---|---|
| JP | 2003-249367 | 9/2003 |
| JP | 2005-302364 | 10/2005 |
| JP | 2006-173307 | 6/2006 |
| JP | 2006-186269 | 7/2006 |
| JP | 2007-281039 | 10/2007 |
| JP | 2008-060379 | 3/2008 |
| JP | 2008-545729 | 12/2008 |
| WO | 2007/077810 | 7/2007 |
| WO | 2010/029652 | 3/2010 |

OTHER PUBLICATIONS

M.A. Baldo et al., Nature, 395 volumes, pp. 151-154 (Sep. 1998).
M.A. Baldo et al; Nature, 403 volumes, No. 17, pp. 750-753 (2000).

* cited by examiner

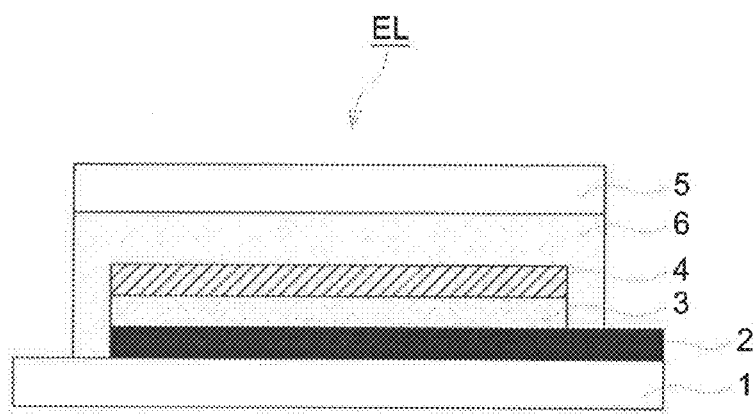

ORGANIC ELECTROLUMINESCENCE ELEMENT AND METHOD FOR MANUFACTURING ORGANIC ELECTROLUMINESCENCE ELEMENT

CROSS REFERENCE TO RELATED APPLICATION

This Application is a U.S. National Phase Application under 35 USC 371 of International. Application PCT/JP2011/061394 filed on May 18, 2011 which, in turn, claimed the priority of Japanese Patent Application No 2010-139129 filed on Jun. 18, 2010, both applications are incorporated by reference herein.

TECHNICAL FIELD

The present invention relates to an organic electroluminescence element and a method for producing an organic electroluminescence element. Especially, the present invention relates to an organic electroluminescence element which has a high fight emitting efficiency and a long service life, is excellent in preservation stability under high temperature, and is further excellent in chromaticity stability.

BACKGROUND ART

As an electronic display device of a light emitting type, an electroluminescence display (which is hereafter abbreviated as ELD) is known. Examples of constitutional elements of the ELD include inorganic electroluminescent elements (hereafter, referred to as inorganic EL elements) and organic electroluminescence elements (hereafter, referred to as organic EL elements).

Although such an inorganic EL element has been used as a flat type light source, in order to drive light emitting elements, a high voltage of alternating current is required. On the other hand, such as organic electroluminescence element has a constitution in which a light emitting layer attaining a compound capable of emitting light is sandwiched between a cathode and an anode. The organic electroluminescence element injects electrons and positive holes into the light emitting layer, recombines them so as to produce exciters (exciton), and emits light by utilizing emission of light (fluorescence and phosphorescence) when the exciters are deactivated. Accordingly, the organic electroluminescence element can emit light with a voltage of about several volts to several ten volts. Further, since the organic electroluminescence element is a self-light-emission type, it has a rich view angle and a high visibility. Furthermore, since the organic electroluminescence element is a tin film type perfect solid state element, it is drawn to attention from the viewpoint of space-saving, portability, and the like.

Moreover, different from the primary light sources conventionally provided to practical use, such as light emitting diodes and cold cathode tubes, the organic electroluminescence element is a surface light source which is also a large feature. Examples of applications to which the above characteristics can be effectively utilized include illumination light sources and backlight for various displays. In recent years, especially, it is also suitable to use the organic electroluminescence element as backlight for liquid crystal full color displays for which demand increases remarkably.

In the case where such an organic electroluminescence element is used as such an illumination light source or backlight of a display, it is expected to be used as a light source to provide white color or so-called electric bulb color (hereafter, collectively called as white color). Examples of techniques to obtain white light emission with an organic electroluminescence element include the following methods. According to one of the methods, a plurality of light emitting materials different in wavelength of emission light is arranged in one element so as to obtain white color by mixture of colors. According to another one of the methods, multi color light emitting elements are coated with respective different colors of, for example, blue, green and red, and made to emit respective light simultaneously so as to obtain white color by mixture of colors. According to still another one of the methods, white color is obtained by use of color converting elements (for example, a combination of blue light emitting material and color converting fluorescence pigment).

With the judgment based on various request required for illumination light source and backlight, such as low cost, high productivity, and simple driving method, the method of arranging a plurality of light emitting materials different in wavelength of emission, light in one element and obtaining white color by mixture of colors may be preferable for these applications. In recent years, research and development have been made actively for the method.

The above-mentioned method of obtaining white color light will be described further in detail. That is, examples of the method include a method of employing two color light emitting elements having a relationship of complementary colors to each other in one element, such as blue light emitting material and yellow light emitting material and mixing colors so as to obtain white color; and a method of employing three color emitting materials of blue, green and red and mixing colors so as to obtain white color.

For example, according to the disclosed method (for example, refer to Patent Document 1 and Patent Document 2), three color phosphors of blue, green and red with high efficiency are doped as light emitting materials so as to obtain a white organic electroluminescence element. However, in the disclosed method, there is not only a problem that sufficient light emitting efficiency is not obtained, but also a problem that emission light color is fluctuated greatly due to change of current density.

In recent years, for the phosphor materials, phosphorescence luminescent materials are developed energetically so as to obtain an organic electroluminescence element with higher luminance (for example, Patent document 4 and Non-patent Documents 1 and 2). Light emission from the conventional phosphor materials is light emission from singlet excitation, and production ratio of singlet exciter to triplet exciter is (1:3). Accordingly, although the production probability of luminescence exciter species is 25%, since the upper limit of internal quantum efficiency becomes 100% due to exciter production ratio and internal conversion from the singlet exciter to the triplet exciter, the light emission efficiency becomes theoretically at most four times as compared with the case of fluorescence luminescent material. However, in particular, with regard to the phosphorescence luminescent material which provides blue light emission, there is no material which is excellent in light emission efficiency, disability, and especially, driving service life. In the current state, hitherto, it is difficult to develop a practical organic electroluminescence element which employs a blue phosphorescence luminescent material.

Moreover, reduction or elimination of barrier for charge injection between a cathode and an organic layer in order to attain low voltage and high brightness contributes greatly to improve the efficiency of a device. It is generally known to use metals having low work function such as alkali metals and alkaline earth metals in a cathode material. However, there are problems that these metals quickly diffuse in the neighboring organic layers, and cause deterioration of preservation stability under high temperature. Therefore, studies have been made to catch these alkali metals so as to prolong service life of the organic electroluminescence elements and to improve light emitting characteristics (for example, refer to Patent Document 3 and Patent document 4). However, there is no suggestion with regard to improvement in color fluctuation of light emission color.

Therefore, in the current state of the organic electroluminescence elements which are used as an illumination light source or backlight of displays and provide white light emission with a low driving voltage and high efficiency, an organic electroluminescence element is not realized such that the element is excellent in resistant characteristic for lowering of brightness due to continuous operation and preservation stability under high temperature and has less chromaticity fluctuation of light emission.

RELATED ART DOCUMENT

Patent Documents

Patent document 1: Japanese Unexamined Patent Publication No. 6-207170 official report
Patent document 2: Japanese Unexamined Patent Publication No. 7-41759 official report
Patent document 3: Japanese Unexamined Patent Publication No. 2003-249367 official report
Patent document 4: Japanese Unexamined Patent Publication No. 2005-302364 official report Non-Patent Documents Non-patent Document 1: M. A. Baldo et al., nature, 395 volumes. Page 151-154 (1998)
Non-patent Document 2: M. A. Baldo et al., nature, 403 volumes. No. 17, Page 750-753 (2000)

SUMMARY OF THE INVENTION

Problems to be Solved by the Invention

The present invention has be achieved in view of the above-mentioned problems, and an object of the present invention is to provide an organic electroluminescence element which is excellent in resistant characteristic for lowering of brightness due to continuous operation and preservation stability under high temperature and has less chromaticity fluctuation of light emission among organic electroluminescence elements to provide white light emission, and to provide a method for manufacturing the organic electroluminescence element.

Means for Solving the Problems

The above-mentioned object of the present invention is attained by the following constitutions.

1. An organic electroluminescence element which has an anode and a cathode on a substrate, and has an organic layer including at least one light emitting layer between the anode and the cathode, is characterized in that at least one organic layer contains a compound having a dibenzofuran skeleton and a crown ether compound.

2. The organic electroluminescence element described in the item 1, is characterized in that the organic layer containing a compound having a dibenzofuran skeleton and a crown ether compound is a layer having an electron transporting property.

3. The organic electroluminescence element described in the item 2, is characterized in that the organic layer an electron transporting property is an electron transporting layer.

4. The organic electroluminescence element described in any one of the items 1 to 3, is characterized in that the organic layer containing a compound having a dibenzofuran skeleton and a crown ether compound is a light emitting layer.

5. The organic electroluminescence element described in any one of the items 1 to 4, is characterized in that the organic layer containing a compound having a dibenzofuran skeleton and a crown ether compound further contains an organic acid alkali metal salt.

6. The organic electroluminescence element described, in any one of the items 1 to 5, is characterized in that the compound having a dibenzofuran skeleton is a compound represented by the following Formula (A).

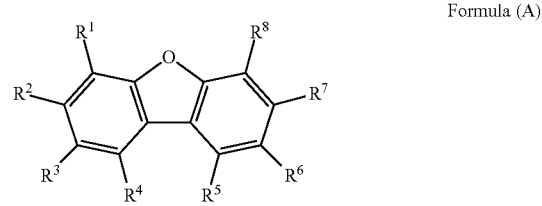

Formula (A)

In the above Formula (A), $R^1$ to $R^8$ each represents a hydrogen atom, an alkyl group, an aryl group, a hetero aryl group, a carbazolyl group, an azacarbazolyl group, or a diaza carbazolyl group, and when there are more than one, $R^1$ to $R^8$ may represent different ones.

7. The organic electroluminescence element described in the item 6 is characterized, in that at least one of $R^1$ to $R^8$ in the above Formula (A) is a carbazolyl group or an azacarbazolyl group.

8. The organic electroluminescence element described in any one of the items 1 to 7, is characterized in that the crown ether compound is at least one sort selected from compounds represented by Formula (B), Formula (C), and Formula (D) each mentioned below.

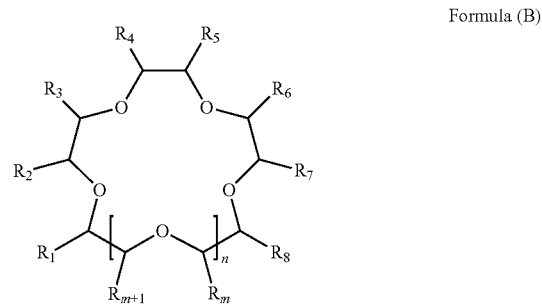

Formula (B)

In the above Formula (B), n represents an integer of 0 to 4. $R_1$ to $R_8$, $R_m$, and $R_{m+1}$ each represents a hydrogen atom or a hydrocarbon group with a carbon number of 1 to 10. The symbol "m" represents an odd number of 9 to 15 which is represented by a formula of (n×2+7), where n is 1 to 4. Further, the hydrocarbon group may be substituted with one or more functional groups selected from a group consisting of a straight chain or branch chain alkoxyl group with a carbon number of 1 to 10, —OH group, —COOH group and —COO— alkyl ester group (however, an alkyl portion is a straight chain or branch chain residue with a carbon number of 1 to 10), in addition, $R_j$ and $R_{j+1}$ neighboring the $R_j$ may form a ring-shaped skeleton in cooperation with each other. In this regard, $R_j$ represents a group ($R_2$, $R_4$, $R_6$, or $R_8$) with an even number among $R_1$ to $R_8$ or $R_{m+1}$.

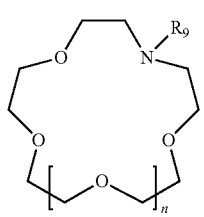

Formula (C)

In the above Formula (C), $R_9$ represents a hydrogen atom, an alkyl group which may have a substituent or a phenyl group which may have a substituent. The symbol "n" represents an integer of 0 to 5.

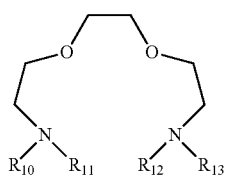

Formula (D)

In the above Formula (D), $R_{10}$ to $R_{13}$ each represents independently a hydrogen atom, an alkyl group which may have a substituent or a phenyl group which may have a substituent. Further, $R_{10}$ and $R_{12}$ or $R_{13}$, or $R_{11}$ and $R_{12}$ or $R_{13}$ are linked via an alkylene oxide group so as to form a ring-shaped compound.

9. A method for producing an organic electroluminescence element which has an anode and a cathode on a substrate, and has an organic layer including at least one light emitting layer between the anode and the cathode, wherein, at least one organic layer contains a compound having a dibenzofuran skeleton and a crown ether compound, is characterized by having 1) a process of disposing on electrode on a substrate; 2) a process of disposing an organic layer including at test one light emitting layer; 3) a process of disposing the other electrode on the organic layer; and 4) a process of heating at 40 to 150 after disposing the other electrode, in this order.

Effect of the Invention

According to the present invention, in organic electroluminescence elements used for illumination light source or backlight of displays and to provide white light emission, it becomes possible to provide an organic electroluminescence element which is excellent in resistant characteristic for lowering of brightness due to continuous operation and preservation stability under high temperature and has less chromaticity fluctuation of light emission.

BRIEF DESCRIPTION OF DRAWINGS

FIG. 1 is an outline sectional view snowing an example of constitution of an organic electroluminescence element of the present invention.

MODE FOR IMPLEMENTING THE INVENTION

Hereafter, modes for implementing the present invention will be described in detail.

As a result of achievement of diligent studies in view of the above-mentioned problems, the inventor found that with the constitution that at least one organic layer constituting an organic electroluminescence element contains a compound having a dibenzofuran skeleton and a crown ether compound, an organic electroluminescence element used for illumination light source or backlight of displays and to provide white light emission indicates high electric power efficiency and is excellent in resistant characteristic for lowering of brightness due to continuous operation and preservation stability under high temperature and has less chromaticity fluctuation of light, emission among organic electroluminescence elements to provide white light emission, and then the inventor achieved the present invention.

In the present invention, as a still more desirable mode, at least one organic layer contains a compound represented by Formula (A) as the compound having a dibenzofuran skeleton and a compound represented by Formula (B) as the crown ether compound. With this constitution, it becomes possible to control charge transporting ability (electron transporting ability), to suppress lowering of brightness due to continuous light emission under high temperature environment, and to suppress fluctuation of chromaticity of light emission constituted by a plurality of dopants.

In the constitution of the conventional organic EL elements, in order to promote electron injection, it is generally known to use metals having low work function such as alkali metals and alkaline earth metals as institutional materials of a cathode. However, there are problems that these metals quickly diffuse in the neighboring organic layers, and cause deterioration of preservation stability under high temperature. Therefore, studies have been made to catch these alkali metals so as to prolong service life of the organic electroluminescence elements and to improve light emitting characteristics. However, both of electric power efficiency and light emitting life span of an organic EL element used for illumination light sources and backlight of displays are insufficient. However, with the constitution mat at least one organic layer specified in the present invention contains a compound having a dibenzofuran skeleton and a crown ether compound, in particular, with a combination of a compound represented by Formula (A) as the compound having a dibenzofuran skeleton and a compound represented by Formula (B) as the crown ether compound in at least one organic layer, these problems can be solved, and further, it becomes possible to suppress fluctuation of chromaticity of light emission color at the time of lowering of brightness.

Hereafter, the present invention will be explained in detail.
<<Constitution of an Organic Electroluminescence>>

In the present invention, an organic layer means each layer which constitutes an organic electroluminescence (hereafter, also referred to as organic EL) disposed between an anode and a cathode. The organic layer includes, for example, a positive hole injection layer, a positive hole transporting layer, an electron block layer, a light emitting layer, an electron transporting layer, an electron injection layer, a positive hole block layer, and the like. Although preferable specific examples of me organic EL according to the present invention are shown hereafter, the present invention is not limited to these examples.

(i) flexible substrate/anode/light emitting layer/electron transporting layer/anode/heat conductive layer/adhesives for sealing/sealing component (ii) flexible substrate/anode/positive hole transporting layer/light emitting layer/electron transporting layer/anode/heat conductive layer/adhesives for sealing/sealing component (iii) flexible substrate/anode/positive hole transporting layer/light emitting layer/positive hole blocking layer/electron transporting layer/anode/heat conductive layer/adhesives for sealing/sealing component (iv) flexible substrate/anode/positive hole transporting layer/light emitting layer/positive hole blocking layer/electron transporting layer/cathode buffer layer/anode/heat conductive layer/adhesives for sealing/sealing component (v) flexible substrate/anode/positive hole buffer layer/positive hole transporting layer/light emitting layer/positive hole blocking layer/electron transporting layer/cathode buffer layer/anode/heat conductive layer/adhesives for sealing/sealing component (vi) glass substrate/anode/positive hole injection layer/light emitting layer/electron injection layer/cathode/sealing component (vii) glass substrate/anode/positive hole injection layer/positive hole transporting layer/light emitting layer/electron injection layer/cathode/sealing component (viii) glass substrate/anode/positive hole injection layer/positive hole transporting layer/light emitting layer/electron transporting layer/electron injection layer/cathode/sealing component <<Compound having a Dibenzofuran Skeleton>>

In the organic EL element of the present invention, one of features is that at least one layer of organic layers constituting an organic electroluminescence element contains a compound having a dibenzofuran skeleton, and further, it is preferable that the compound having a dibenzofuran skeleton is a compound represented by the following Formula (A).

Hereafter, the compound having a dibenzofuran skeleton represented by Formula (A) will be explained.

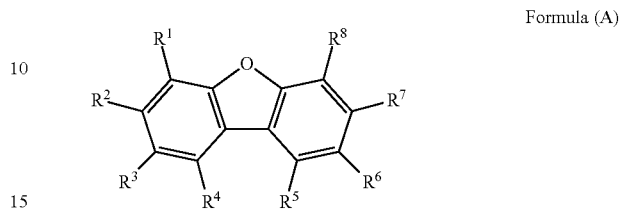

Formula (A)

In the above Formula (A), $R^1$ to $R^8$ each represents a hydrogen atom, an alkyl group, an aryl group, a hetero aryl group, a carbazolyl group, an azacarbazolyl group, or a diaza carbazolyl group, and when there are more than one, $R^1$ to $R^8$ may represent different ones. Further, it is desirable that at least one of $R^1$ to $R^8$ in the above Formula (A) is a carbazolyl group or an azacarbazolyl group.

Furthermore, the above-mentioned substituent may have a connecting group, and may be combined with one or more substituents.

As a desirable mode, Formula (A) is substituted asymmetrically, and, specifically, a 2,6-dibenzofuran diyl group, a 2,8-dibenzofuran diyl group and the like are desirable.

The content of the compound having a dibenzofuran skeleton according to the present invention is preferably 20 to 99.0 mass % of an organic layer to which the compound is added, and more preferably 50 to 97.5 mass %.

Hereafter, although specific examples of compounds used as Formula (A) are shown, the present invention is not limited to these examples.

A-1

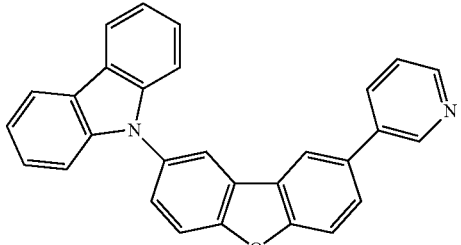

A-2

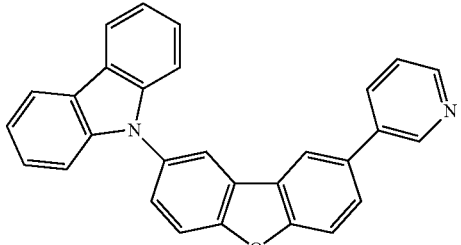

A-3

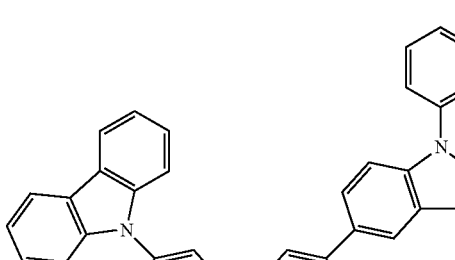

A-4

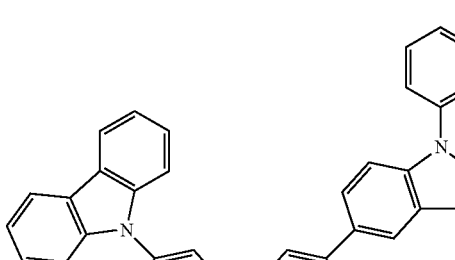

-continued
A-5
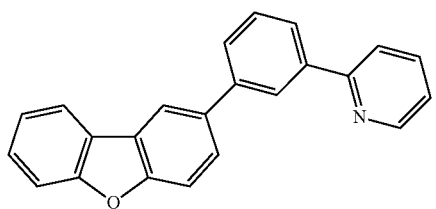
A-6
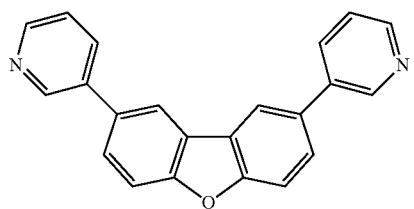
A-7
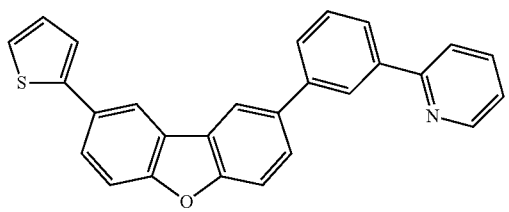
A-8
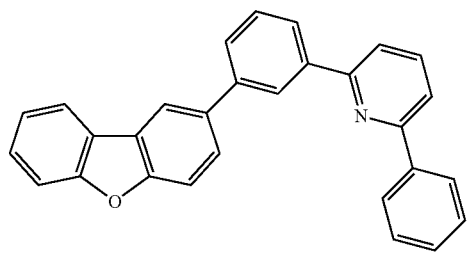
A-9
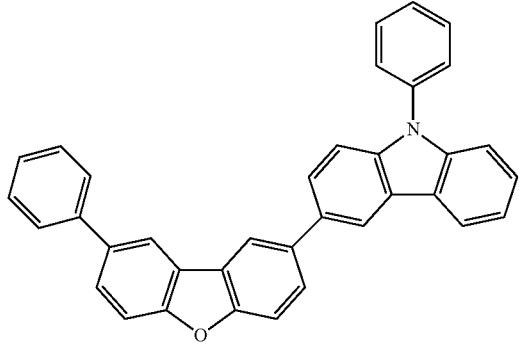
A-10
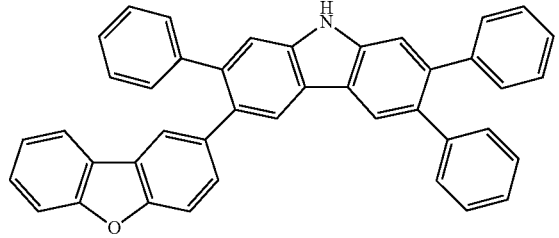
A-11
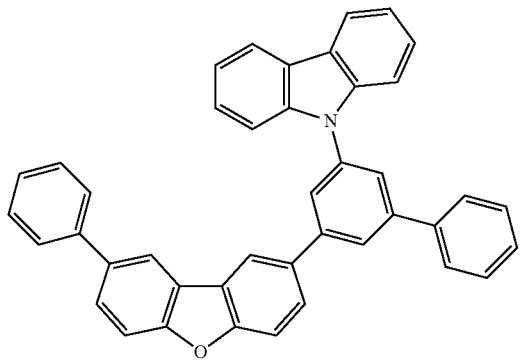
A-12
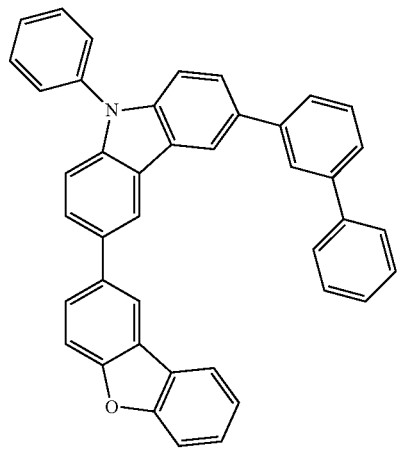
A-13
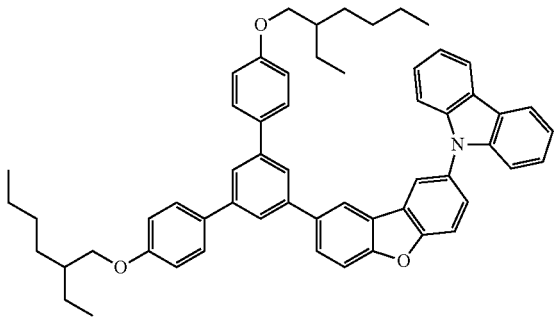
A-14
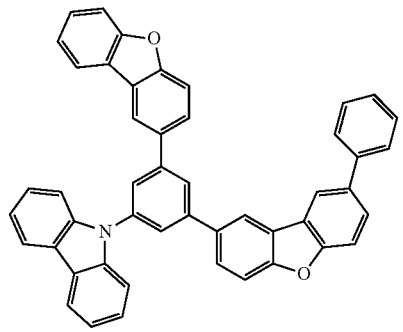

-continued
A-15
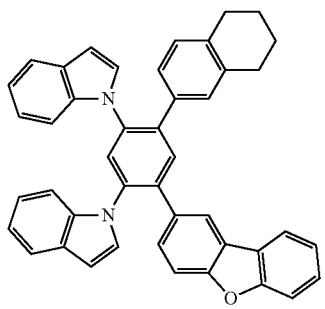
A-16
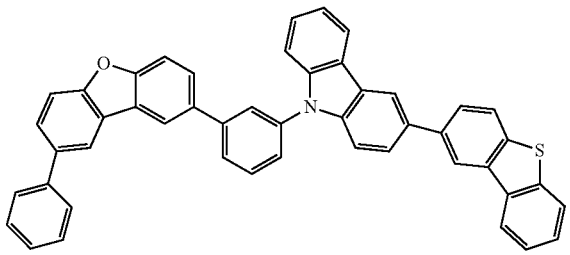
A-17
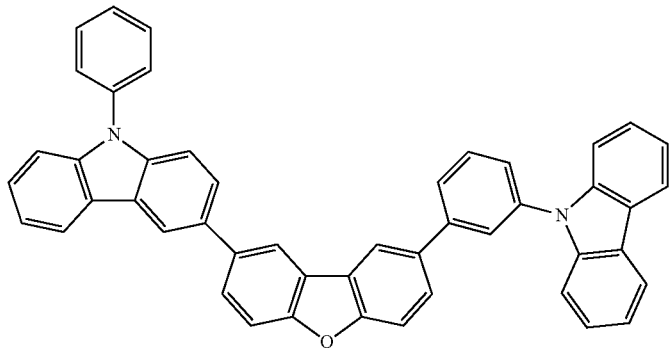
A-18
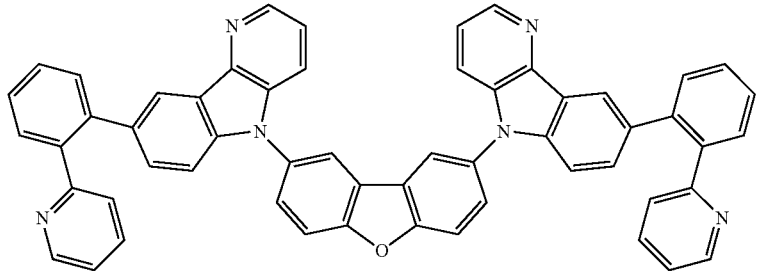
A-19
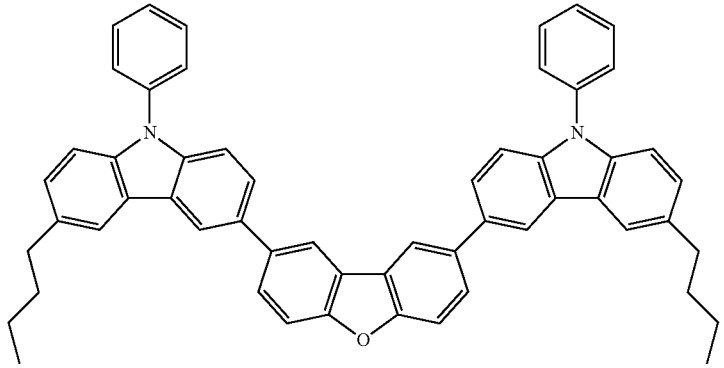
A-20
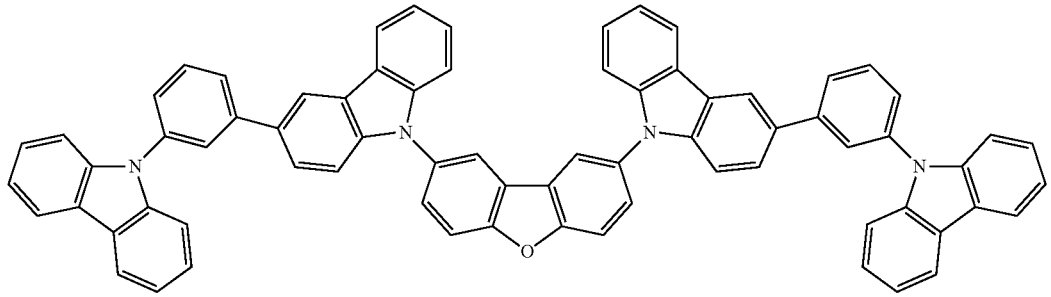

-continued
A-21
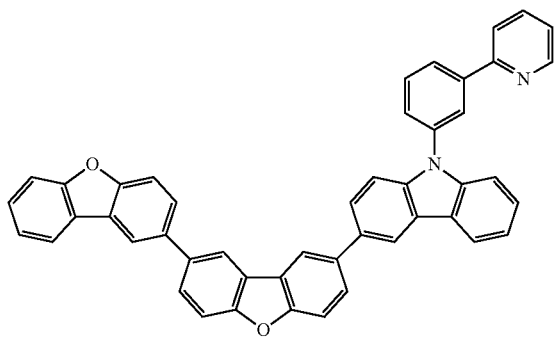
A-22
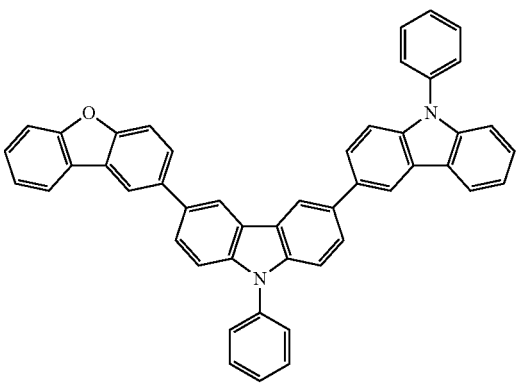
A-23
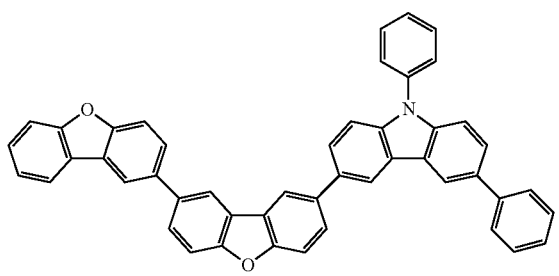
A-24
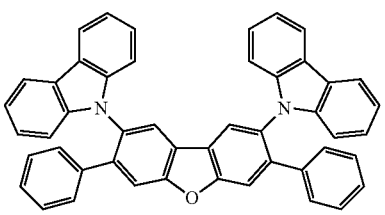
A-25
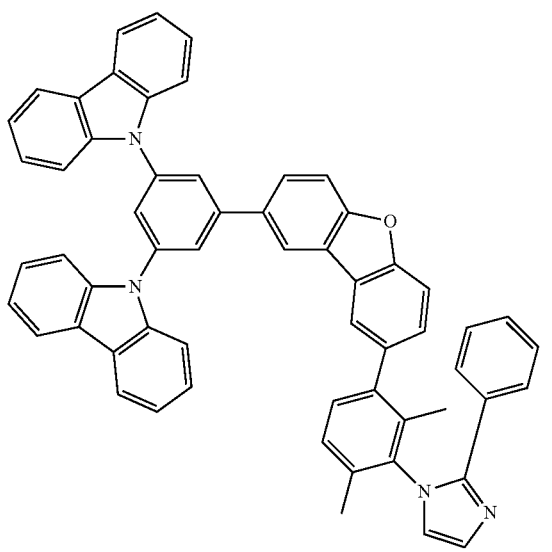
A-26
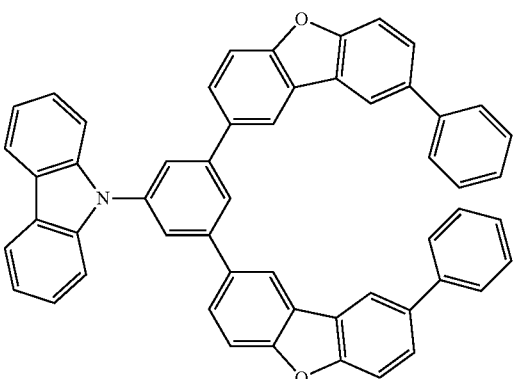
A-27
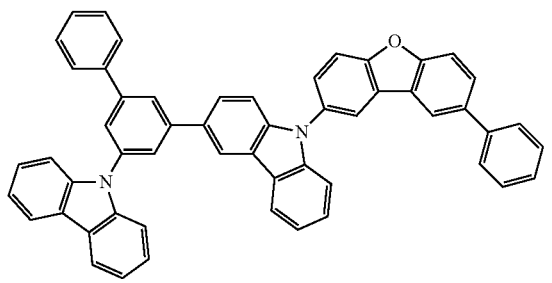
A-28
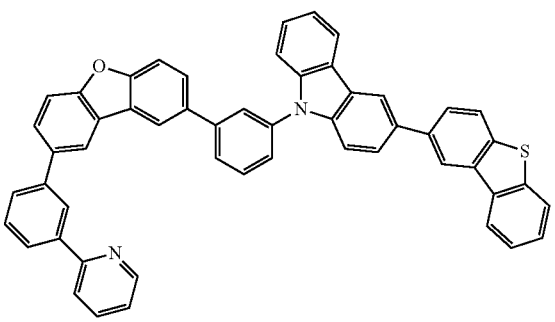

-continued
A-29
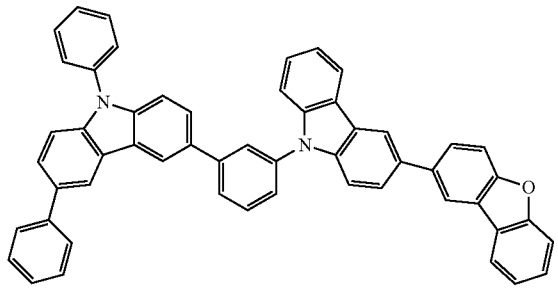
A-30
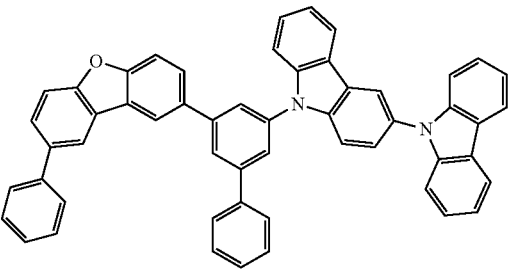
A-31
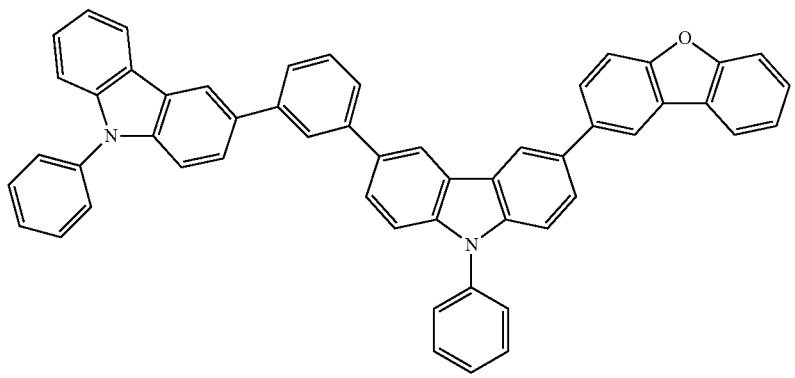
A-32
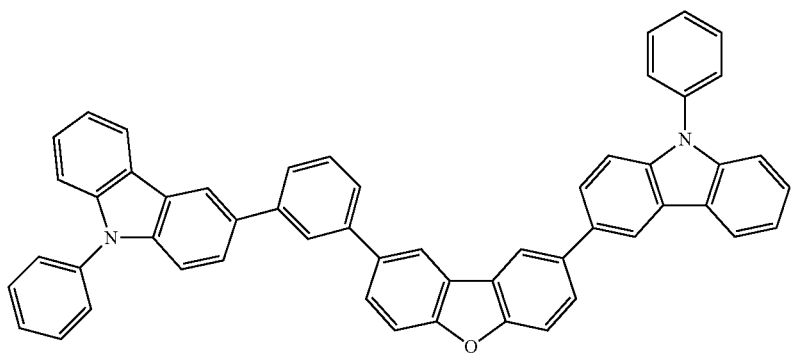
A-33
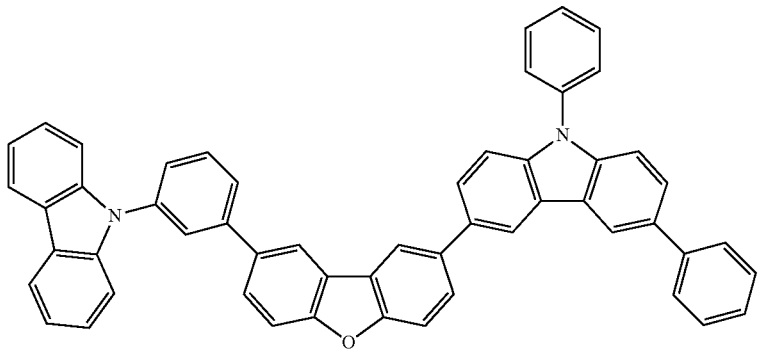

-continued
A-34
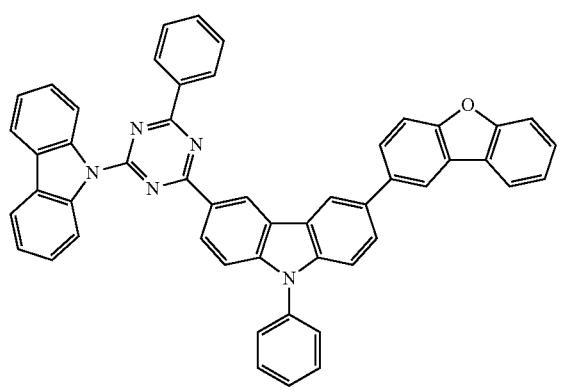
A-35
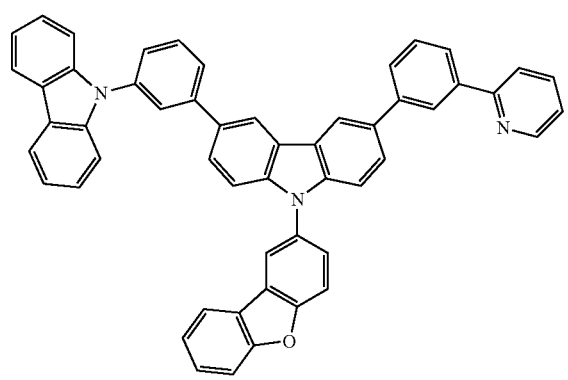
A-36
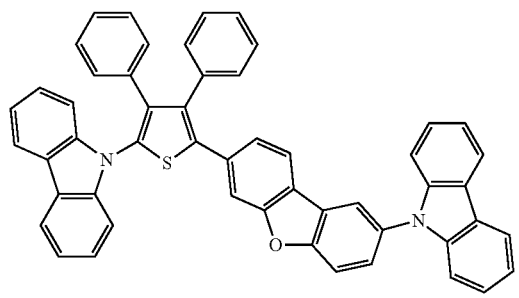
A-37
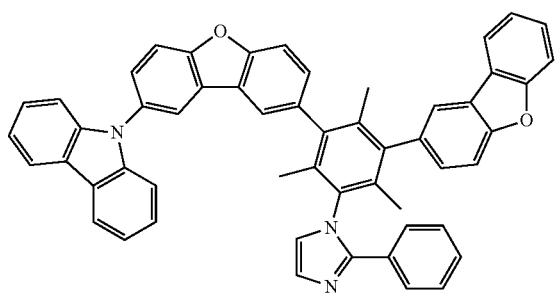
A-38
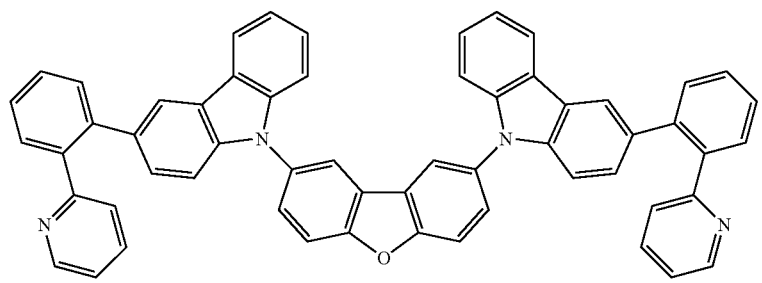
A-39
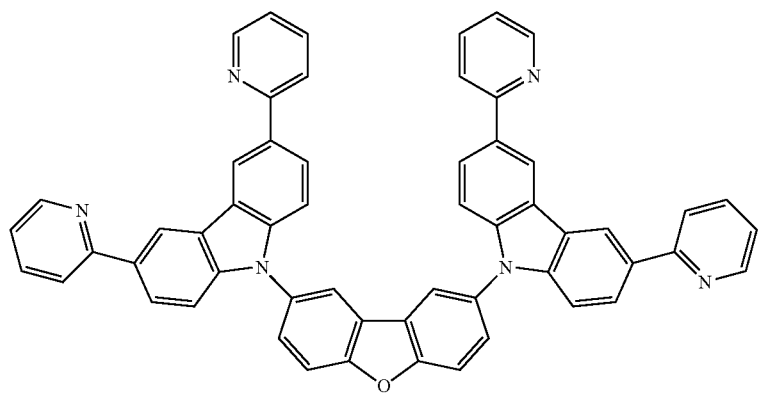

-continued
A-40
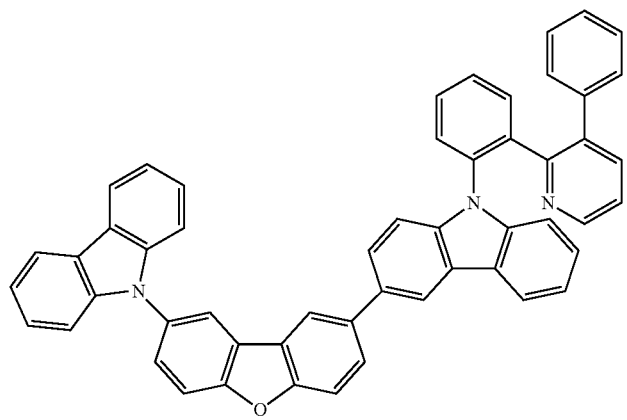
A-41
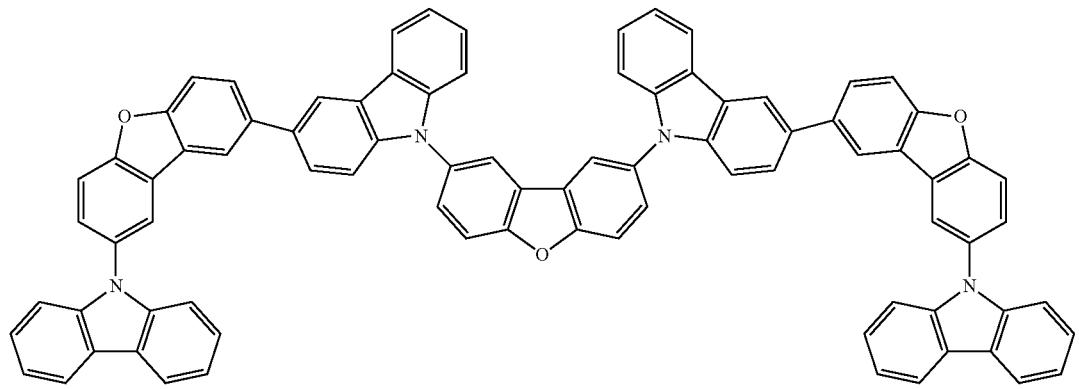
A-42
A-43
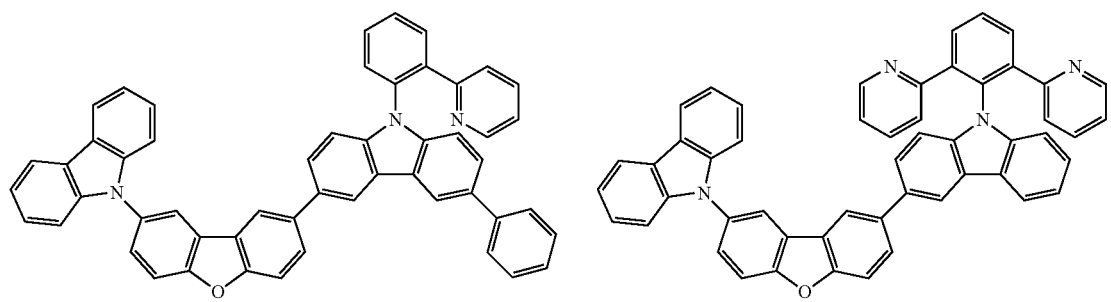
A-44
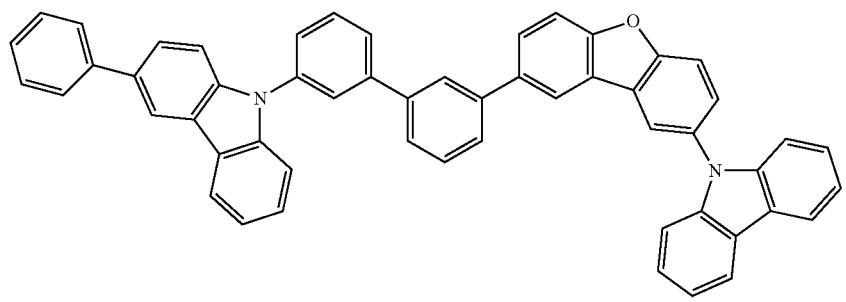

-continued
A-45
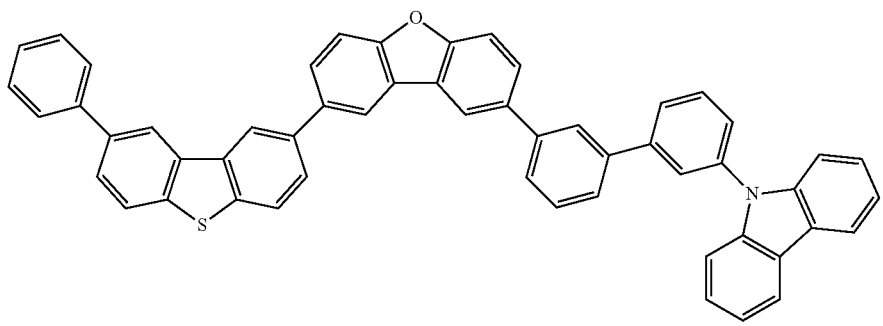
A-46
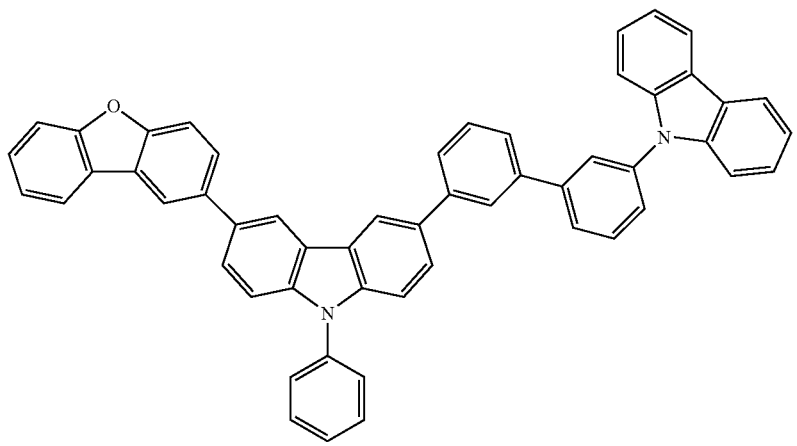
A-47
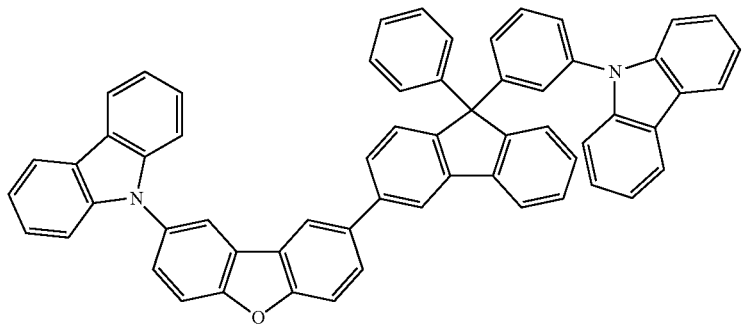
A-48
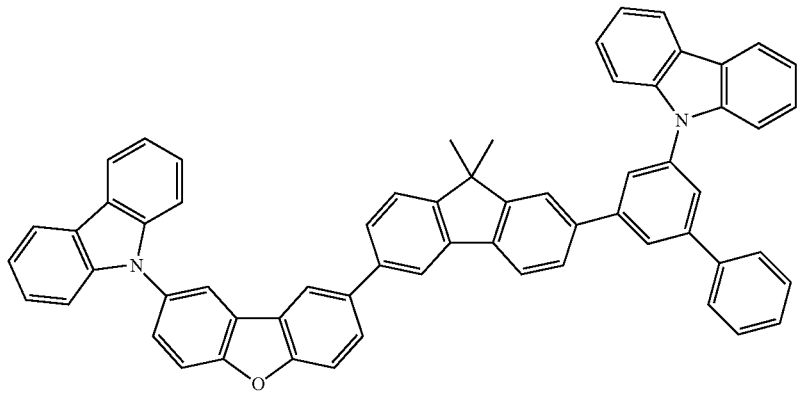

-continued
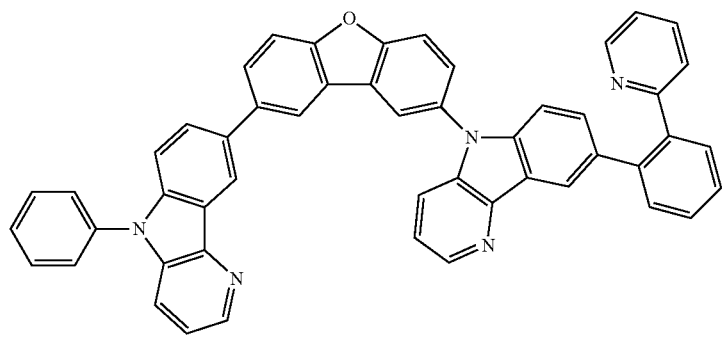
A-49
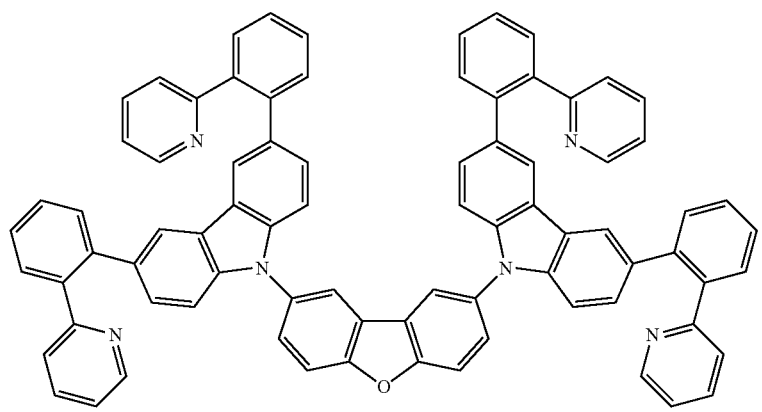
A-50
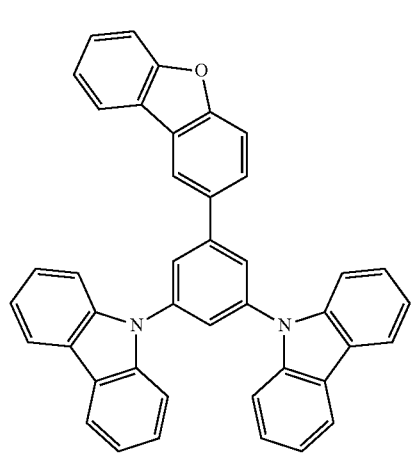
A-51
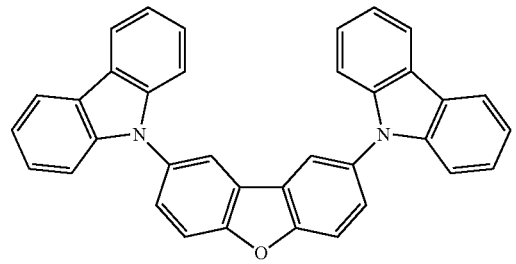
A-52
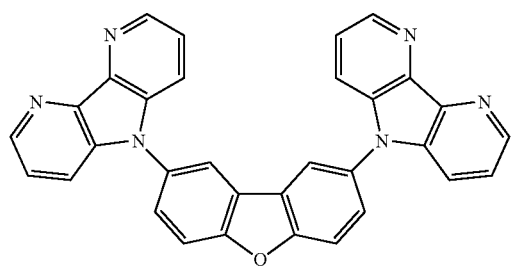
A-53

-continued
A-54
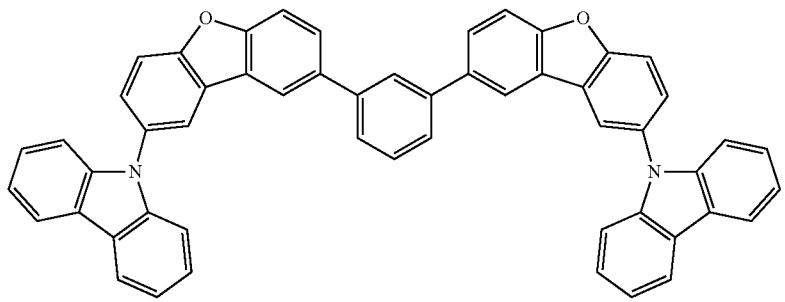
A-55
A-56
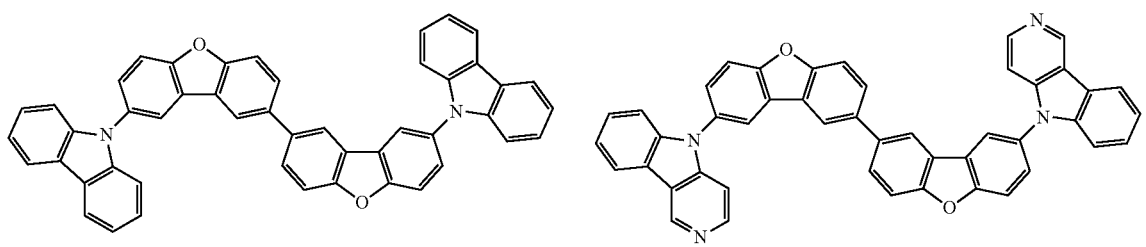
A-57
A-58
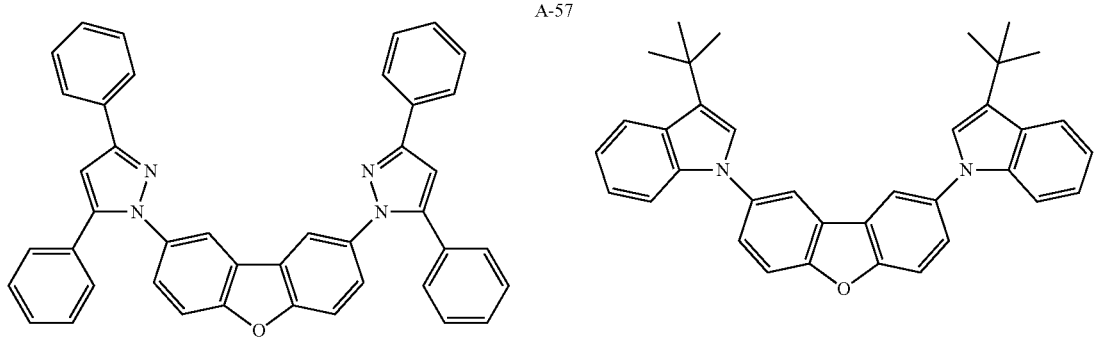
A-59
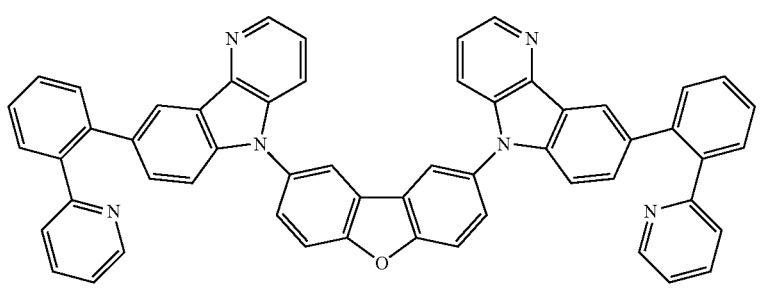

-continued
A-60
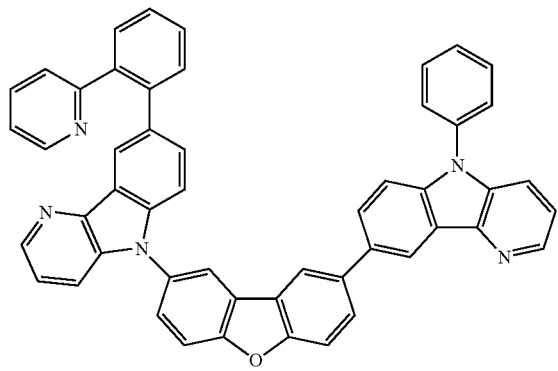
A-61
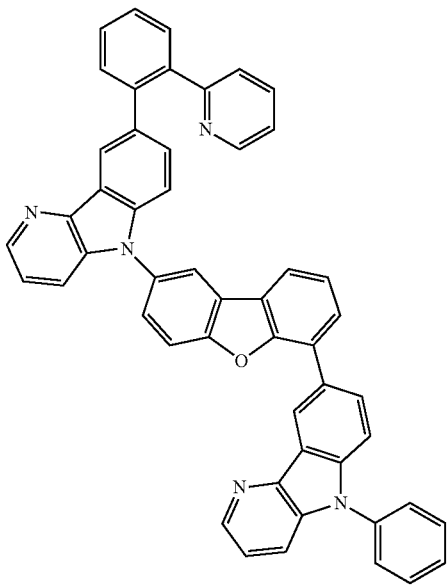
A-62
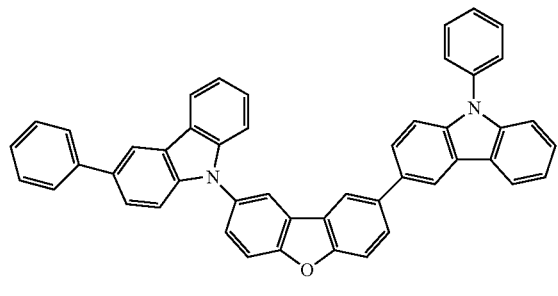
A-63
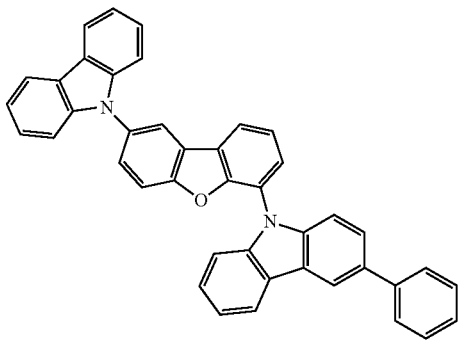
A-64
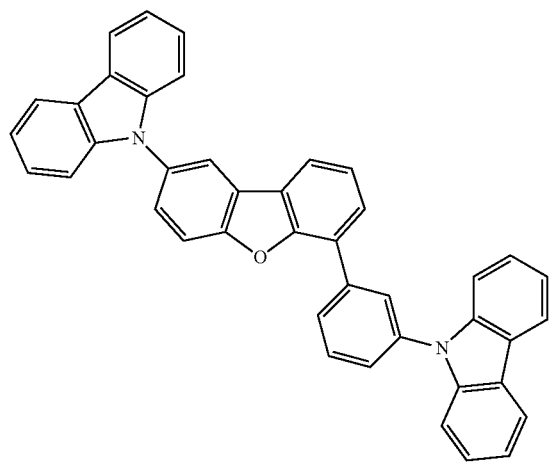
A-65
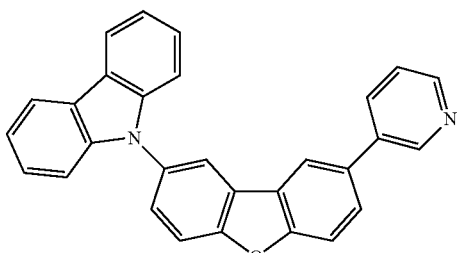

-continued
A-66 A-67
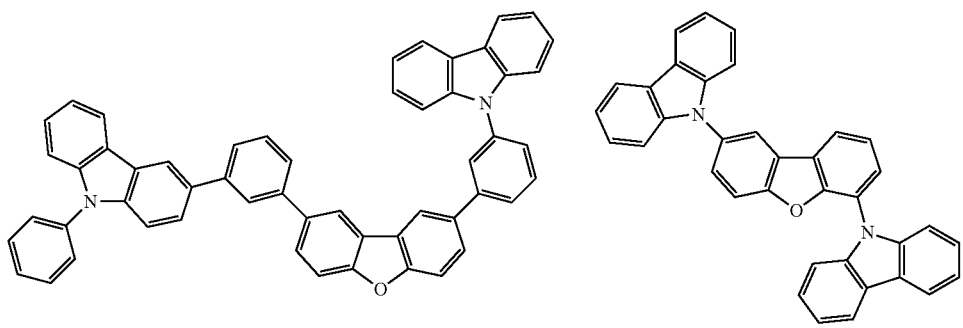
A-68 A-69
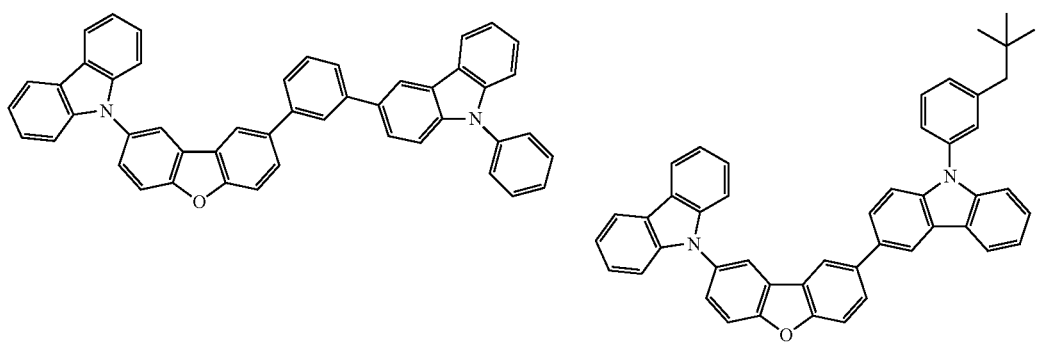
A-70 A-71
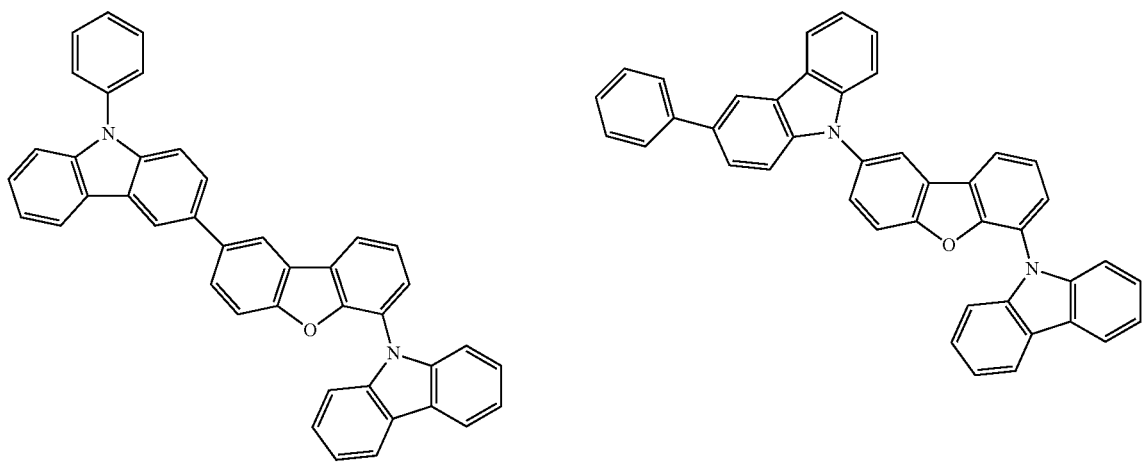
A-72 A-73
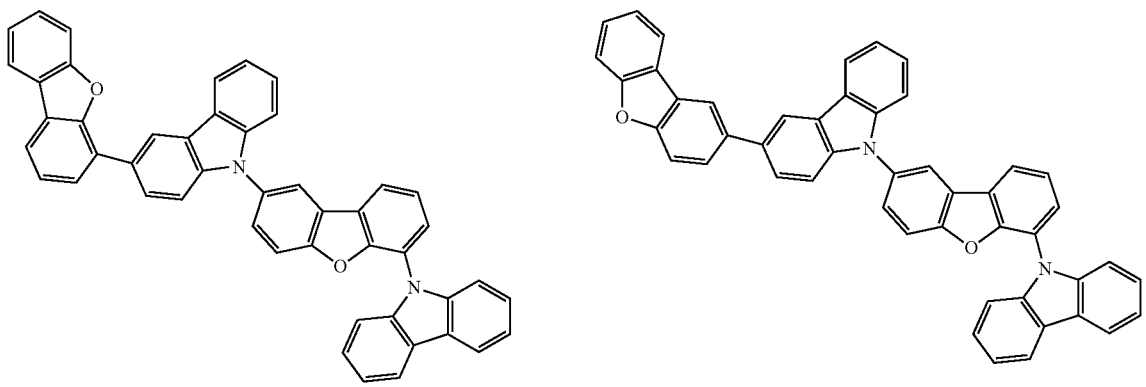

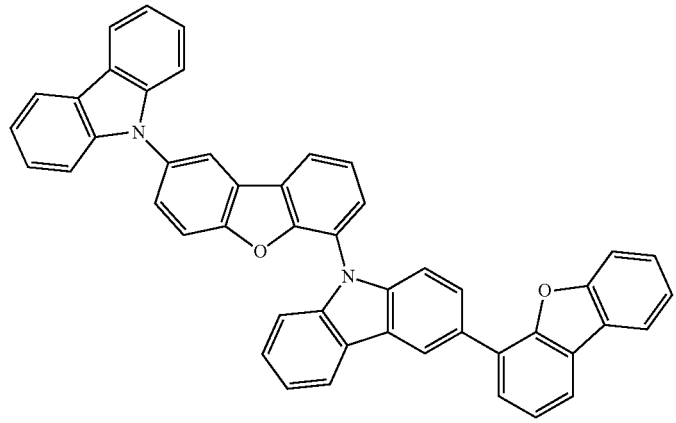
A-74
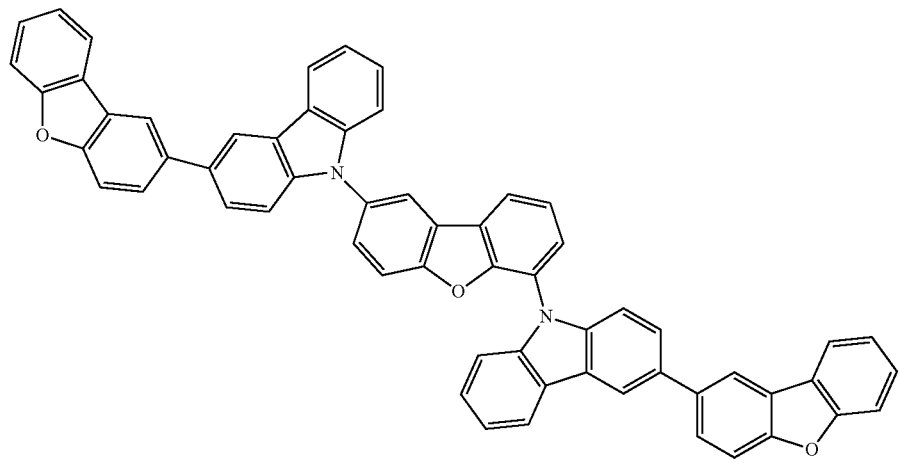
A-75
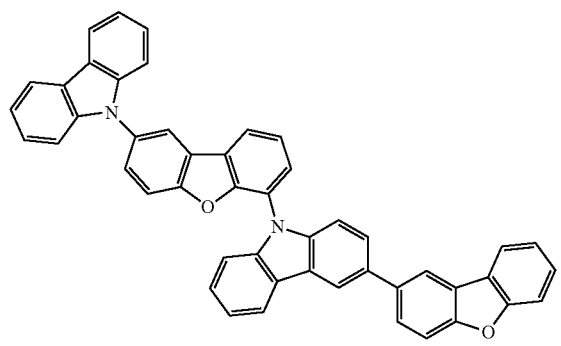
A-76
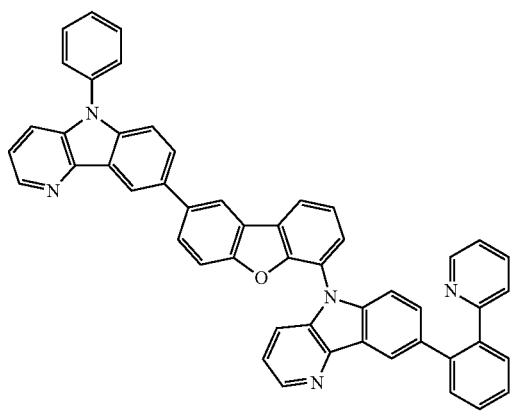
A-77

A-78

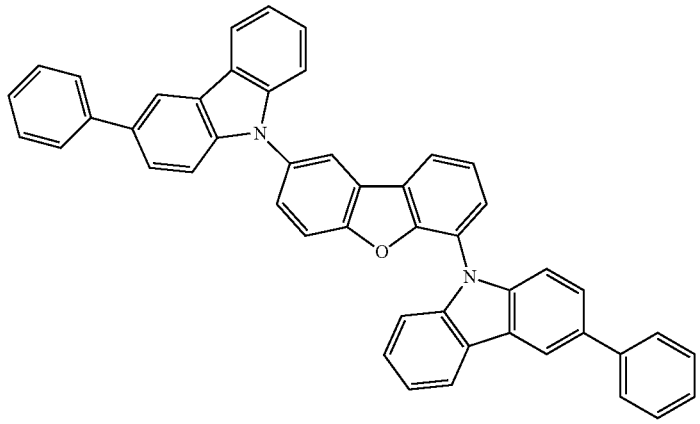

The compound having a dibenzofuran skeleton according to the present invention may be synthesized in accordance with conventionally-known synthetic methods.

<<Crown Ether Compound>>

In the organic EL element of the present invention, one of features is that at least one layer of organic layers according to the present invention contains a crown ether compound in addition to the above-mentioned compound having a dibenzofuran skeleton.

The crown ether compound according to the present invention is the collective term of a compound which has cyclic ether and a function included in a vacancy as being specified in the definition of "crown ether" described in the fifth edition of an Iwanami physics-and-chemistry dictionary (published in 1998 by Iwanami Bookstore and edited by Saburo Nagakura et al.).

The crown ether compound according to the present invention is a crown ether compound having multiple oxygen atoms, a sulfur atom, and a nitrogen atom, or its analog. In the crown ether compound, the oxygen atoms, the sulfur atom, aid the nitrogen atom may be mixed with each other (the total number is at least four or more). The sulfur atom relating to formation of the crown ether compound may be a sulfur atom single body and a sulfoxide or sulfone state in which the sulfur atom is oxidized. Similarly, the nitrogen atom may be in the state of a non-substituted or substituted amino group, or an ammonium cation.

Further, a bond to connect among the oxygen atom, the sulfur atom, and the nitrogen atom may include a single bond like m ethylene chain and multiple bonds like an ethyne chain, and the multiple bonds may form a ring like an aromatic carbon ring or an aromatic heterocycle (also referred to as a hetero aromatic ring). Furthermore, the hydrogen atom in the compound may be substituted by a substituent. Examples of the substituent include, an alkyl group (such as a methyl group, ethyl group, propyl group, isopropyl group, (t)butyl group, pentyl group, hexyl group, octyl group, dodecyl group, tridecyl group, tetradecyl group, and pentadecyl group); a cycloalkyl group (such as, a cyclopentyl group and cyclohexyl group); an alkenyl group (such as, a vinyl group and allyl group); an alkynyl groups (such as, a propargyl group); an aryl group (such as, a phenyl group, p-chloro phenyl group, mesityl group, tolyl group, xylyl group, naphthyl group, anthryl group, azulenyl group, acenaphthenyl group, fluorenyl group, phenanthryl group, indenyl group, pyrenyl group and biphenylyl group); a heterocycle group (such as, a pyridyl group, thiazolyl group, oxazolyl group, imidazolyl group, furil group, pyrrolyl group, pyrazinyl group, pyrimidinyl group, pyridazinyl group, selenazolyl group, sulfolanyl group, piperidinyl group, pyrazolyl group, and tetazolyl group); an alkoxyl group (such as, a methoxy group, ethoxy group, propyloxy group, pentyloxy group, hexyloxy group, octyloxy group, and dodecyloxy group); a cycloalkoxyl group (such as, a cyclopentyloxy group and cyclohexyloxy group); an aryl oxy groups (such as, a phenoxy group and naphthyl oxy group); an alkylthio group (such as, a methyl thio group, ethyl thio group, propyl thio group, pentyl thio group, hexyl thio group, octylthio group, and dodecyl thio group); a cyclo alkylthio group (such as, a cyclopentyl, thio group and cyclohexyl thio group); an arylthio group (such as, a phenylthio group and naphthyl thio group); an alkoxycarbonyl group (such as, a methyloxy carbonyl group, ethyloxy carbonyl group, butyloxy carbonyl group, octyloxy carbonyl group, and dodecyloxy carbonyl group); an aryloxy carbonyl group (such as, a phenyloxy carbonyl group, and naphthyl oxy carbonyl group); a sulfamoyl group (such as, an amino sulfonyl group, methylamino sulfonyl group, dimethylamino sulfonyl group, butylamino sulfonyl group, and hexylamino sulfonyl group, cyclohexylamino sulfonyl group, octylamino sulfonyl group, dodecylamino sulfonyl group, phenylamino sulfonyl group, naphthyl amino sulfonyl group, and 2-pyridyl amino sulfonyl group); an ureido group (such as, a methyl ureido group, ethyl ureido group, pentyl ureido group, cyclohexyl ureido group, octyl ureido group, dodecyl ureido group, phenyl ureido group, naphthyl ureido group, and 2-pyridyl amino ureido group); an acyl group (such as, an acetyl group, ethyl carbonyl group, propyl carbonyl group, pentyl carbonyl group, cyclohexyl carbonyl group, octyl carbonyl group, 2-ethyl hexyl carbonyl group, dodecyl carbonyl group, phenyl carbonyl group, naphthyl carbonyl group, and pyridyl carbonyl group); an acyloxy groups (such as, an acetyloxy group, ethylcarbonyl oxy group, butylcarbonyl oxy group, octyl carbonyl oxy group, dodecylcarbonyl oxy group, and phenylcarbonyl oxy group), an amide group (such as, a methylcarbonyl amino group, ethylcarbonyl amino group, dimethylcarbonyl amino group, propylcarbonyl amino group, pentylcarbonyl amino group, cyclohexylcarbonyl amino group 2-ethyl hexyl carbonyl amino group, octylcarbonyl amino group, dodecylcarbonyl amino group, phenylcarbonyl amino group, and naphthyl carbonyl amino group); a carbamoyl group (such as, an aminocarbonyl group, methyl aminocarbonyl group, dimethylamino carbonyl group, propyl aminocarbonyl group, pentyl aminocarbonyl group, cyclohexyl aminocarbonyl group, octyl aminocarbonyl group, 2-ethyl hexyl aminocarbonyl group, dodecyl aminocarbonyl group, phenylamino carbonyl group, naphthyl aminocarbonyl group, and 2-pyridyl aminocarbonyl group); a sulfinyl group (such as, a methyl sulfinyl group, ethyl sulfinyl group, butyl sulfinyl group, cyclohexyl sulfinyl group, 2-ethyl hexyl sulfinyl group, dodecyl sulfinyl group, phenyl sulfinyl group, naphthyl sulfinyl group, and 2-pyridyl sulfinyl group); an alkyl sulfonyl group or aryl sulfonyl group (such as, a methyl sulfonyl group, ethyl sulfonyl group, butyl sulfonyl group, cyclohexyl sulfonyl group, 2-ethyl hexyl sulfonyl group, dodecyl sulfonyl group, phenyl sulfonyl group, naphthyl sulfonyl group, and 2-pyridyl sulfonyl group); an amino group (such as, an amino group, ethylamino group, dimethylamino group, butylamino group, cyclopentylamino group, 2-ethyl hexyl amino group, dodecylamino group, anilino group, naphthyl amino group, and 2-pyridyl amino group); a nitro group; and a cyano group.

These substituents may be further substituted by the above-mentioned substituents. Further, multiple substituents of these substituents may bond with each other so as to form a ring.

In the present invention, it is desirable that the crown ether compound according to the present invention is at least one sort selected from compounds represented by Formula (B), Formula (C), and Formula (D) each mentioned below.

Formula (B)

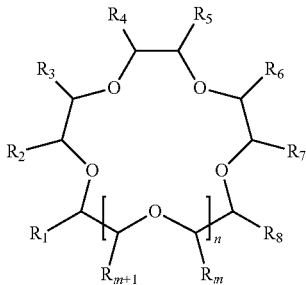

In the above general formula (B), n represents an integer of 0 to 4. $R_1$ to $R_8$, $R_m$, and $R_{m+1}$ each represents a hydrogen atom or a hydrocarbon group with a carbon number of 1 to 10. The symbol "m" represents an odd number of 9 to 15 which is represented by a formula of (n×2+7), where n is 1 to 4. Further, the hydrocarbon group may be substituted with one or more functional groups selected from a group consisting of a straight chain or branch chain alkoxyl group with a carbon number of 1 to 10, —OH group, —COOH group and —COO— alkyl ester group (however, an alkyl portion is a straight chain or branch chain residue with a carbon number of 1 to 10), in addition, $R_j$ and $R_{j+1}$ neighboring the Rj may form a ring-shaped skeleton in cooperation with each other. In this regard, $R_j$ represents a group ($R_2$, $R_4$, $R_6$, or $R_8$) with an even number among $R_1$ to $R_8$ or $R_{m+1}$.

Formula (C)

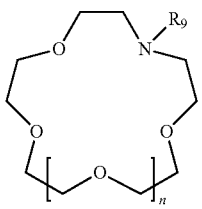

In the above-mentioned general formula (C), $R_9$ represents a hydrogen atom, an alkyl group which may have a substituent or a phenyl group which may have a substituent. The symbol "n" represents an integer of 0 to 5. Examples of an alkyl group represented by $R_9$ include a methyl group, ethyl group, propyl group, isopropyl group, (t)butyl group, pentyl group, hexyl group, octyl group, dodecyl, tridecyl group, tetradecyl group, and pentadecyl group. Examples of the substituents which the alkyl group or the phenyl group may have include the above-mentioned substituents which the crown ether compound according to the present above-mentioned invention may have.

Formula (D)

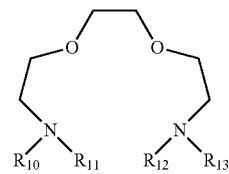

In the above-mentioned general formula (D), $R_{10}$ to $R_{13}$ each represents independently a hydrogen atom, an alkyl group which may have a substituent or a phenyl group which may have a substituent. Further, $R_{10}$ and $R_{12}$ or $R_{13}$, or $R_{11}$ and $R_{12}$ or $R_{13}$ are linked via an alkylene oxide group so as to form a ring-shaped compound. Examples of the alkyl group represented by $R_{10}$ to $R_{13}$ include a methyl group, ethyl group, propyl, group, isopropyl group, (t)butyl group, pentyl group, hexyl group, octyl group, dodecyl group, tridecyl group, tetradecyl group, and pentadecyl group. Examples of the substituents which the alkyl group or the phenyl group may have include the above-mentioned substituents which the crown ether compound according to the present above-mentioned invention may have.

Hereafter, although specific examples of the crow ether compound represented by the general formula (B) to the general formula (D) are shown, the present invention is not limited to these examples.

CN-1

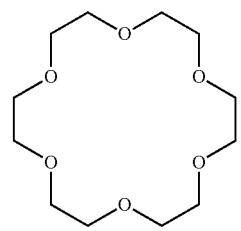

CN-2

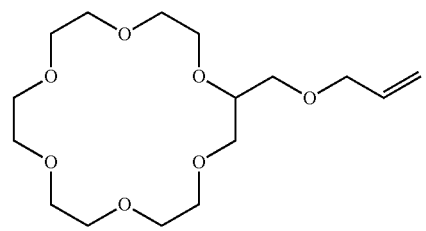

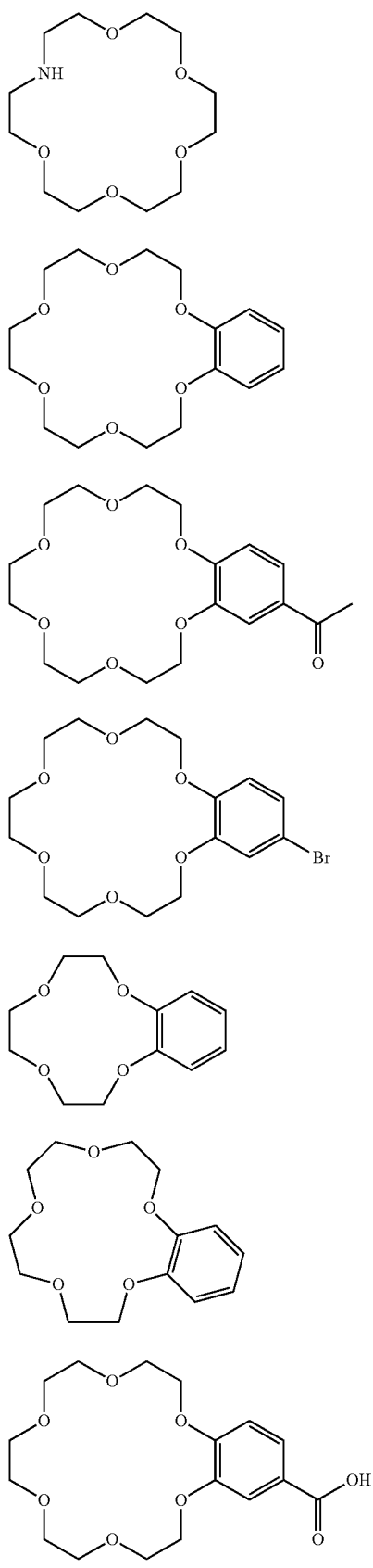
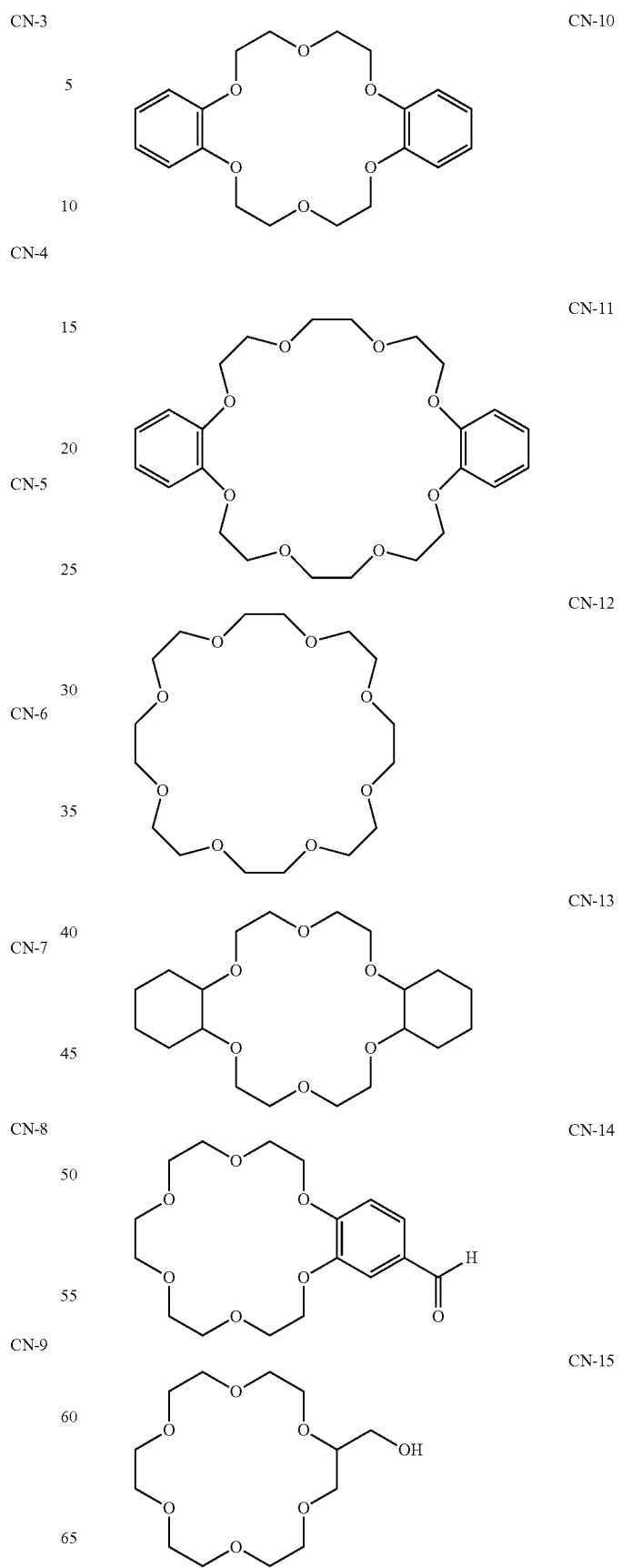

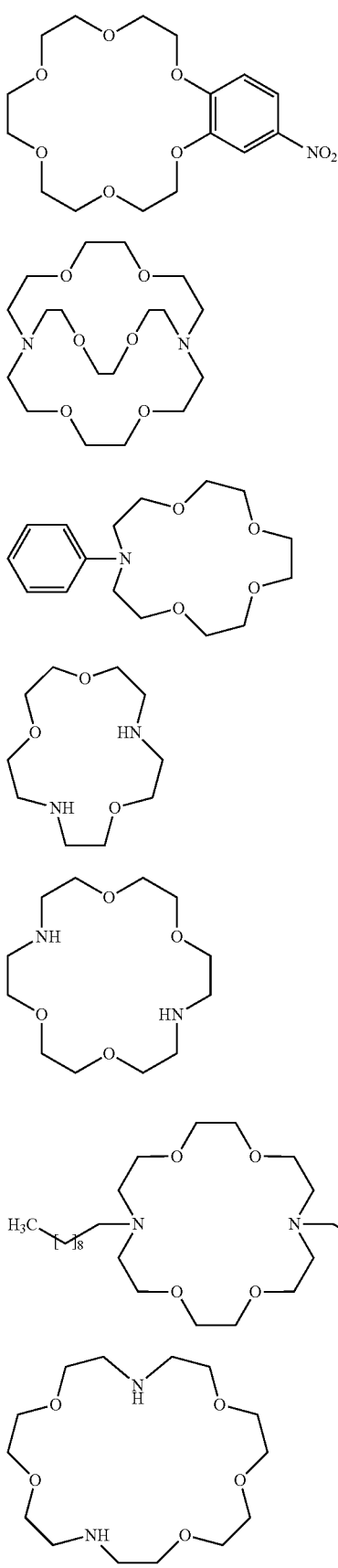
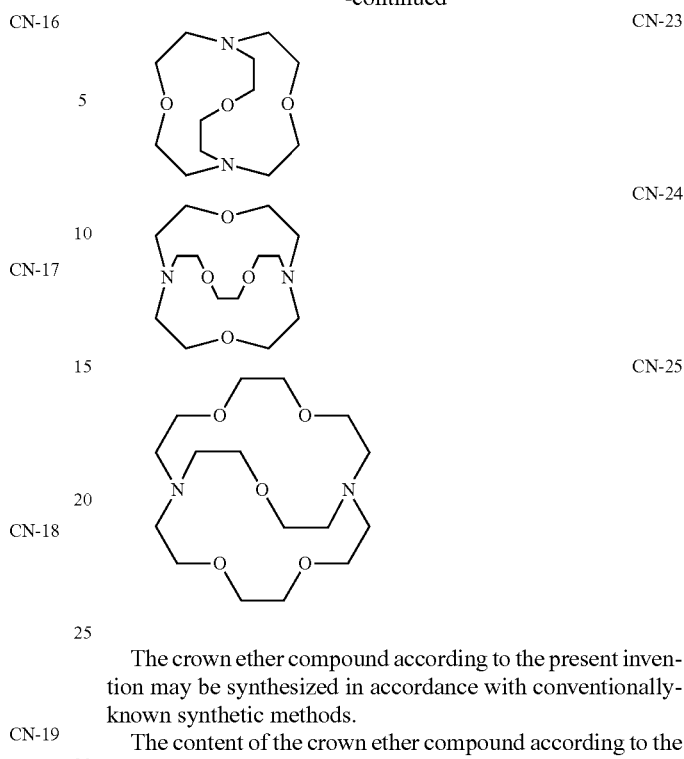

The crown ether compound according to the present invention may be synthesized in accordance with conventionally-known synthetic methods.

The content of the crown ether compound according to the present invention is preferably 0.001 to 10 mass % of an organic layer to which the compound is added, and more preferably 0.005 to 2.5 mass %.

In the present invention, it is preferable for the organic layer containing a compound having a dibenzofuran skeleton and a crown ether compound according to the present invention to have an electron transporting property, and it is still more preferable that this organic layer is an electron transporting layer.

Moreover, one of preferable modes is that the organic layer containing a compound having a dibenzofuran skeleton and a crown ether compound according to the present invention is a luminous layer.

<<Organic Acid Alkali Metal Salt>>

In the present invention, it is desirable that the above-mentioned organic layer containing a compound having a dibenzofuran skeleton and a crown ether compound according to the present further contains an organic acid alkali metal salt.

Examples of the organic acid alkali metal salt according to the present invention include, without being limited specifically thereto, formate, acetate, propionate, butyrate, valerianate, caproic acid salt, enanthic acid salt, caprylic acid salt, oxalate, malonic acid salt, succinate, benzoate, phthalate, isophthalic acid salt, terephthalic acid salt, salicylate, pyruvate, lactate, malate, adipate, mesylic acid salt, tosylic acid salt, and benzenesulfonic acid salt. Among them, formate, acetate, propionate, butyrate, valerianate, caproic acid salt, enanthic acid salt, caprylic add salt, oxalate, malonic acid salt, succinate, and benzoate are preferable. Further, alkali metal salt of aliphatic carboxylic acid, such as formate, acetate, propionate, and butyrate are more preferable, and aliphatic carboxylic acid with four or less carbons is still more preferable. Furthermore, acetate is most preferable.

Moreover, although the kind of the alkali metal in the organic acid alkali metal salt according to the present invention is not limited to specifically, examples of the kind include Na, K, and Cs. Among them, K and Cs are preferable, and Cs is more preferable.

Preferable examples of the organic acid alkali metal salt according to the present invention The preferably include formic acid Li, formic acid K, formic acid Na, formic acid Cs, acetic acid Li, acetic acid K, acetic acid Na, acetic acid Cs, propionic acid Li, propionic acid Na, propionic acid K, propionic acid Cs, oxalic acid Li, oxalic acid Na, and oxalic acid K, oxalic acid Cs, malonic acid Li, malonic acid Na, and malonic acid K, malonic acid Cs, succinic acid Li, succinic acid Na and succinic acid K, succinic acid Cs, benzoic acid Li, benzoic acid Na, benzoic acid K, and benzoic acid Cs. Among them, acetic acid Li, acetic acid K, acetic acid Na, and acetic acid Cs are more preferably, and acetic acid Cs is most preferable.

The content of the organic acid alkali metal salt according to the present invention is preferably 1.5 to 35 mass % to the organic layer to which it is added, more preferably 3 to 25 mass %, and most preferably 5 to 15 mass %.

<<Organic Layer of an Organic EL Element>>

Next, detail description will be given for an organic layer which constitutes the organic EL element of the present invention.

[Injection Layer: Positive Hole Injection Layer, and Electron Injection Layer]

In the organic EL element of the present invention, an injection layer may be disposed as required. Examples of the injection layer include an electron injection layer and a positive hole injection layer. As mentioned above, the injection layer may be disposed between an anode and a light emitting layer or a positive hole transporting layer, and between a cathode and a light emitting layer or an electron transporting layer.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer and an electron injection layer.

A positive hole injection layer is also described in detail in Japanese Unexamined Patent Publication Nos. 9-45479, 9-260062 and 8-288069. Specific examples of the positive hole injection layer include polymer or aniline copolymer containing triazole derivative, oxa diazole derivative, imidazole derivative, pyrazolone derivative, pyrazolone derivative, phenylenediamine derivative, arylamine derivative, amino-substituted chalcone derivative, oxazole derivative, styryl anthracene derivative, fluorenone derivative, hydrazone derivative, stilbene derivative, or silazane derivative; poly aryl alkane derivative, and conductive polymer. Among them, poly thiophene derivative, poly aniline derivative, and polypyrrole derivative are preferable, and poly thiophene derivative is more preferable.

An electron injection layer is also described in detail in Japanese Unexamined Patent Publication Nos. 6-325871, 9-17574 and 10-74586. Specific examples of the electron injection layer include a metal buffer layer represented by strontium and aluminum; an alkali, metal compound buffer layer represented by lithium fluoride; an alkali earth metal compound buffer layer represented by magnesium fluoride; and an oxide buffer layer represented by aluminum oxide. In the present invention, the above-mentioned buffer layer (injection layer) is preferably a very thin film, and potassium fluoride and sodium fluoride are desirable. Its thickness is about 0.1 nm to 5 μm, preferably 0.1 to 100 nm, more preferably 0.5 to 10 nm, and most preferably 0.5 to 4 nm.

[Positive Hole Transporting Layer]

As a positive hole transporting material constituting a positive hole transporting layer, the same compound applicable to the above positive hole injection layer may be used. Further, a porphyrin compound, an aromatic tertiary amine compound, and a styrylamine compound may be used. Specifically, an aromatic tertiary amine compound may be preferably used.

Typical examples of the aromatic tertiary amine compound and the styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolyaminophenyl)-4-phenylcyclohexane; bis(4-dimethylamino-2-metyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quadriphenyl; N,N,N-tri(p-tolyl)amine; 4-(di-p-tolylamino)-4'-[4-di-p-triamino)styryl]stilbene; 4-N,N-diphenylamino-(2-diphenylvinyl)benzene; 3-methoxy-4'-N,N-diphenylaminostilbene; and N-phenylcarbazole, in addition, compounds having two condensed aromatic rings in a molecule, described in U.S. Pat. No. 5,061,569, such as 4,4'-bis[N-(1-naphthyl)-N-phenylamino]biphenyl (NDP), and compounds in which three triphenylamine units are linked in a in a star burst form, described in JP-A No. 4-308688, such as 4,4',4"-tris[N-(3-methylphenyl)-N-phenylamino]triphenylamine (MDT-DATA).

Further, polymer materials, in which these materials are introduced in a polymer chain or these materials are made as main chain of a polymer, may be also used. Furthermore, inorganic compounds, such as p type-Si and p type-SiC, may be also used as the hole injection material and the hole transporting material.

Moreover, it is possible to also use positive hole transporting materials, supposed to have a so-called p-type semiconductor-like nature, described in JP-A Nos. 4-297076, 2000-196140, and 2001-102175, J. Appl. Phys., 95, 5773 (2004), JP-A No. 11-251067, and Document by J. Huang et al (Applied Physics Letters 80 (2002), p. 139), and JP-A No. 2003-519432.

The positive hole transporting layer may be prepared by formation of a thin layer with the above-described positive hole transport material through a well known method such as a vacuum deposition method, a spin coating method, a casting method, a printing method including an inkjet method and a LB method. The layer thickness of the positive hole transporting layer is not specifically limited to. However, it is generally about 5 nm to 5 μm, and preferably 5 nm to 200 nm. This positive transporting layer may have a single layer structure composed of one or two or more kinds of the above described materials.

Hereafter, specific examples of the compound used for the positive hole transporting material of the organic EL element of the present invention are shown. However, the present invention should not be limited to these examples.

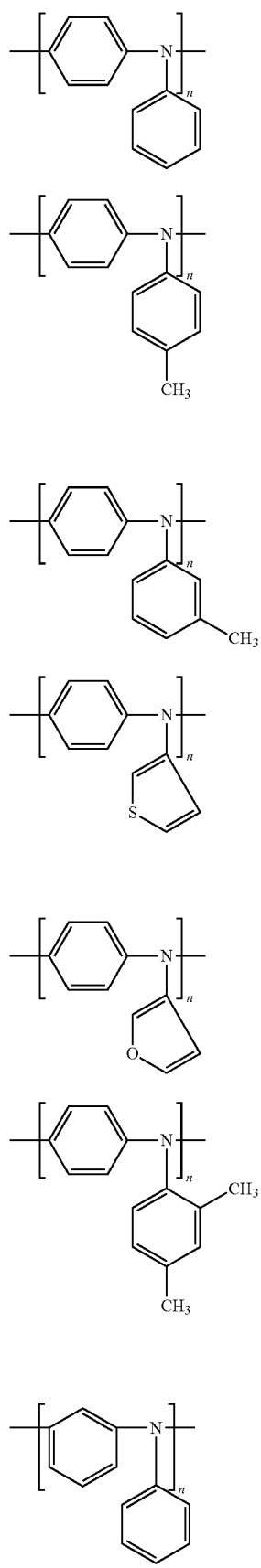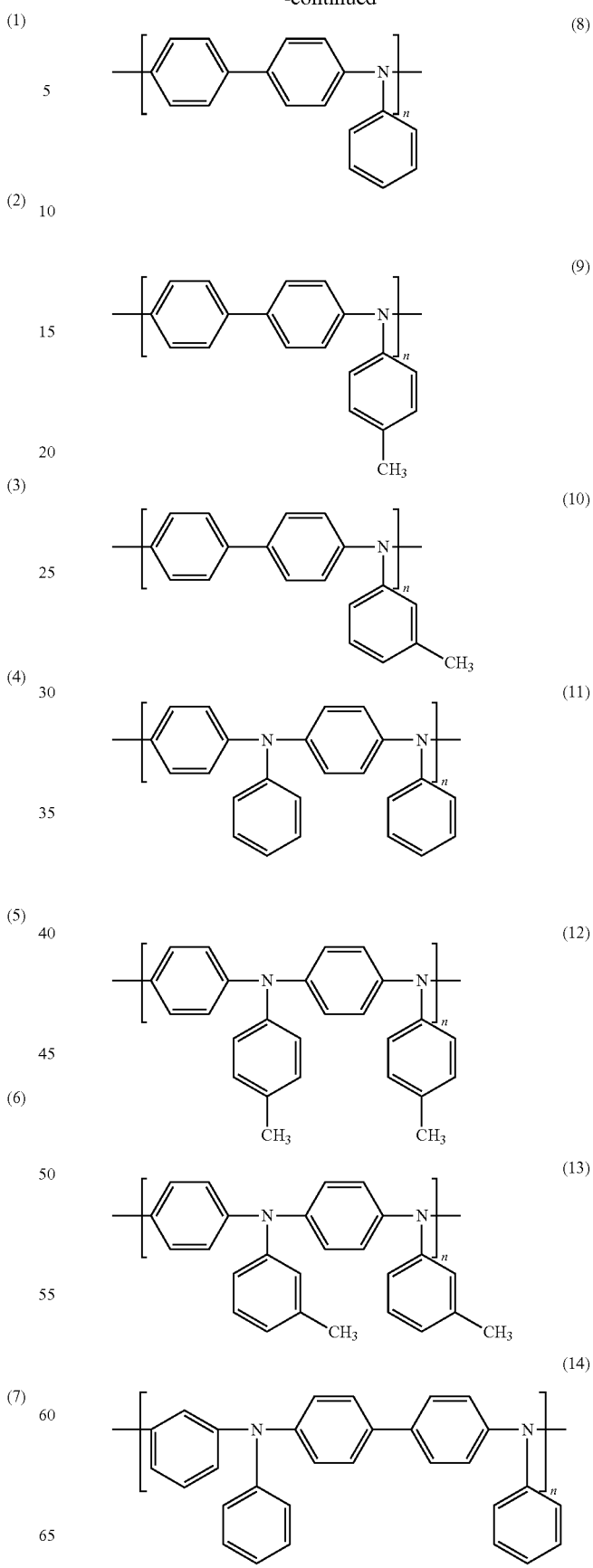

(15)
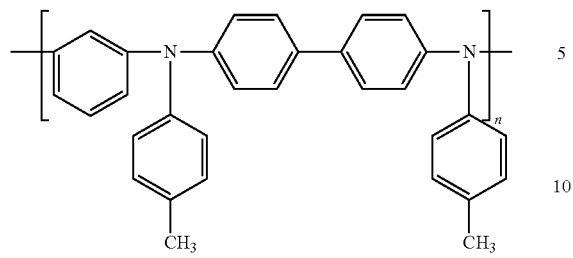
(16)
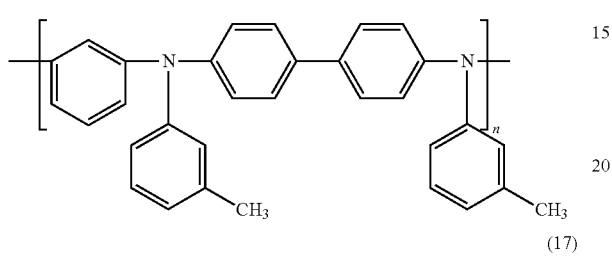
(17)
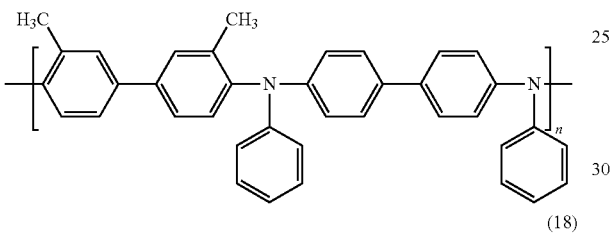
(18)
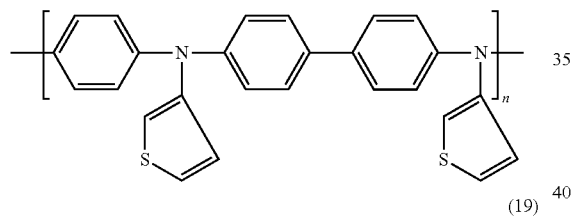
(19)
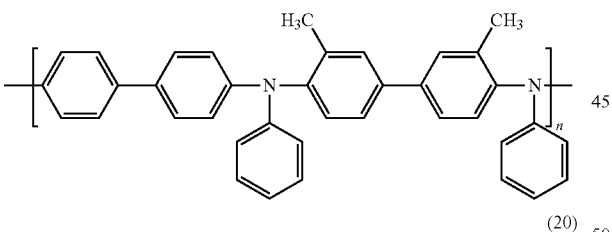
(20)
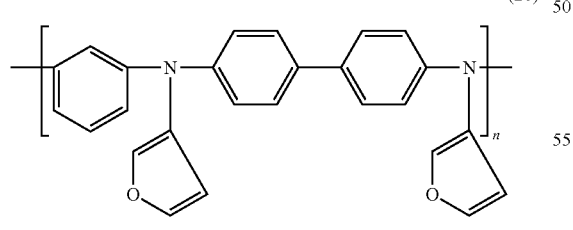
(22)
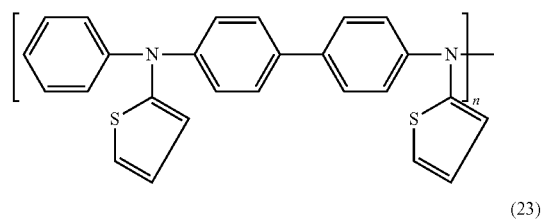
(23)
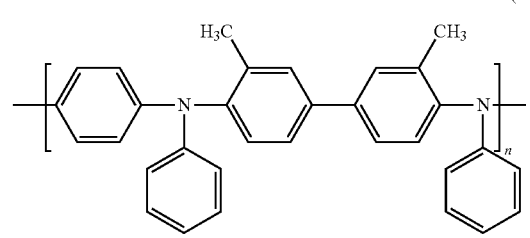
(24)
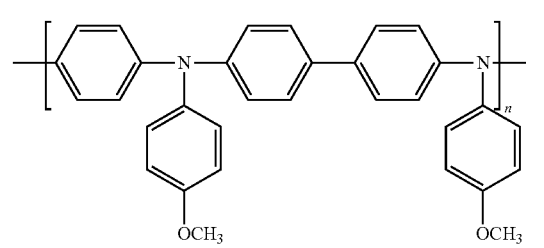
(25)
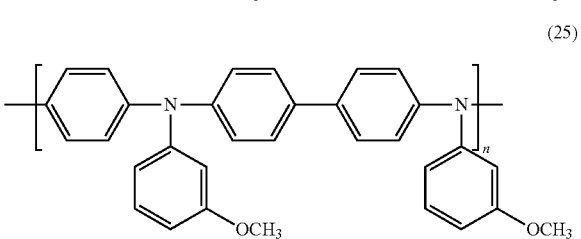
(26)
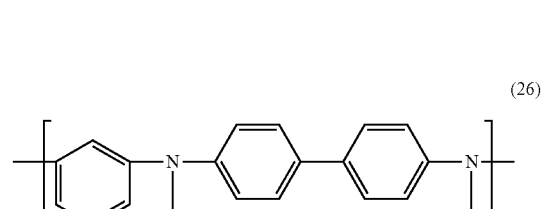
(21)
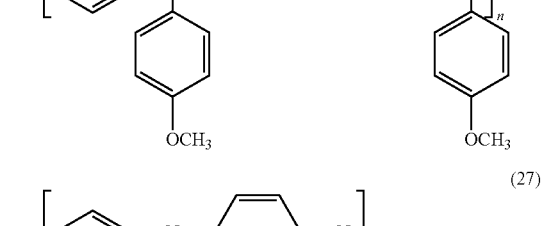
(27)
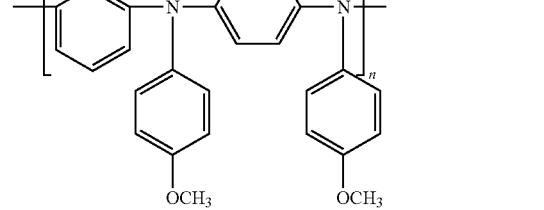

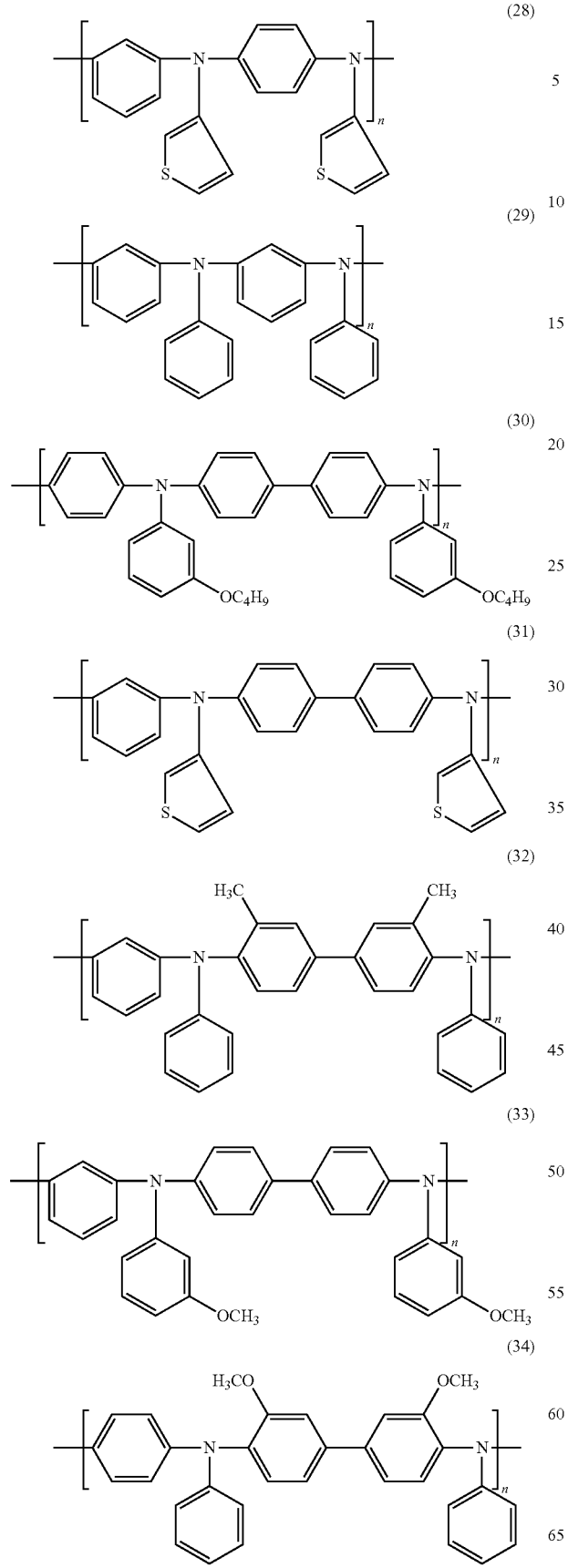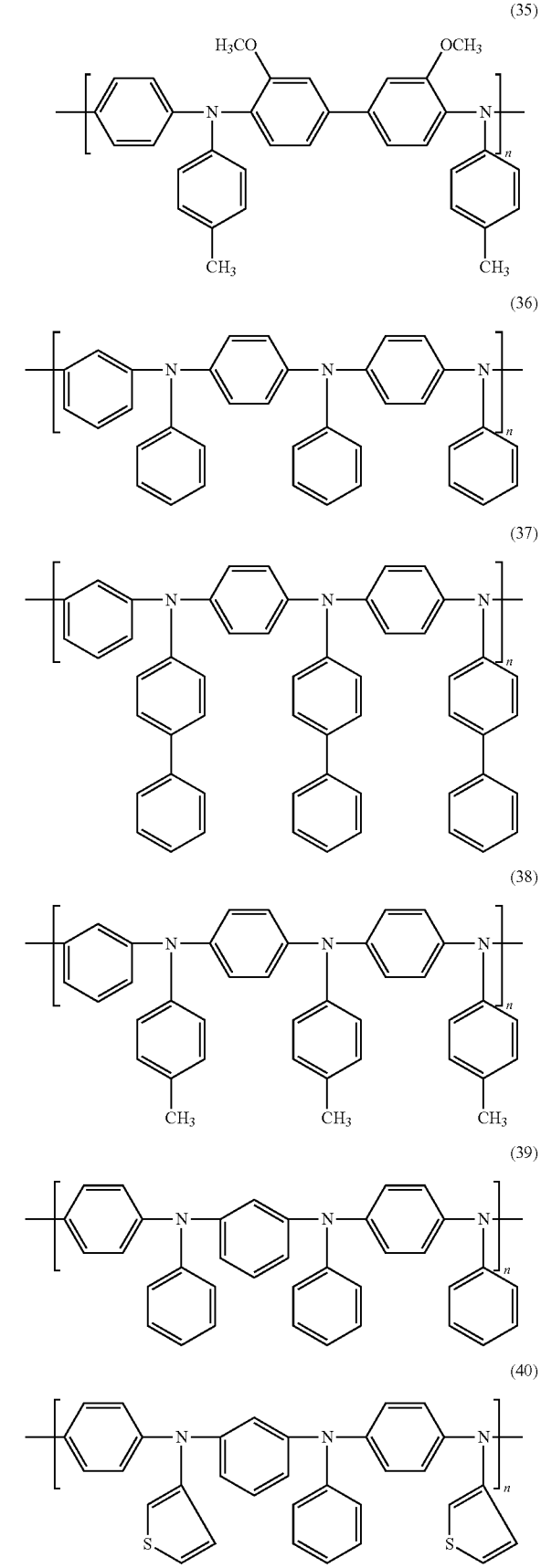

(41)
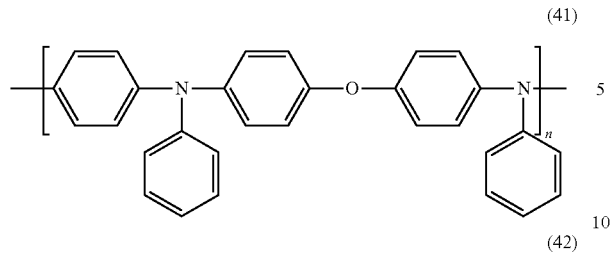
(42)
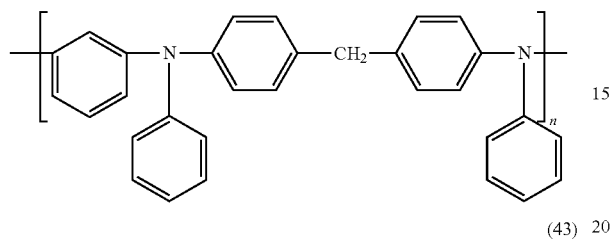
(43)
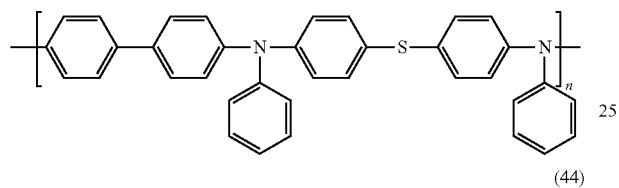
(44)
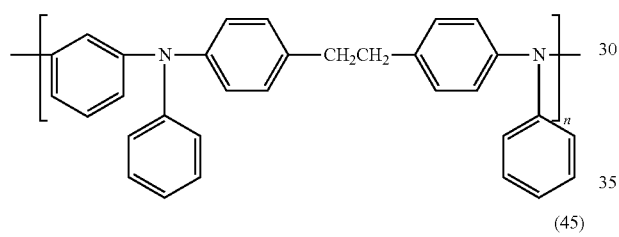
(45)
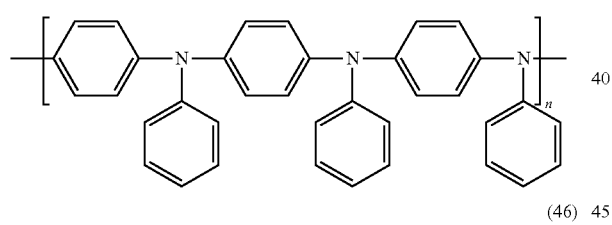
(46)
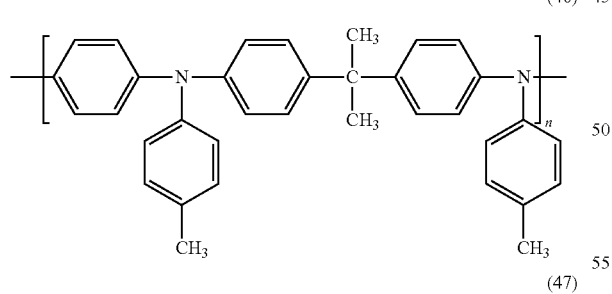
(47)
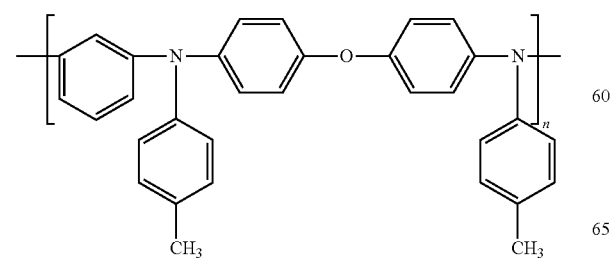
(48)
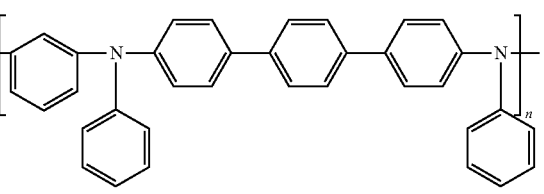
(49)
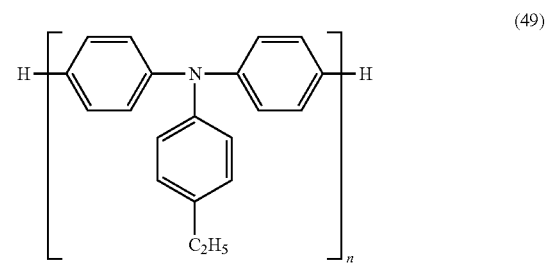
(50)
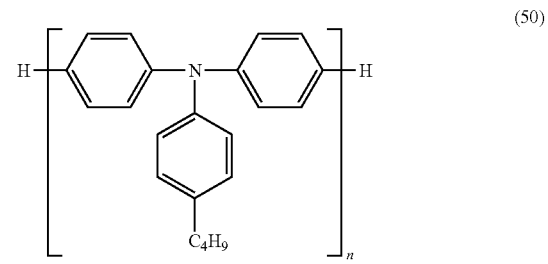
(51)
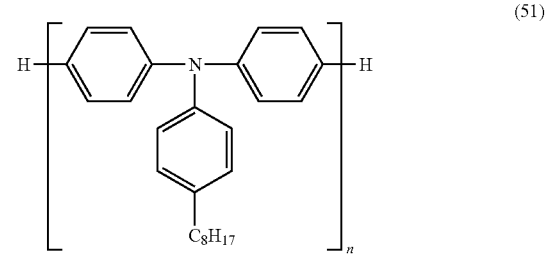
(52)
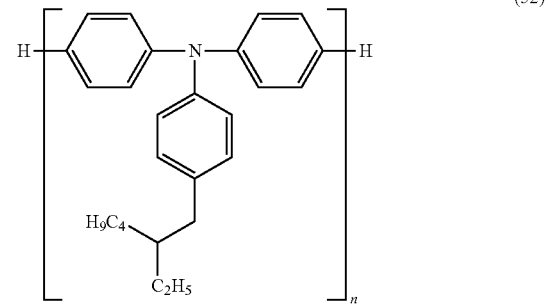
(53)
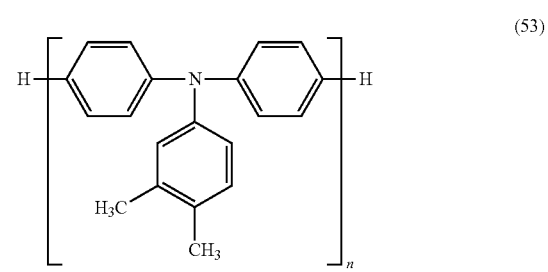

-continued (54)

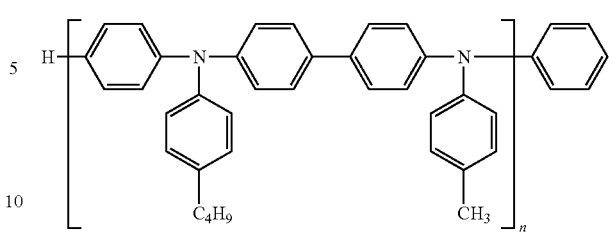

(55)

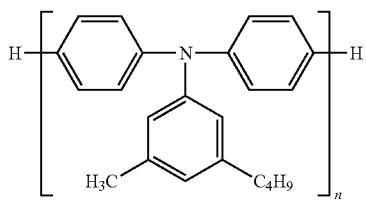

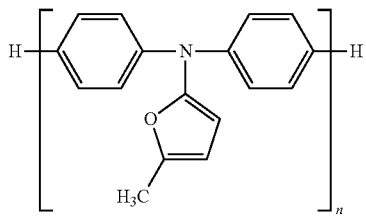

(56)

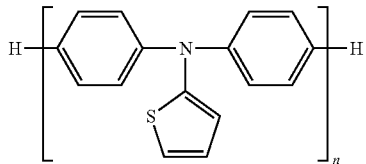

(57)

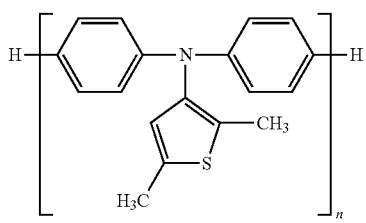

(58)

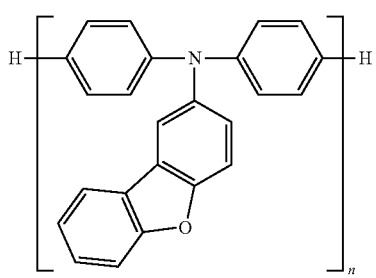

(59)

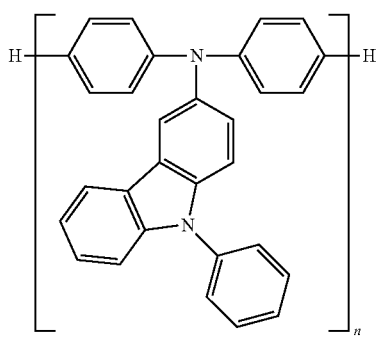

-continued (60)

As additional information, n described in the above-mentioned exemplary compounds represents a degree of polymerization, and represents an integer with which a weight average molecular weight is made within a range of 50,000 to 200,000. A weight average molecular weight less than the above range may have fear that the compound may mix with the other layer at the time of production of a film due to high solubility to a solvent. Even if a film can be produced, a sufficient light emitting efficiency cannot be obtained with such a low weight average molecular weight. On the other hand, a weight average molecular weight larger than the above range causes problems due to difficulty in synthesis and refinement. As a molecular weight distribution becomes larger, the remaining amount of impurities increases. Accordingly, the light emission efficiency of organic EL elements, voltage, and service life become worse.

These high molecular compounds may be synthesized by well-known methods described in, for example, Makromol. Chem., 193, 909 pages (1992).

<Electron Transporting Layer>

An electron transporting layer is composed of a material having a function, to transport electrons, and in a broad meaning, an electron injection layer and a positive hole inhibition layer are included in the electron transporting layer. The electron transporting layer may be formed in a single layer or multiple layers.

Conventionally, in the case of a single electron transporting layer or multiple electron transporting layers, electron transporting materials used for a electron transporting layer neighboring on the cathode side in relation to a light emitting layer may have a function to transport electrons injected from a cathode to the light emitting layer, and may be selected arbitrarily from the conventionally-know compounds. Examples of the electron transporting materials include metal complexes, such as fluorene derivative, a carbazole derivative, aza carbazole derivative, oxa diazole derivative, triazole derivative derivative, silol derivative, pyridine derivative, pyrimidine derivative, and 8-quinolinol derivative.

In addition, metal-free or metal phthalocyanine, or those with its terminal substituted by an alkyl group and a sulfonic acid group, may be preferably used as the electron transporting material.

Among them, a carbazole derivative, aza carbazole derivative, pyridine derivative, etc. are preferable in the present invention. Further, a compound which is carbazole derivative and has a dibenzofuran skeleton according to the present invention may be more preferable.

The electron transporting layer can be prepared by forming a thin layer with the above electron transporting material through known methods, for example, a vacuum deposition method, a spin coating method, a casting method, a printing method including an ink-jet method, or a LB method.

The layer thickness of the electron transporting layer is not specifically limited to. However, it is generally about 5 nm to 5 µm, and preferably 5 to 200 nm. The electron transporting layer may have a single layer structure composed of one or two or more kinds of the above described materials.

Further, an electron transporting layer with high n-nature doped impurities as a guest material may also be used, Examples of the electron transporting layer include compounds described in JP-A Nos. 4-297076, 10-270172, 2000-196140, 2001-102175, J. Appl. Phys., 95, 5773 (2004) and the like.

The electron transporting layer in the present invention preferably contains alkali metal salt of an organic substance. Examples of the organic substances include, without being limited specifically thereto, formate, acetate, propionic acid, butyrate, valerianate, a caproic acid salt, an enanthic acid salt a caprylic acid salt, oxalate, malonic acid salt succinate, benzoate, phthalate, isophthalic acid salt terephthalic acid salt, salicylate, pyruvate, lactate, malate, adipate, mesylic acid salt tosylic acid salt, benzenesulfonic acid salt, and the like. Preferable examples include formate, acetate, propionate, butyrate, valerianate, caproic acid salt, enanthic acid salt, caprylic acid salt, oxalate, malonic acid salt, succinate, and benzoate. More preferable examples include alkali metal salt of aliphatic carboxylic acid, such as formate, acetate, propionate, and butyrate, and aliphatic carboxylic acid with four or less carbon atoms is preferable. Acetate is most preferable.

Although examples of alkali metal of alkali metal salt of an organic substance are not specifically limited to, the examples include Na, K, and Cs. Further, Na and Cs are preferable, and Cs is more preferable. Examples of the alkali metal salt of an organic substance include a combination of the above-mentioned organic substance and an alkali metal. Preferable examples include formic acid Li, formic acid K, formic acid Na, formic acid Cs, acetic acid Li, acetic acid K, acetic acid Na, acetic acid Cs, propionic acid Li, propionic acid Na, propionic acid K, propionic acid Cs, oxalic acid Li, oxalic acid Na, and oxalic acid K, oxalic acid Cs, malonic acid Li, malonic acid Na, malonic acid K, malonic acid Cs, succinic acid Li, succinic acid Na, and succinic acid K, succinic acid Cs, benzoic acid Li, benzoic acid Na, benzoic acid K, and benzoic acid Cs. More preferable examples include acetic acid Li, acetic acid K, acetic acid Na, and acetic acid Cs. Among them, acetic acid Cs is most preferable.

The content of these dope material is preferably 1.5 to 35% by weight to the electron transporting layer to which the material is added, more preferably 3 to 25% by weight and most preferably 5 to 15% by weight.

[Light Emitting Layer]

In the light emitting layer which constitutes the organic EL element of the present invention, electrons and positive holes which are injected from an electrode or an electron transporting layer and a positive hole transporting layer recombine with each other, thereby emitting light. A light emitting portion may be positioned inside the light emitting layer or on an interlace between the light emitting layer and a neighboring layer.

The light emitting layer according to the present invention is not specifically limited to in terms of constitution as long as light emitting materials contained in it satisfy the above-mentioned requirements.

Further, the light emitting layer may include multiple layers having the same light emission spectrum and the maximum wavelength of light emission. An intermediate layer incapable of emitting light is preferably disposed between two layers of the multiple layers.

The sum of the thickness of the light emitting layers in the present invention is preferably in a range of 1 to 100 nm, and more preferably 50 nm or less, because more low drive voltage can be obtained. Herein, the sum of the thickness of the light emitting layers as referred in the present invention, is a thickness including the thickness of an intermediate layer when the intermediate layer incapable of emitting light exists between the light emitting layers.

The thickness of each light emitting layer is preferably adjusted to in a range of 1 to 50 nm. The relationship in thickness among blue, green, and red light emitting layers is not limited to specifically.

The light emitting layer may be produced by forming a thin layer with the below-mentioned light emitting materials and host compounds through known thin film forming methods, for example, a vacuum deposition method, a spin, coating method, a casting method, an LB method, and an ink jet method.

In the present invention, two or more tight emitting materials may be mixed in each light emitting layer, and a phosphorescence emitting material and a fluorescence emitting material may be mixed and used in the same light emitting layer.

In the present invention, the light emitting layer is structured to contain a host compound and a light emitting material (also referred to as a light emitting dopant compound) such that light is emitted preferably from the light emitting material.

As the host compound contained in the light emitting layer of the organic EL element of the present invention, a preferable compound has a yield of phosphorescence photons being less than 0.1 in phosphorescence light emission under a room temperature (25° C.). More preferably, the yield of phosphorescence photons is less than 0.01. Further, the preferable compound has a volume ratio of 50% or more in the light emitting layer.

As the host compound, known host compounds may be used singly or plural kinds of host compounds may be used in combination. Employment of the plural kinds of host compounds enables to adjust movement of electric charge, so that an organic EL element may be made to have high efficiency. Further, employment of the plural kinds of below-mentioned light emitting materials enable to mix different light emissions, which further enables to obtain arbitral light emission color.

Further, examples of the host compound usable in the present invention include conventionally-known low molecular weight compounds, polymer compounds having a repeating unit, and low molecular weight compounds (evaporation polymerizable light emitting host) having polymerizable groups, such as a vinyl group and an epoxy group.

As the known host compounds, preferable compounds have positive hole transporting ability and electron transporting ability, can prevent light emission from becoming long wavelengths, and has high Tg (glass transition temperature). Herein, the glass transition point (Tg) can be determined through methods in conformity to JIS-K-7121 by use of DSC (Differential Scanning Colorimetry).

Specific examples of the known host compounds include compounds described in documents such as JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

The host compound used in the present Invention is preferably carbazole derivatives, and it is more desirable that it is a carbazole derivative, and more preferably compounds which are the carbazole derivatives and have a dibenzofuran skeleton according to the present invention.

Next, the light emitting materials will be explained.

As the light emitting material according to the present invention, fluorogenic compounds and phosphorescence emitting materials (also referred to as phosphorescent compounds, phosphorescence luminescent compound) may be employable, and the phosphorescence emitting materials may be preferable.

In the present invention, the phosphorescent emitting materials are compounds with which light emission from an excited triplet is observed, are specifically compounds which emit phosphorescence at room temperature (25° C.), and are defined as compounds which have a yield of phosphorescence photons being 0.01 or more at 25° C. The yield of phosphorescence photons is preferably 0.1 or more.

The yield of phosphorescence photons may be measured through the method described on page 398 of Spectrum II in the fourth edition of Experimental Chemistry Lecture 7 (1992, published by Maruzen Co., Ltd.). The yield of phosphorescence photons may be measured by use of various kinds of solvents. However, in the case of use of phosphorescence light emitting material in the present invention, the measurement is only required to achieve the above yield of phosphorescence photons (0.01 or more) in any arbitral solvent.

There are two kinds of light emission principles of the phosphorescent emitting materials. One of them is an energy transfer type in which at the time of transportation of carriers on a host compound, the carriers recombine to each other on the host compound and cause an excited state of the host compound, and then energy is transferred to a phosphorescent emitting material, thereby obtaining light emissions from the phosphorescent emitting material. Another one of them is a carrier trap type in which a phosphorescent emitting material serves as a carrier trap, and at the time of recombination of carriers on the phosphorescent emitting material, light emissions are obtained from the phosphorescent emitting material. In any case, a condition is that the energy on the excited state of a phosphorescent emitting material is lower than the energy on the excited state of a host compound.

The phosphorescence-emitting compounds may be suitably selected and used from the known compounds employed in the light emitting layer of an organic EL element. However, the phosphorescence emitting compounds are preferably complex based compounds which contains metals of Groups 8 to 10 in the element periodic table, more preferably iridium compounds, osmium compounds, platinum compounds (platinum complex based compounds), and rare earth metal complexes, and among them, indium compounds are most preferable.

Hereafter, specific examples of compounds which are usable for a phosphorescence emitting compound are shown. However, the present invention is not limited to these compounds. These compounds may be synthesized by the methods disclosed in for example, Inorg. Chem. Vol. 40, 1704 to 1711.

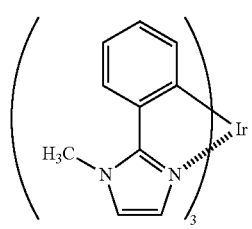

D-1

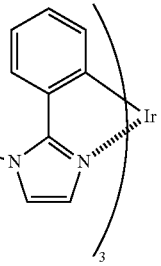

D-2

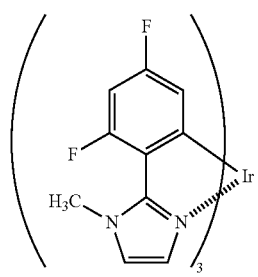

D-3

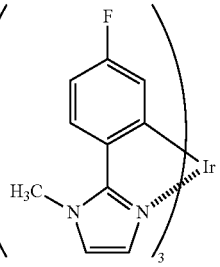

D-4

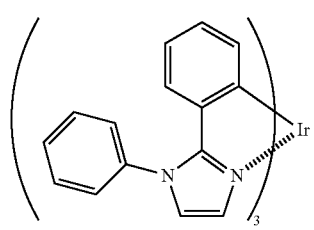

D-5

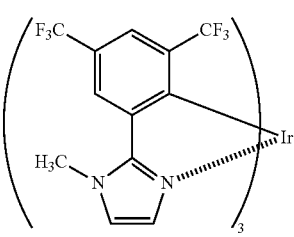

D-6

-continued
D-7
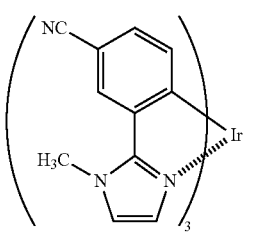
D-8
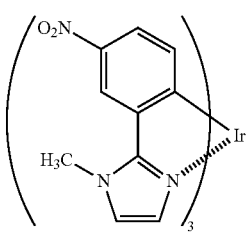
D-9
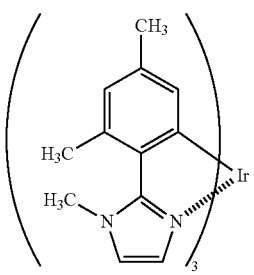
D-10
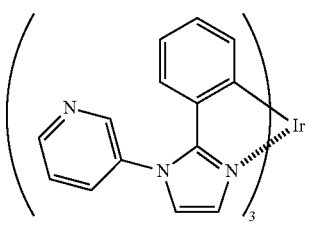
D-11
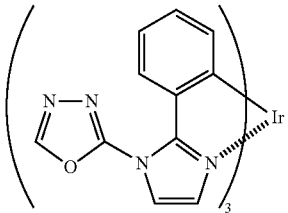
D-12
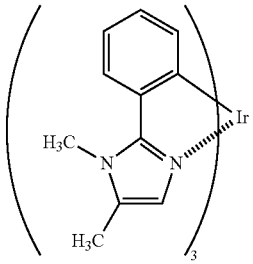
D-13
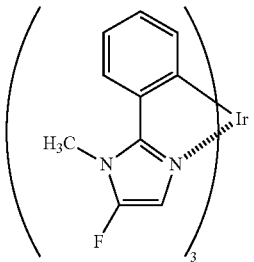
D-14
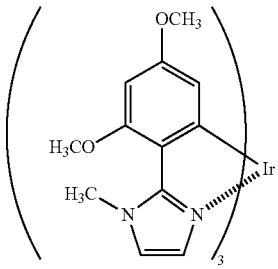
D-15
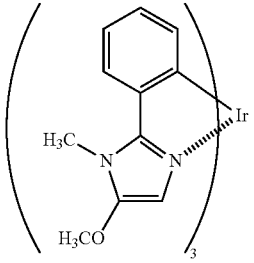
D-16
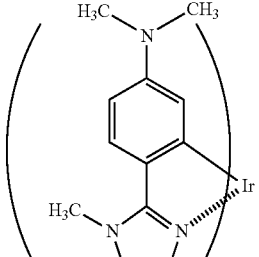
D-17
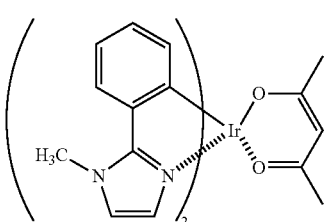
D-18
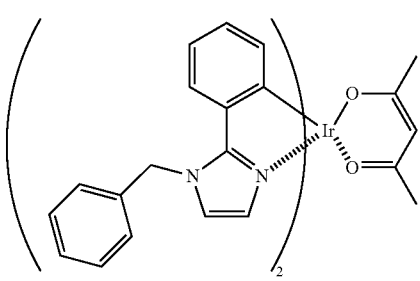

-continued
D-19
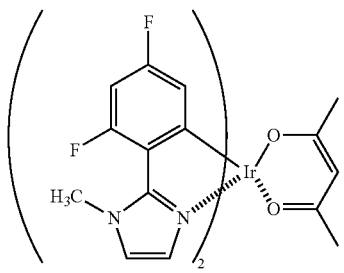
D-20
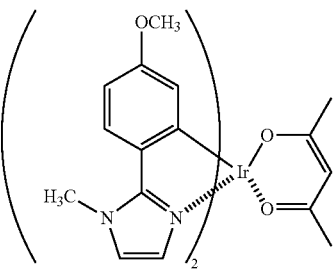
D-21
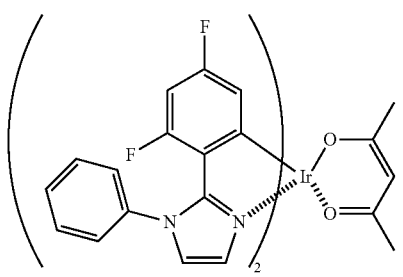
D-22
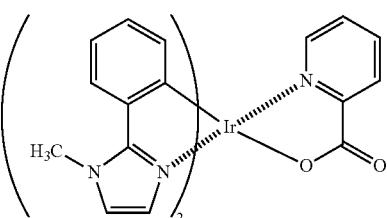
D-23
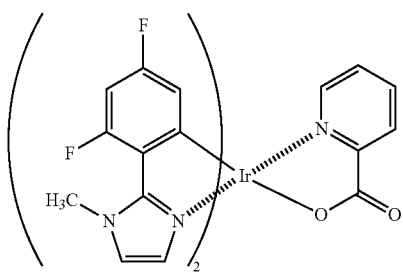
D-24
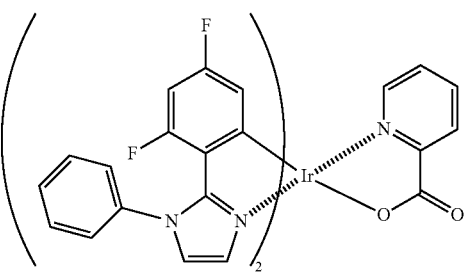
D-25
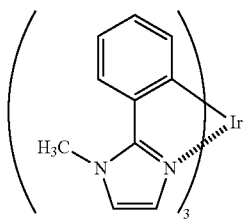
D-26
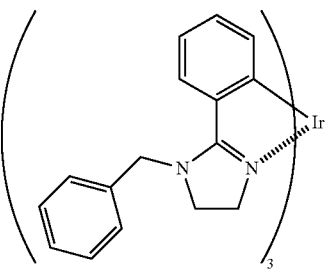
D-27
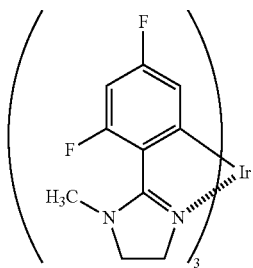
D-28
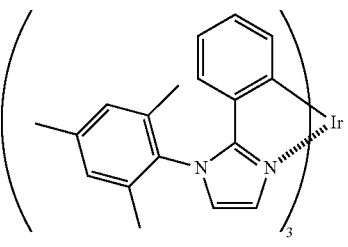
D-29
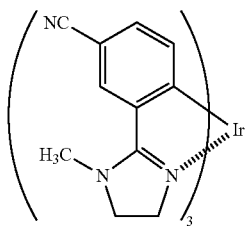
D-30
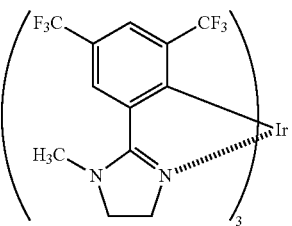

-continued
| D-31 | D-32 |
|---|---|
| 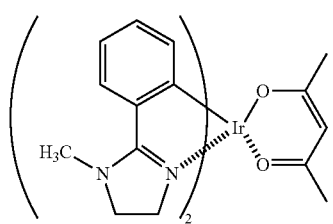 | 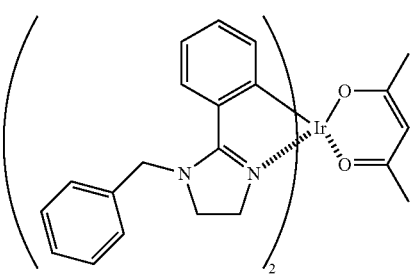 |
| D-33 | D-34 |
| 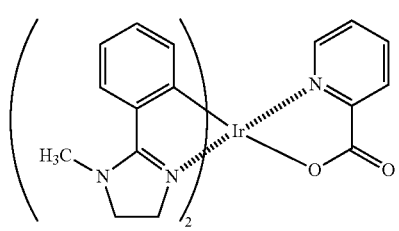 | 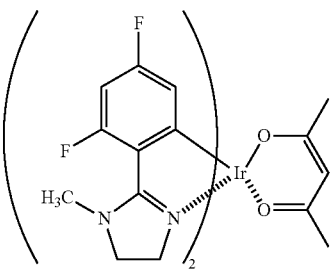 |
| D-35 | D-36 |
| 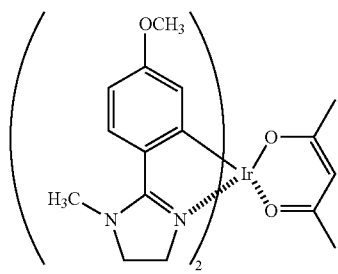 | 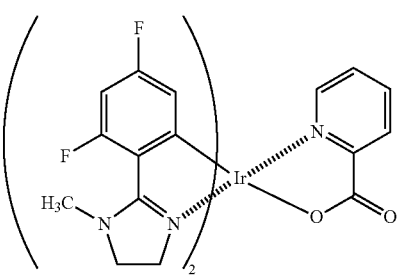 |
| D-37 | D-38 |
| 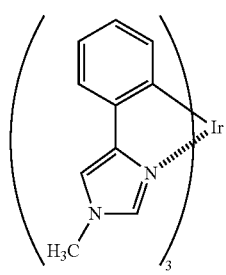 | 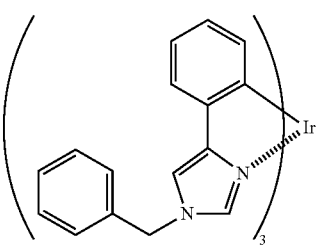 |
| D-39 | D-40 |
| 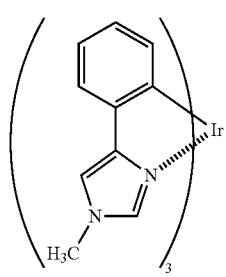 | 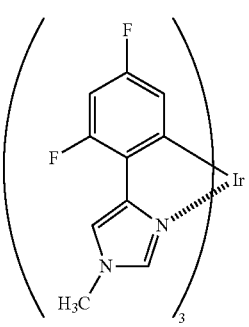 |

-continued
D-41
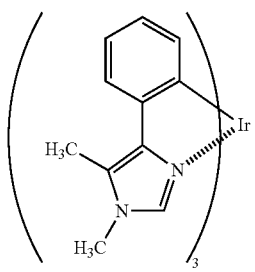
D-42
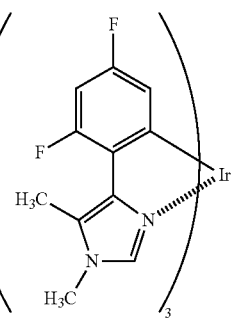
D-43
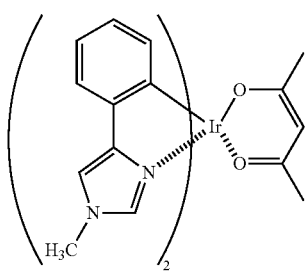
D-44
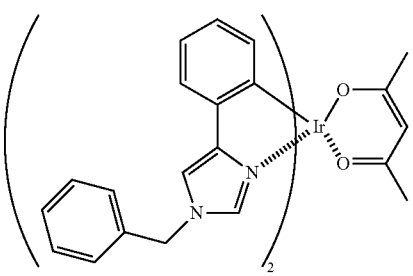
D-45
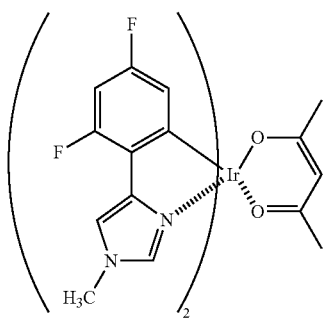
D-46
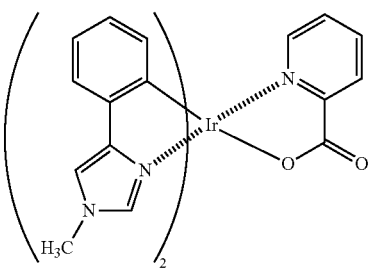
D-47
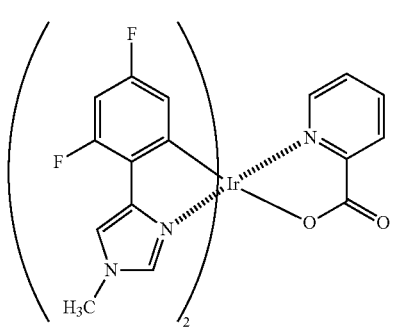
D-48
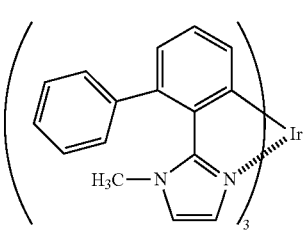
D-49
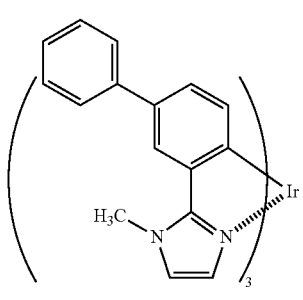
D-50
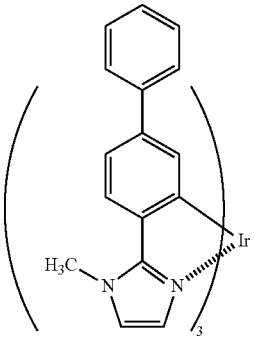

-continued
| | |
|---|---|
| D-51 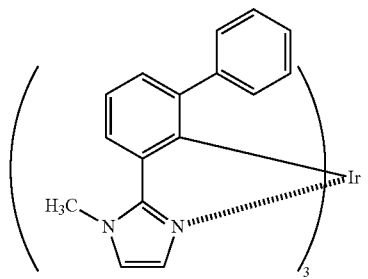 | D-52 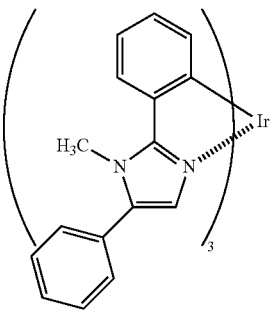 |
| D-53 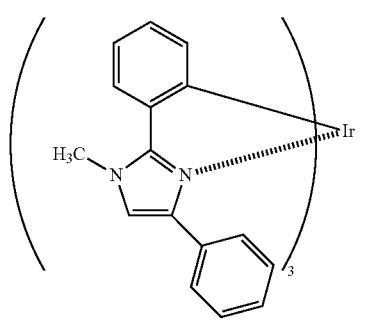 | D-54 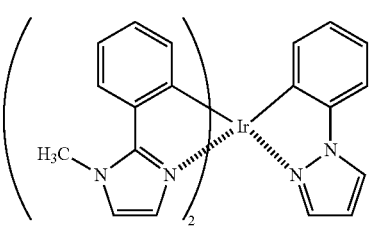 |
| D-55 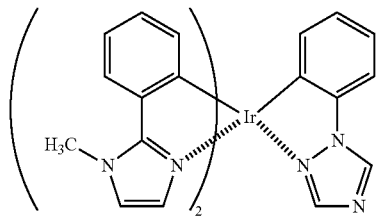 | D-56 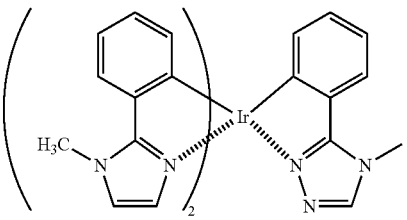 |
| D-57 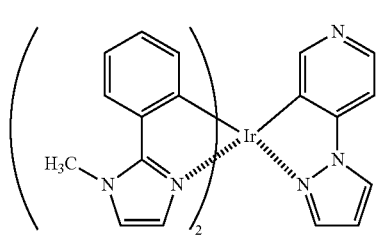 | D-58 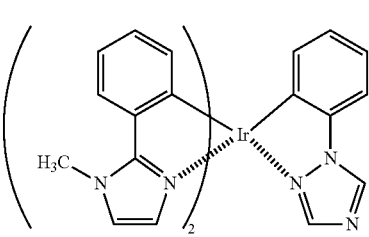 |
| D-59 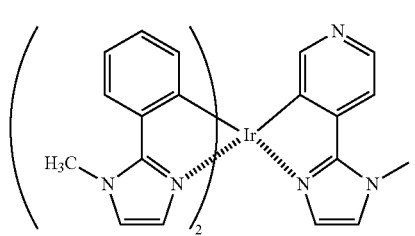 | D-60 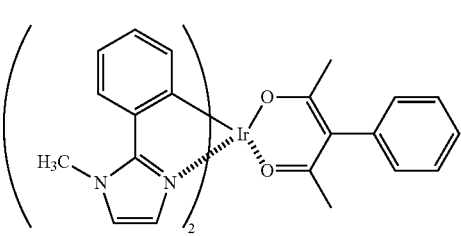 |
| D-61 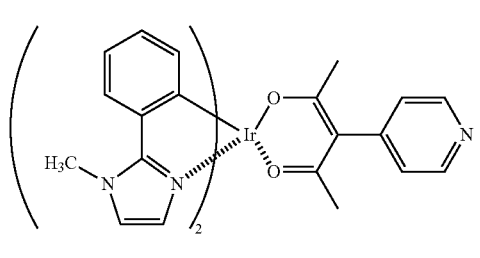 | D-62 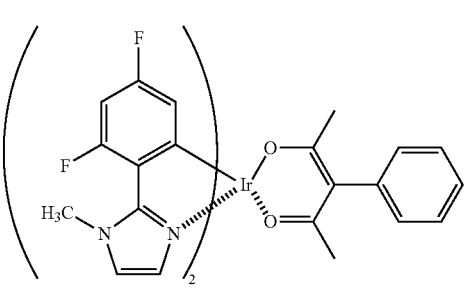 |

-continued
D-63
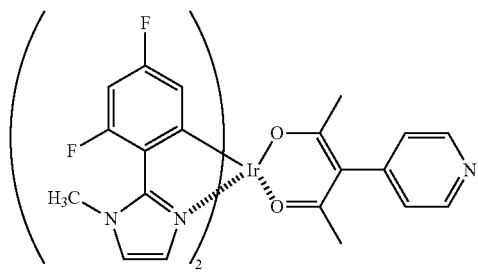
D-64
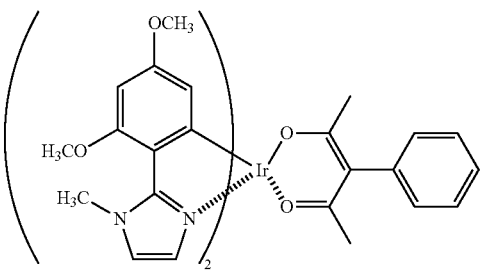
D-65
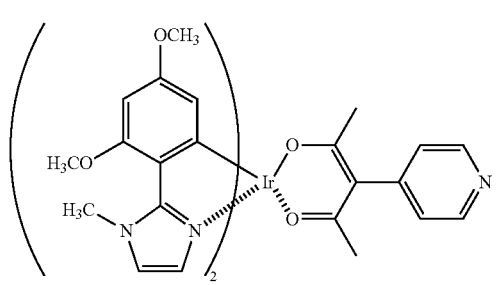
D-66
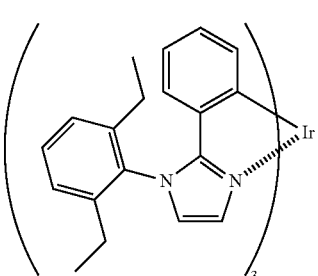
D-67
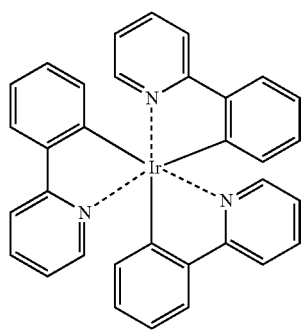
D-68
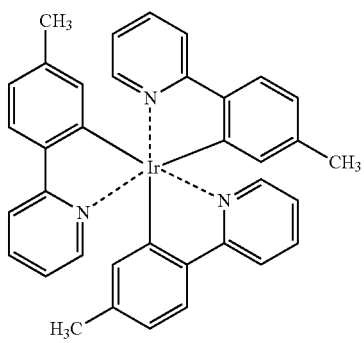
D-69
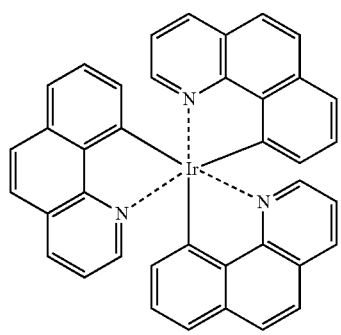
D-70
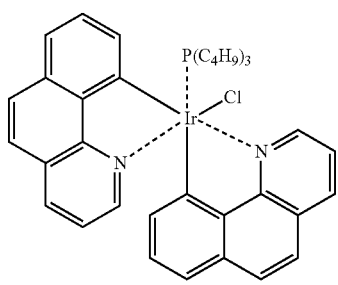
D-71
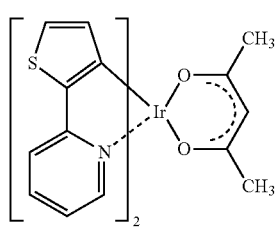
D-72
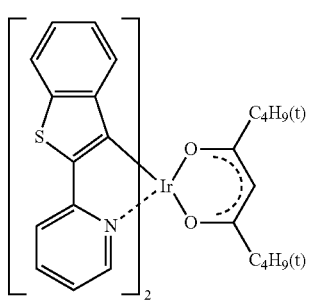

-continued
D-73
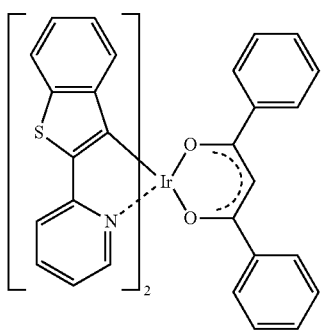
D-74
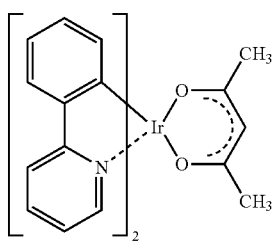
D-75
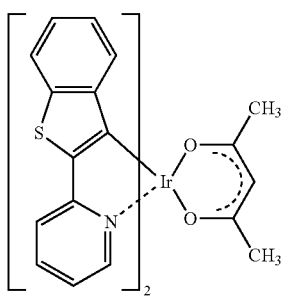
D-76
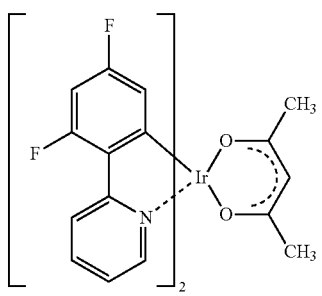
D-77
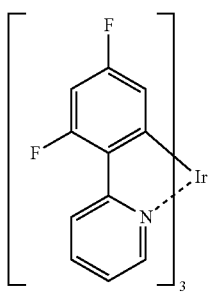
D-78
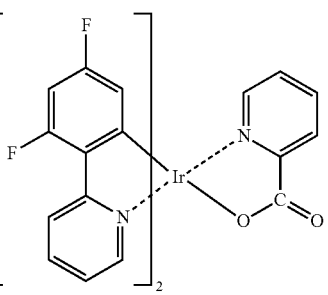
D-79
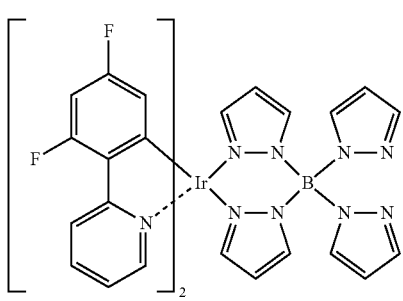
D-80
D-81
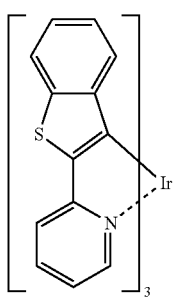
D-82
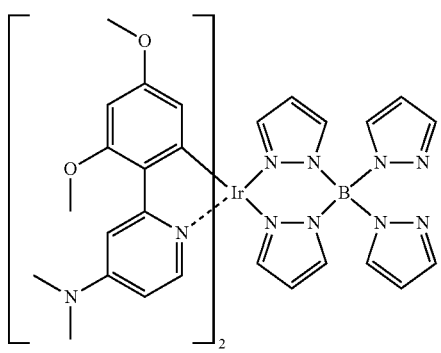

-continued
D-83
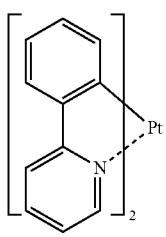
D-84
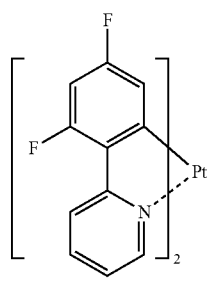
D-85
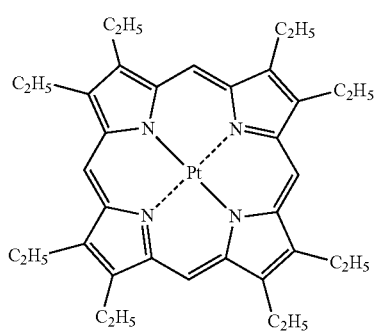
D-86
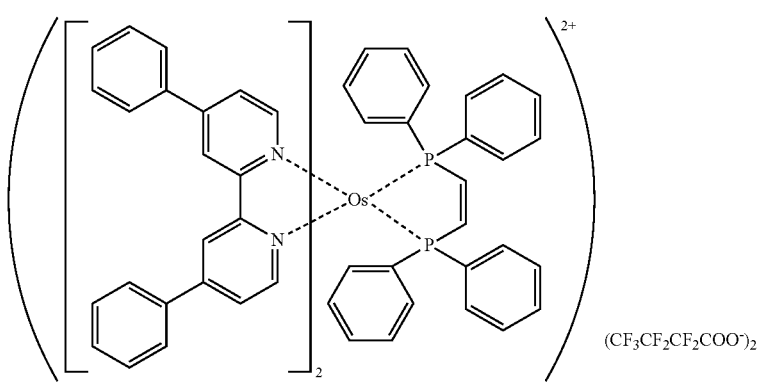
D-87
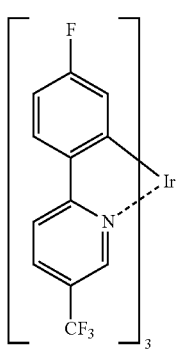
D-88
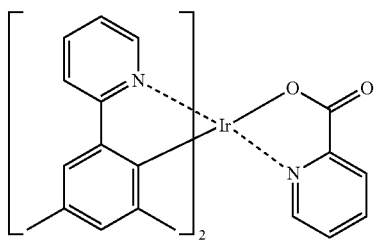
D-89
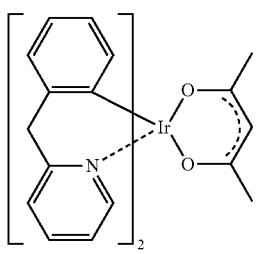
D-90
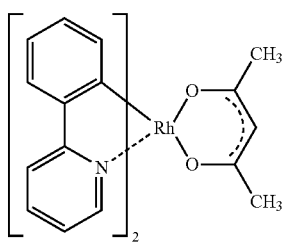

-continued
D-91
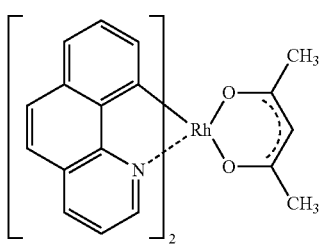
D-92
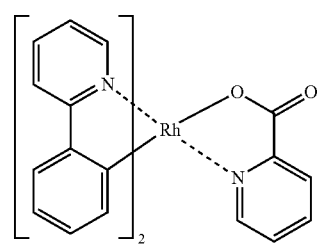
D-93
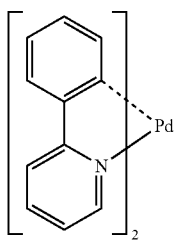
D-94
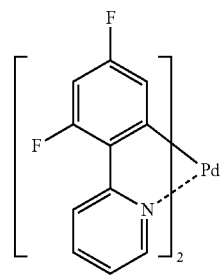
D-95
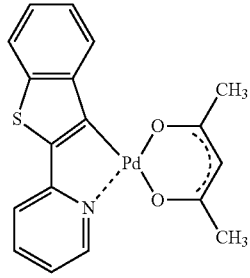
D-96
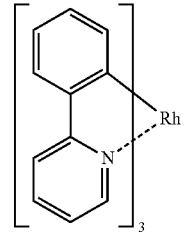
D-97
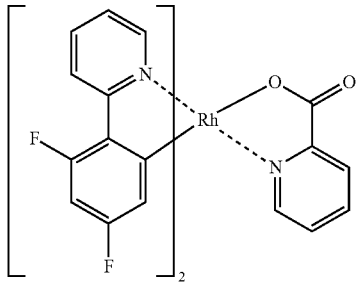
D-98
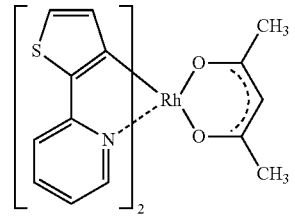
D-99
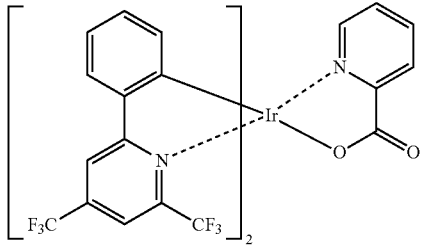
D-100
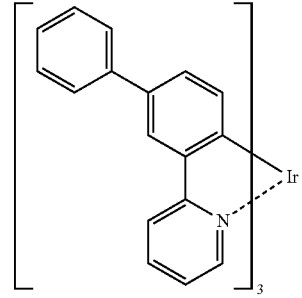
D-101
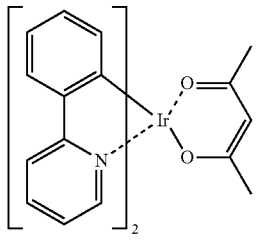
D-102
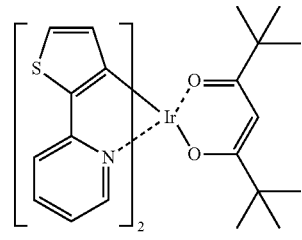

-continued
D-103
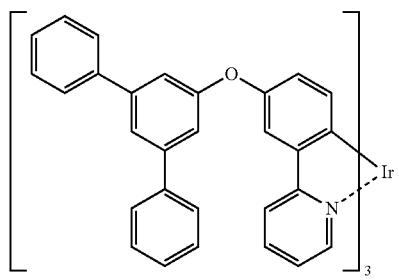
D-104
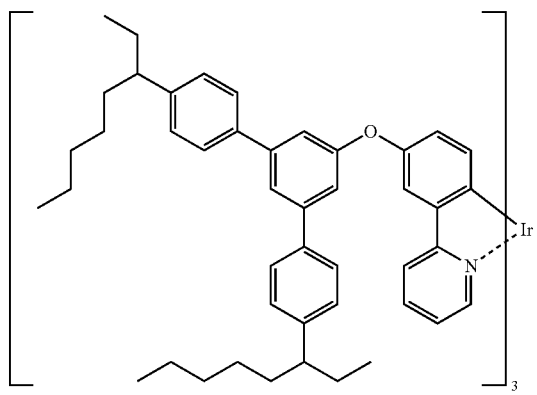
D-105
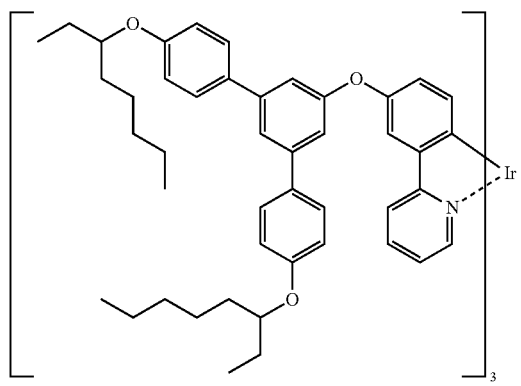
D-106
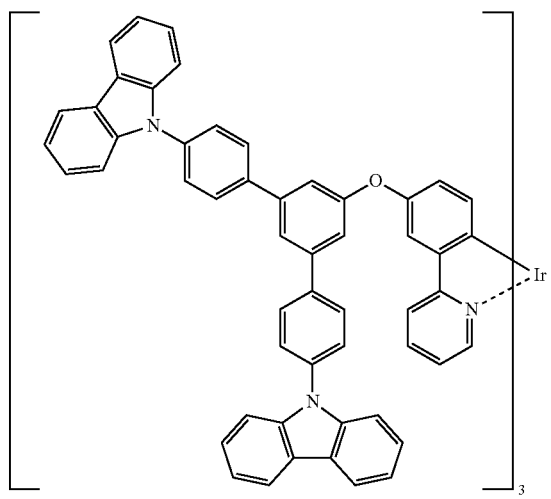
D-107
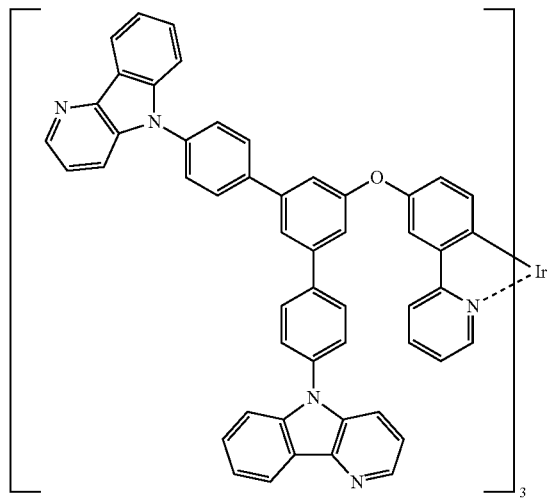
D-108
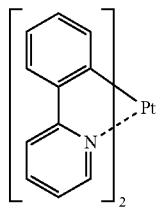

-continued
D-109
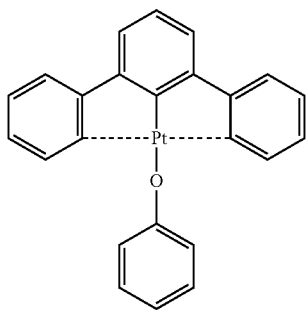
D-110
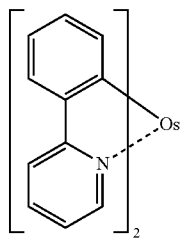
D-111
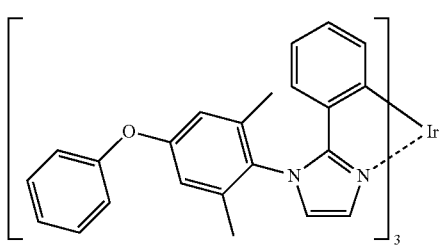
D-112
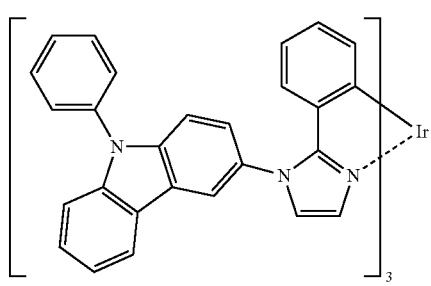
D-113
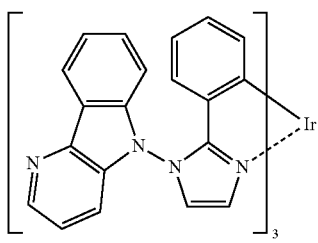
D-114
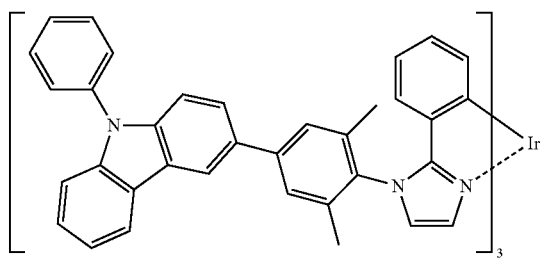
D-115
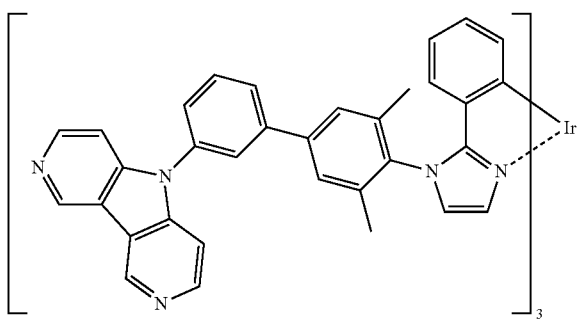
D-116
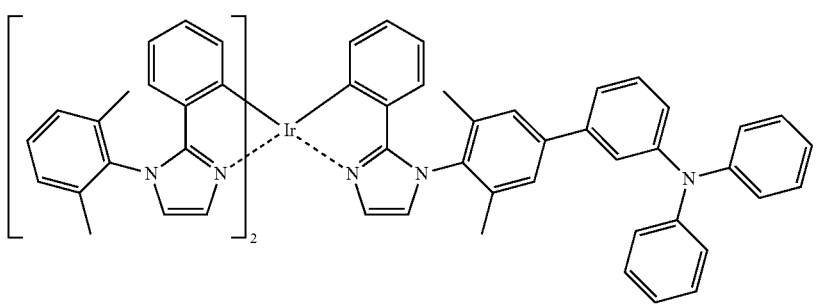

-continued
D-117
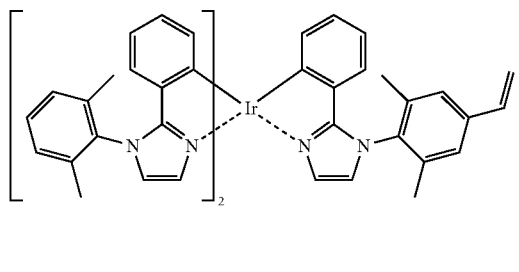
D-118
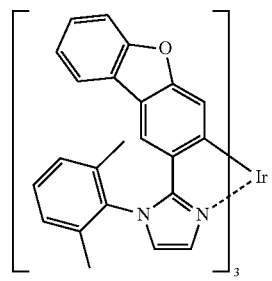
D-119
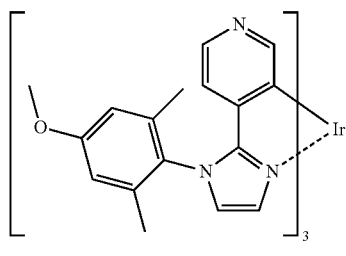
D-120
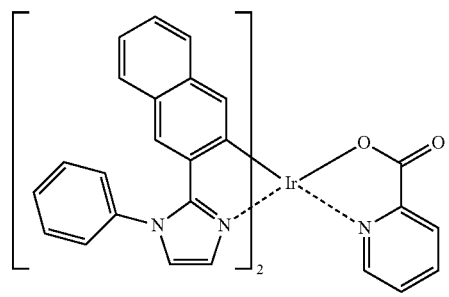
D-121
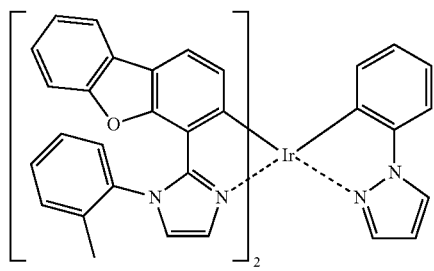
D-122
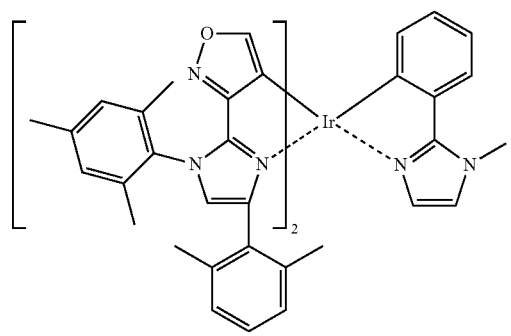
D-123
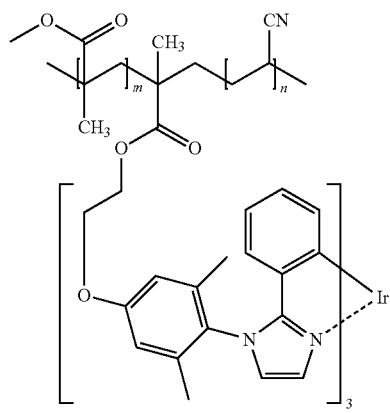
D-124
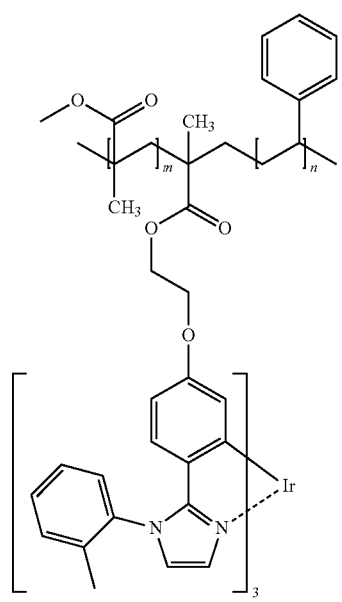

-continued
D-125
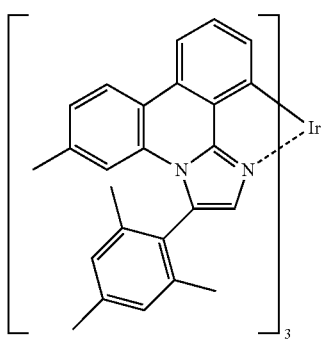
D-126
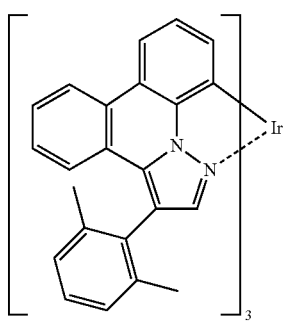
D-127
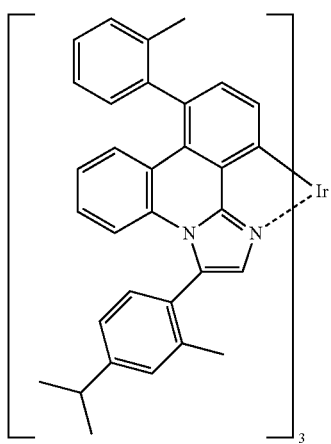
D-128
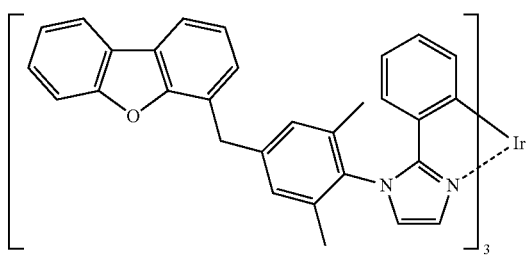
D-129
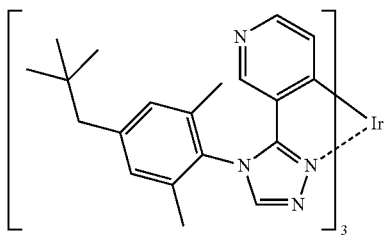
D-130
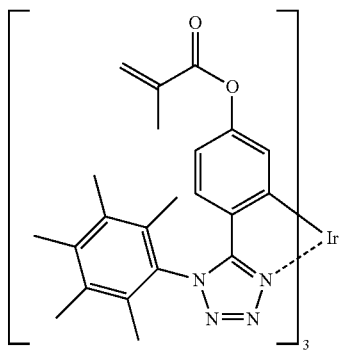
D-131
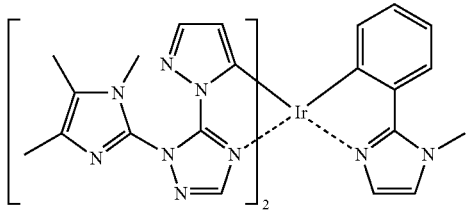
D-132
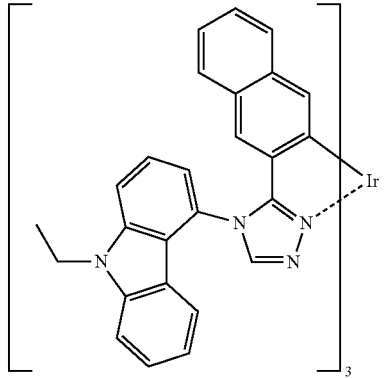

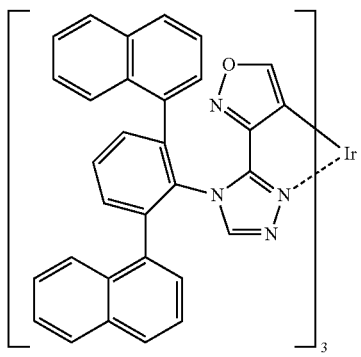

D-133

<<Anode>>

As an anode according to an organic EL element of the present invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formal by means of photolithography, or in the case of requirement of pattern precision is not so severe (not less than 100 μm), a pattern may be formed through a mask of a desired form at the time of evaporation or spattering of the above-described substance. Alternatively, when coatable materials such as organic electrically conductive impounds are employed, it is possible to employ a wet system filming method such as a printing system or a coating system. When emission is taken out of this anode, the transmittance is preferably set to not less than 10% and the sheet resistance as an anode is preferably not more than a few hundreds Ω/□. Further, although the layer thickness depends on a material, it is generally selected in a range of 10-1,000 nm and preferably of 10 to 200 nm.

<<Cathode>>

On the other hand, as a cathode according to the present invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. As for a cathode, these electrode substances may be made into a thin layer by a method such as evaporation or spattering. Further, the sheet resistance as a cathode is preferably not more than a few hundreds Ω/□ and the layer thickness is generally selected in a range of 10 nm-5 μm and preferably of 50 nm-200 nm. Herein, to transmit emission, either one of an anode or a cathode of an organic EL element is preferably transparent or translucent to improve the emission luminance.

Further, after forming, on the cathode, the above metals at a film thickness of 1-20 nm, it is possible to prepare a transparent or translucent cathode in such a manner that electrically conductive transparent materials are prepared thereon. By applying the above, it is possible to produce an element in which both anode and cathode are transparent.

<<Substrate>>

A substrate (hereafter, also referred to as base plate, base material, support, and the like) usable to the organic EL element of the present invention is not specifically limited to in terms of kinds, such as glass and plastics, and may be transparent or opaque. However, in the case where light is taken out from the substrate side, the substrate is preferable transparent. Preferable examples of the transparent substrates include glass, quartz and transparent resin film. The effects of preservation stability under high temperature and suppression of chromaticity fluctuation appear more greatly in a flexible substrate than a solid substrate. Accordingly, a specifically preferable substrate is a resin film with flexibility capable of providing an organic EL element with a flexible property.

Examples of the resin films include polyesters such as polyethylene terephthalate (PET) and polyethylene naphthalate (PEN); polyethylene, polypropylene; cellulose esters or their derivatives such as cellophane, cellulose diacetate, cellulose triacetate, cellulose acetate butylate, cellulose acetate propionate (CAP), cellulose acetate phthalate (TAC) and cellulose nitrate; polyvinylidene chloride, polyvinyl alcohol, polyethylene vinyl alcohol, syndiotactic polystyrene, polycarbonate, norbornene resin, polymethylpentene, polyether ketone, polyimide, polyether sulfone (PES), polyphenylene sulfide, polysulfones, polyetherimide, polyether ketone imide, polyamide, fluororesin, Nylon, polymethylmethacrylate, acrylic resin, polyacrylate; and cycloolefine resins such as ARTON (produced by JSR Co. Ltd.) and APEL (produce by Mitsui Chemicals, Inc.)

On the surface of the resin film, an inorganic compound film, an organic compound film, or a hybrid film of both inorganic and organic compounds may be formed. The film is preferably a barrier films with a water vapor permeability (25±0.5° C., relative humidity (90±2)% RH), measured through methods in accordance with JIS K 7129-1992, being 0.01 g/($m^2$·24 h) or less, more preferably a high barrier films with an oxygen permeability, measured through methods in accordance with JIS K 7126-1987, being $1 \times 10^{-3}$ cm$^3$/(m$^2 \cdot$24 h$\cdot$atm) or less and the water vapor permeability of $1 \times 10^{-3}$ g/(m$^2 \cdot$24 h) or less, and most preferably the high barrier films with the water vapor permeability of $1 \times 10^{-5}$ g/(m$^2 \cdot$24 h) or less.

As materials forming a high barrier film, employed may be those which retard penetration of moisture and oxygen, which deteriorate the element. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

Barrier film forming methods are not particularly limited, and examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. Of these, specifically preferred is a method employing an atmospheric pressure plasma polymerization method, described in JP-A No. 2004-68143.

Examples of opaque support substrates include metal plates such aluminum or stainless steel films, opaque resin substrates, and ceramic substrates.

The external extraction efficiency of light emitted by the organic EL element of the present invention is preferably at least 1% at room temperature, but is more preferably at least 5%. Herein, External extraction, quantum yield (%)=(the number of photons emitted by the organic EL element to the exterior/the number of electrons fed to organic EL element)× 100.

<<Sealing>>

Examples of sealing means employable to the organic EL element of the present invention include a method in which a sealing member, an electrode, and a supporting substrate are bonded with adhesives.

The sealing members may be arranged to cover the display region of an organic EL element, and may be a concave plate or a flat plate. Neither transparency nor electrical insulation is limited.

Specific examples of the sealing members include glass plates, polymer plate and film, and metal plate and film. Examples of the glass plates include soda lime glass, barium-strontium containing glass, lead glass, aluminosilicate glass, borosilicate glass, bariumborosilicate glass, and quartz. Examples of the polymer plates include polycarbonate, acryl, polyethylene terephthalate, polyether sulfide, and polysulfone. Examples of the metal plates include plates composed of one or more metals selected from a group consisting of stainless steel, iron, copper, aluminum magnesium, nickel, zinc, chromium, titanium, molybdenum, silicon, germanium, and tantalum or alloys of them.

In the present invention, since it is possible to make elements into a thin film, a metal film is preferably employed. Moreover, the polymer films have preferably an oxygen permeability, measured through methods in accordance with JIS K 7126-1987, being $1 \times 10^{-3}$ cm$^3$/(m$^2 \cdot$24 h$\cdot$atm) or less and the water vapor permeability of $1 \times 10^{-3}$ g/(m$^2 \cdot$24 h) or less and a water vapor permeability ($25 \pm 0.5°$ C. relative humidity ($90 \pm 2$)% RH), measured through methods in accordance with JIS K 7129-1992, being $1 \times 10^{-3}$ g/(m$^2 \cdot$24 h) or less.

Processing a sealing component into a concave may be made by sand blast processing, chemical etching processing, or the like.

Specific examples of adhesives include light curable and heat curable adhesives having a reactive vinyl group of acrylic acid based oligomer or methacrylic acid based oligomer, and moisture curable adhesives such as 2-cyanoacrylates. Further, the examples include heat and chemically curable adhesives (two liquid-mixture type) such as epoxy based adhesives. Furthermore, the examples include hot-melt type adhesives such as polyamides, polyesters, and polyolefins. Moreover, the examples include ultraviolet curable epoxy resin adhesives of cationic curable type.

Since organic EL elements may be deteriorated due to thermal processes, preferable adhesives can adhere and cure at a temperature between room temperature and 80° C. Further, desiccating agents may be dispersed into the adhesives. Adhesives may be applied onto sealing portions with a commercial dispenser or printed on the portions similarly to screen printing.

Further, on the outside of the electrode at the side which faces the support substrate across the organic layer, a layer of an inorganic compound or organic compound may be formed preferably as a sealing layer so as to cover the electrode and the organic layer and to come in contact with the support substrate. In this case, materials used to form the sealing film may have a function to suppress penetration of substances to make elements deteriorate, such as moisture or oxygen. Examples of the materials include silicon oxide, silicon dioxide, and silicon nitride. Further, in order to improve brittleness of the sealing film, the sealing film may be preferably formed in a lamination structure of the inorganic layer and a layer composed of organic material. Formation methods of these films are not limited specifically, and examples of the formation methods include a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a thermal CVD method, and a coating method.

In order to form a gas phase and a liquid phase, it is preferable to inject inert gases such as nitrogen and argon and inactive liquids such as fluorinated hydrocarbon and silicone oil into a space between the sealing member and the display region of the organic EL element. Further, it is possible to form vacuum. Furthermore, hygroscopic compounds may be encapsulated in the inner portion.

Examples of the hygroscopic compounds include metal oxides (for example, sodium oxide, potassium oxide, calcium oxide, barium oxide, magnesium oxide, and aluminum oxide); sulfates (for example, sodium sulfate, calcium sulfate, magnesium sulfate, and cobalt sulfate); metal halides (for example, calcium chloride, magnesium chloride, cesium fluoride, tantalum fluoride, cerium bromide, magnesium bromide, barium iodide, and magnesium iodide); perchlorates (for example, barium perchlorate and magnesium perchlorate). In the sulfates, the metal halides, and the perchlorates, anhydrides are suitably employed.

Examples of the sealing include a casing type sealing (can sealing) and a close contact type sealing (solid sealing). From the viewpoint of thinner film, the solid sealing is desirable. Further, in the case of production of flexible organic EL elements, since a sealing member is required to have flexibility, the solid sealing is preferable.

Hereafter, description will be given to a desirable mode in the case of a solid sealing.

As adhesives for the sealing according to the present invention, heat curable adhesives, ultraviolet curable resins and the like may be used. Preferably, the heat curable adhesives such as epoxy resin, acrylic resin, and silicone resin may be used, and more preferably, epoxy-based heat curable adhesive resins may be used.

The water content of the adhesives used for the sealing according to the present invention may be preferably 300 ppm or less, more preferably 0.01 to 200 ppm, and most preferably 0.01 to 100 ppm.

Although the water content in the present invention may be allowed to be measured through any method, examples of the measuring methods include a volumetric aquameter (curl Fischer), an infrared aquameter, a microwave transmission type aquameter, a heat-drying weighing method, GC/MS, IR, DSC (differential scanning calorimeter), and TDS (Thermal Desorption Spectroscopy). Further, the employment of Precision aquameter AVM-3000 type (available from Omni-Tech. Company) enables to measure moisture from a pressure increase generated by evaporation of the moisture, and further enable to measure moisture percentage in a film or a solid film.

The water content of an adhesive for sealing may be adjusted by, for example, changing the placing time of the adhesive under a nitrogen atmosphere with a dew point temperature of −80° C. or less and an oxygen concentration of 0.8 ppm. Further, the adhesive may be dried by changing the placing time under a vacuum state of 100 Pa or less. Furthermore, although an adhesive material for sealing may be dried only via an adhesive, it may be also possible to arrange beforehand an adhesive material in a sealing member, and then to dry the adhesive material.

In the case of a close contact sealing (solid sealing), as a sealing component, a member in which an aluminum foil (30-μm thickness) is laminated on a PET (polyethylene terephthalate) with a thickness of 50 μm is used as the sealing member. On the aluminum surface of the above member used as sealing member, an adhesive for sealing is coated uniformly with a dispenser so as to be arranged beforehand. Successively, the resin substrate 1 and the sealing member 5 are subjected to positioning, and then brought in pressure contact (0.1 to 3 MPa) with each other, subjected to close contact and bonding (adhesion) at a temperature of 80 to 180° C., and sealed in a close contact manner (soli sealing).

Heating and pressing time may be changed depending on the kind, quantity, applied-area of adhesives. However, a temporary bond may be made with a pressure of 0.1 to 3 MPa, and a heat-curing time may be selected from a range of 5 seconds to 10 minutes under a temperature of 80 to 180° C.

It is preferable to use a heated pressure roll, because bonding with pressure (temporary bond) and heating can be performed simultaneously, and internal void can also be eliminated simultaneously.

Further, at the time of formation of an adhesive layer, a dispenser may be used in accordance with materials, and coating methods such as roll coating, spin coating, screen printing, spray coating, and printing methods may be used.

As described above, in the solid sealing, a sealing member and an organic EL element substrate between which there is no space are covered with resin. Examples of the sealing member include metal, such as stainless, aluminium, and magnesium alloy, plastics, such as polyethylene terephthalate, polycarbonate, polystyrene, nylon, and polyvinyl chloride; composites of these, and glass. If needed, in the case of resin film specifically, similarly to a resin substrate, a laminated sealing member in which gas barrier layers such aluminium, aluminium oxide, silicon oxide, and silicon nitride are laminated, may be employed. The gas barrier layer may be formed on the both surfaces or one surface of a sealing member by sputtering, vacuum deposition, etc. before formation of the sealing member, or may be formed on the both surfaces or one surface of a sealing member by the same way after the sealing. The gas barrier layer also preferably has an oxygen permeability of $1 \times 10^{-3}$ ml/(m$^2$·24 h·atm) or less and the water vapor permeability (25±0.5° C., relative humidity (90±2)% RH) of $1 \times 10^{-3}$ g/(m$^2$·24 h) or less.

The sealing member may be a film in which a metallic foil such as aluminium is laminated. In the method for laminating a polymer film on one surface of the metallic foil, generally-used lamination machines may be employed. As the adhesives, adhesives, such as polyurethane-based, polyester-based, epoxy-based, and acrylic-basal adhesives may be used. If needed, a curing agent may be used in combination. Although a hot melt lamination method, an extrusion lamination method, and a co-extrusion lamination method, may be used, a dry lamination method is desirable.

Further, in the case where a metallic foil is formed by sputtering or vapor deposition and fluid electrode materials are formed from conductive paste, a polymer film is made conversely as a substrate, and a metallic foil is formed as a film on this substrate.

<<Protective Film and Protective Plate>>

On the outside of the sealing film, or a film for the sealing at the side which faces the support substrate across the organic layer, a protective film or a protective plate to enhance the mechanical strength of an organic EL element may be disposed. Specifically, in the case where sealing is achieved via the sealing film, since its mechanical strength is not always high enough, it is preferable to dispose such a protective film or protective plate. Examples of materials usable for these include glass plates, polymer plate and films, and metal plate and films which are similar to those employed for the above sealing. However, from the viewpoint of light weight and an ability to make a film thinner, it is preferable to employ polymer films.

In the present invention, it is desirable to dispose a light take-out member at any position between a flexible substrate and an anode or on the light outgoing side of the flexible substrate.

Examples of the light take-out member include a prism sheet, a lens sheet, and a diffusion sheet. Further, the examples include an interface to cause the total reflection, and a diffraction grating and a diffusion structure which are introduced in any medium.

Usually, in an organic electroluminescence element which emits light from a substrate, a part of light emitted from a light emitting layer causes the total reflection on the interface between the substrate and air, which results in a problem of loss of light. In order to solve this problem, the surface of a substrate is processed so as to be shaped in the form of a prism or lens, or a prism sheet, a lens sheet, or a diffusion sheet is pasted on the surface of the substrate, thereby suppressing the total reflection and improving the light take-out efficiency.

Further, in order to enhance the light takeout efficiency, a technique to introduce a diffraction grating or a technique to introduce a diffusion structure into an interface to cause the total reflection or any medium is known.

<<Method of Producing an Organic EL Element>>

As one example of the method of producing the organic EL element of the present invention, description will be made for a method of producing an organic EL element constituted by anode/positive hole injection layer/positive hole transporting layer/light emitting layer/electron transporting layer/electron injection layer/cathode.

At the outset, a thin film composed of desired electrode substances, for example, anode substances is formed on an appropriate base material so as to have a thickness of 1 μm or less, preferably 10 nm to 200 nm, whereby an anode is produced.

Subsequently, on the above anode, organic layers (organic compound thin layers) being organic EL element, materials are formed such that the organic layers include a positive hole injection layer, a positive hole transporting layer, a light emitting layer, an electron transporting layer, and a positive hole blocking layer.

Examples of the forming methods for these layers include, as mentioned above, vacuum deposition processes, and wet processes (for example, a spin coating method, casting method, the coating method, and blade coating method, roll coating method, ink jet method, printing method, spray coating method, curtain coating method, and LB method (Langmuir Blodgett method). At least the positive hole injection layer is preferably formed through the wet processes. Further, for the other organic layers than the positive hole injection layer, the wet processes are also preferable in the present invention from the viewpoints that a homogeneous layer may be obtained easily and pin holes are not likely to be produced. Among the wet processes, the coating methods, such as a spin coating method, casting method, the coating method, blade coating method, roll coating method, and an ink jet method, are preferable especially.

Examples of liquid media used to dissolve or disperse organic EL materials according to the present invention include ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such, as cyclohexane, decaline, and dodecane; and organic solvents such as dimethylformamide (DMF) and dimethyl sulfoxide (DMSO). Further, examples of the dispersion methods include ultrasonic wave dispersion, high shearing force dispersion, and media dispersion.

After the formation of the above layers, a thin layer composed of cathode materials is formed on the above layers so as to have a film thickness of 1 μm or less, preferably within a range of 50 nm to 200 nm through a method such as vapor deposition or sputtering, whereby a cathode is disposed so that a desired organic EL element is produced.

In the present invention, after the disposition of the cathode, it is desirable to perform heating treatment for the organic EL element at a temperature within a range of 40 to 200° C., because the effects of preservation stability under high temperature and suppression of chromaticity fluctuation become remarkably. In the case of use of resin film, the temperature is preferably 40 to 150° C., more preferably 40 to 120° C. A heating processing time is preferably within a range of 10 seconds to 30 minutes.

After this heating treatment, the above close contact sealing or sealing member is bonded with the electrode and the support substrate with adhesives, whereby an organic EL element is produced.

<<Use>>

It is possible to employ the organic EL element of the present invention as display devices, displays, and various types of light emitting sources. Examples of light emitting sources include home lighting, car lighting, backlights for clocks and liquid crystals, billboards, signals, light sources of optical memory media, light sources of electrophotographic copiers, light sources of optical communication processors, and light sources of optical sensors, and in addition, include wide range applications such as general domestic electric appliances which need display devices. In particular, the organic EL element can be used effectively for the applications as backlight of liquid crystal display device in which the organic EL element is used in combination with color filters and illumination light sources.

If needed, the organic EL element of the present invention may be subjected to patterning through a metal mask or an ink-jet printing method during film formation. At the time of the patterning, only an electrode may be subjected to the patterning, an electrode and a light emitting layer may be subjected to the patterning, or the whole layers of the organic EL element may be subjected to the patterning. In the production of the organic EL element it may be possible to employ conventional methods.

EXAMPLE

Hereafter, although the present invention is described specifically based on examples, the present invention should not be limited to these examples. In the examples, the indication of "parts" or "%" represents "parts by weight" or "% by weight" unless otherwise specified.

Example 1

<<Production of an Organic EL Element>>
[Production of Organic EL Element 101]
(Production of a Flexible Film with Gas Barrier Properties)

As a flexible film, on the whole surface of a polyethylenenaphthalate film (available from Teijin E. I. du Pont de Nemours & Co., hereafter, abbreviated as PEN) at a side forming a first electrode, an inorganic gas barrier film composed of SiOx were formed so as to have a thickness of 500 nm by use of an atmospheric plasma discharge processing apparatus described in Japanese Unexamined Patent Publication No. 2004-68143, whereby a flexible film with gas barrier properties with an oxygen permeability of 0.001 ml/m$^2$/day or less and a water vapor permeability of 0.001 g/m$^2$/day or less was produced.

(Formation of a First Electrode Layer)

On the prepared flexible film with gas harrier properties, an ITO (indium tin oxide) substrate with a thickness of 120 nm was formed by sputtering, and the ITO film was subjected to patterning through a photolithographic method, whereby a first electrode layer was formed. In the patterning, a pattern to form a light emitting area of 50 mm$^2$ was used.

(Formation of a Positive Hole Injection Layer)

After the patterning, the ITO substrate was subjected to ultrasonic cleaning with isopropyl alcohol, dried with dry nitrogen gas, and subjected to UV ozone cleaning for five minutes. On this substrate, a liquid in which poly (3,4-ethylenedioxythiophene)-poly styrene sulfonate (in Table 1, abbreviated as PEDOT/PSS, trade name of Baytron P Al 4083 available from Baytron) was diluted to 70% with purified water was coated so as to form a film by a spin coat method while being rotated at 3000 rpm for 30 seconds. Subsequently, the resulting film was dried at 200° C. for one hour, whereby a positive hole injection layer with a thickness of 30 nm was disposed.

(Formation of a Positive Hole Transporting Layer)

This substrate was shifted under a nitrogen, atmosphere using nitrogen gas (grade GI), a liquid in which Exemplary compound (60) (Mw=80,000) being the positive hole transporting material was dissolved by 05% in chlorobenzene was coated so as to form a film by a spin coat method while being rotated at 1500 rpm for 30 seconds. Subsequently, the resulting film was held under 160° C. for 30 minutes, whereby a positive hole transporting layer with a film thickness of 30 nm was prepared.

(Formation of a Light Emitting Layer)

Next, a light emitting layer composition of the following composition was coated by a spin coat method while being rotated at 1500 rpm for 30 seconds so as to form a film, and the resulting film was held under 120° C. for 30 minutes, whereby a light emitting layer with a film thickness of 70 nm was formed.

| <Light emitting layer composition> | |
|---|---|
| Exemplary compound A-67 | 22.3 parts by weight |
| Exemplary compound D-66 | 4.9 parts by weight |
| Exemplary compound D-67 | 0.05 parts by weight |
| Exemplary compound D-80 | 0.05 parts by weight |
| Isopropyl acetate | 2,000 parts by weight |

(Formation of an Electron Transporting Layer)

Successively, a liquid in which 30 mg of Exemplary compound A-77 represented by Formula (A) and 0.3 mg of Exemplary compound CN-1 represented by Formula (B) were dissolved in 4 ml of tetrafluoropropanol (TFPO) is coated by a spin coat method while being rotated at 1500 rpm for 30 seconds so as to form a film, and then the resulting film was held under 120° C. for 30 minutes, whereby an electron transporting layer with a film thickness of 30 nm was formed.

(Formation of an Electron Injection Layer and a Cathode)

Successively, the substrate was attached to a vacuum deposition apparatus without being exposed to air.

Further, a resistance heating boat which was made from molybdenum and in which sodium fluoride and potassium fluoride were put, was attached to a vacuum deposition apparatus, and the inside pressure of a vacuum chamber was reduced to $4\times10^{-5}$ Pa. Thereafter, the above boat was electrically energized to heat sodium fluoride such that fire sodium fluoride was made to form a thin film with a thickness of 1 nm at a rate of 0.02 nm/seconds on the electron transporting layer. Successively, the potassium fluoride was made to form an electron injection layer with a thickness of 1.5 nm at a rate of 0.02 nm/second on the sodium fluoride layer. Further, aluminium was vapor-deposited to form a cathode with a thickness of 100 nm.

(Sealing and Production of an Organic EL Element)

Successively, a sealing member was pasted using a commercially-available roll laminating device, whereby Organic EL element 101 was produced.

In the seating, a polyethylene terephthalate (PET) film with a thickness of 12 μm was laminated on a flexible aluminium foil (available from Toyo Aluminium K.K.) with a thickness of 30 μm with an adhesive (urethane-based adhesives of 2 liquid reaction type) for dry lamination, and then the resultant laminate (an adhesive layer with a thickness of 1.5 μm) was used as the sealing member.

As a sealing adhesive on an aluminum surface, a heat curable adhesive was coated uniformly with a thickness of 20 μm along a joining surface (gloss surface) of the aluminium foil by use of a dispenser. The coated adhesive was dried under a vacuum of 100 Pa or less for 12 hours. Further, the coated adhesive was shifted to a nitrogen atmosphere with a dew point temperature of −80° C. or less and air oxygen concentration of 0.8 ppm, and dried for 12 hours such that the water content of the sealing adhesives was adjusted to be 1.00 ppm or less.

As the heat curing adhesives, an epoxy adhesive in which the following (A) to (C) were mixed, was used.

(A) Bisphenol A diglycidyl ether (DGEBA)
(B) Dicyandiamide (DICY)
(C) Epoxy adduct-based curing accelerator With the above-mentioned operations, so as to attain the mode illustrated in FIG. 1, a sealing substrate was arranged in a close contact manner so as to cover a take-out electrode and a joining portion of an electrode lead, and the close-contact sealing was made on the press-contact conditions of a press-contact roll temperature of 120° C., a pressure of 0.5 MPa, and a device speed of 0.3 m/min, whereby Organic EL element 101 was produced.

In FIG. 1, a symbol EL represents an organic EL element, a numeral 1 represents a flexible substrate, 2 represents an anode, 3 represents an organic layer including an electron transporting layer containing a compound having a dibenzofuran skeleton and a crown ether compound according to the present invention, 4 represents a cathode, 5 represents a flexible sealing member, and 6 represents an adhesives for sealing.

[Production of Organic EL Elements 102 to 122]

Organic EL elements 102 to 122 were produced in the same way as that in Organic EL elements 101 except that the kind of the host compound used for formation of a light emitting layer, the kind of the crown ether compound, the respective added amounts of them, the kind of the electron transporting material used for formation of the electron transporting layer, the kind of the crown ether compound and its added amount, and existence or nonexistence of acetic acid Cs being an organic acid alkali metal salt were changed into the combinations described in Table 1 and Table 2.

TABLE 1

| Organic EL element No. | Positive hole injection layer Upper stage: *1, *7 | Positive hole transporting layer Upper stage: *2, *7 | Light emitting layer Upper stage: *3, *7 | Upper stage: *4, Lower stage: Added amount (%) | Electron transporting layer Upper stage: *5, *7 | Upper stage: *4, Lower stage: Added amount (%) | Upper stage: Additive agent, Lower stage: Added amount (%) | Electron injection layer Upper stage: *6, *7 | Remarks |
|---|---|---|---|---|---|---|---|---|---|
| 101 | PEDOT/PSS 60 | Compound(60) 30 | Compound A-67 70 | — | Compound A-77 30 | Compound CN-1 1.0 | Acetic acid Cs 6.0 | NaF/KF 1.0/1.5 | Inv. |
| 102 | PEDOT/PSS 60 | Compound(60) 30 | Compound A-67 70 | — | Compound A-77 30 | Compound CN-1 0.5 | Acetic acid Cs 6.0 | NaF/KF 1.0/1.5 | Inv. |
| 103 | PEDOT/PSS 60 | Compound(60) 30 | Compound A-67 70 | — | Compound A-77 30 | Compound CN-1 2.0 | Acetic acid Cs 6.0 | NaF/KF 1.0/1.5 | Inv. |
| 104 | PEDOT/PSS 60 | Compound(60) 30 | Compound A-67 70 | — | Compound A-77 30 | Compound CN-1 1.0 | — | NaF/KF 1.0/1.5 | Inv. |

TABLE 1-continued

| Organic EL element No. | Positive hole injection layer Upper stage: *1, *7 | Positive hole transporting layer Upper stage: *2, *7 | Light emitting layer Upper stage: *3, *7 | Light emitting layer Upper stage: *4, Lower stage: Added amount (%) | Electron transporting layer Upper stage: *5, *7 | Electron transporting layer Upper stage: *4, Lower stage: Added amount (%) | Upper stage: Additive agent, Lower stage: Added amount (%) | Electron injection layer Upper stage: *6, *7 | Remarks |
|---|---|---|---|---|---|---|---|---|---|
| 105 | PEDOT/PSS 60 | Compound(60) 30 | Compound A-4 70 | — | Compound A-77 30 | Compound CN-1 1.0 | Acetic acid Cs 6.0 | NaF/KF 1.0/1.5 | Inv. |
| 106 | PEDOT/PSS 60 | Compound(60) 30 | Compound A-71 70 | — | Compound A-77 30 | Compound CN-1 1.0 | Acetic acid Cs 6.0 | NaF/KF 1.0/1.5 | Inv. |
| 107 | PEDOT/PSS 60 | Compound(60) 30 | Compound A-64 70 | — | Compound A-77 30 | Compound CN-1 1.0 | Acetic acid Cs 6.0 | NaF/KF 1.0/1.5 | Inv. |
| 108 | PEDOT/PSS 60 | Compound(60) 30 | Compound A-68 70 | — | Compound A-77 30 | Compound CN-1 1.0 | Acetic acid Cs 6.0 | NaF/KF 1.0/1.5 | Inv. |
| 109 | PEDOT/PSS 60 | Compound(60) 30 | Compound A-67 70 | — | Compound A-77 30 | Compound CN-17 1.0 | Acetic acid Cs 6.0 | NaF/KF 1.0/1.5 | Inv. |
| 110 | PEDOT/PSS 60 | Compound(60) 30 | Compound A-67 70 | — | Compound A-77 30 | Compound CN-18 1.0 | Acetic acid Cs 6.0 | NaF/KF 1.0/1.5 | Inv. |
| 111 | PEDOT/PSS 60 | Compound(60) 30 | Compound A-67 70 | — | Compound A-77 30 | Compound CN-20 1.0 | Acetic acid Cs 6.0 | NaF/KF 1.0/1.5 | Inv. |

*1: Positive hole injecting material (PEDOT/PSS),
*2: Positive hole transporting material (Exemplary compound (60)),
Inv.: Inventive,
*3: Host material,
*4: Compound represented by Formula (B) or (C),
*5: Electron transporting material,
*6: Electron injection material,
*7: Lower stage thickness (nm)

TABLE 2

| Organic EL element No. | Positive hole injection layer Upper stage: *1, *7 | Positive hole transporting layer Upper stage: *2, *7 | Light emitting layer Upper stage: *3, *7 | Light emitting layer Upper stage: *4, Lower stage: Added amount (%) | Electron transporting layer Upper stage: *5, *7 | Electron transporting layer Upper stage: *4, Lower stage: Added amount (%) | Upper stage: Additive agent, Lower stage: Added amount (%) | Electron injection layer Upper stage: *6, *7 | Remarks |
|---|---|---|---|---|---|---|---|---|---|
| 112 | PEDOT/PSS 60 | Cpd.(60) 30 | Cpd. A-67 70 | — | Cpd. A-77 30 | Cpd. CN-11, 1.0 | Acetic acid Cs 6.0 | NaF/KF 1.0/1.5 | Inv. |
| 113 | PEDOT/PSS 60 | Cpd.(60) 30 | Cpd. A-67 70 | — | Cpd. A-77 30 | Cpd. CN-7, 1.2 | Acetic acid Cs 6.0 | NaF/KF 1.0/1.5 | Inv. |
| 114 | PEDOT/PSS 60 | Cpd.(60) 30 | Cpd. A-67 70 | Cpd. CN-1, 0.006 | Cpd. A-77 30 | Cpd. CN-4, 2.0 | Acetic acid Cs 6.0 | NaF/KF 1.0/1.5 | Inv. |
| 115 | PEDOT/PSS 60 | Cpd.(60) 30 | Cpd. A-67 70 | Cpd. CN-10, 0.08 | Cpd. A-77 30 | Cpd. CN-1, 1.0 | Acetic acid Cs 6.0 | NaF/KF 1.0/1.5 | Inv. |
| 116 | PEDOT/PSS 60 | Cpd.(60) 30 | Cpd. A-67 70 | Cpd. CN-4, 0.10 | Cpd. A-77 30 | Cpd. CN-1, 1.0 | Acetic acid Cs 6.0 | NaF/KF 1.0/1.5 | Inv. |
| 117 | PEDOT/PSS 60 | Cpd.(60) 30 | Cpd. A-67 70 | Cpd. CN-17, 0.10 | Cpd. A-77 30 | Cpd. CN-1, 1.0 | Acetic acid Cs 6.0 | NaF/KF 1.0/1.5 | Inv. |
| 118 | PEDOT/PSS 60 | Cpd.(60) 30 | Cpd. A-67 70 | Cpd. CN-18, 0.10 | Cpd. A-77 30 | Cpd. CN-1, 1.0 | Acetic acid Cs 6.0 | NaF/KF 1.0/1.5 | Inv. |
| 119 | PEDOT/PSS 60 | Cpd.(60) 30 | Cpd. A-67 70 | Cpd. CN-20, 0.10 | Cpd. A-77 30 | Cpd. CN-1, 1.0 | Acetic acid Cs 6.0 | NaF/KF 1.0/1.5 | Inv. |
| 120 | PEDOT/PSS 60 | Cpd.(60) 30 | H-A 70 | — | E-B 30 | — | Acetic acid Cs 6.0 | NaF/KF 1.0/1.5 | Comp. |
| 121 | PEDOT/PSS 60 | Cpd.(60) 30 | Cpd. A-67 70 | — | Cpd. A-77 30 | — | — | NaF/KF 1.0/1.5 | Comp. |
| 122 | PEDOT/PSS 60 | Cpd.(60) 30 | H-A 70 | — | E-B 30 | Cpd. CN-1, 1.0 | — | NaF/KF 1.0/1.5 | Comp. |

*1: Positive hole injecting material (PEDOT/PSS),
*2: Positive hole transporting material (Exemplary compound (60)),
*3: Host material,
*4: Compound represented by Formula (B) or (C),
*5: Electron transporting material,
*6: Electron injection material,
*7: Lower stage thickness (nm),
Comp.: Comparative,
Inv.: Inventive,
Cpd.: Compound

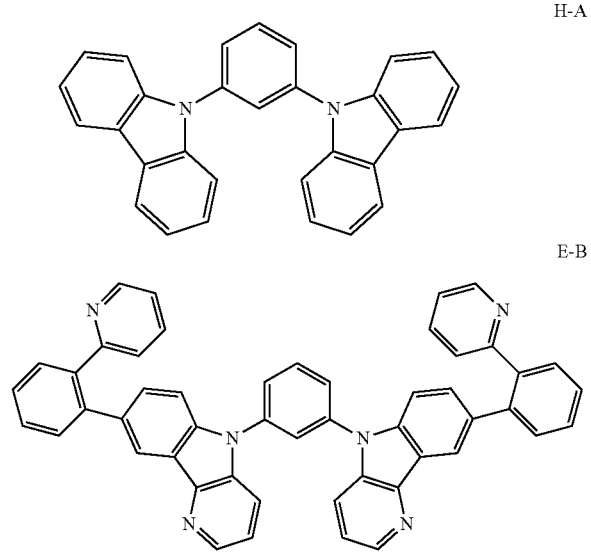

H-A

E-B

<<Evaluation of Organic EL Elements>>

The following evaluations were made for each of Organic EL elements 101 to 122 produced with use of the above-mentioned flexible film.

(Measurement of Power Efficiency)

Each organic EL element was made to perform lightening on the constant luminance condition of 1,000 cd/m² under room temperature (about 23 to 25° C.), and the light emission luminance of each organic EL element was measured by use of a spectrum radiation luminance meter CS-2000 (available from Konica Minolta Sensing Company). Successively, power efficiency at a light emission luminance 1000 cd/m² was obtained. In Tables 1 and 2, the power efficiency of each organic EL element is indicated with a relative value to the power efficiency of Organic EL element 114 which was made to 1.00.

(Evaluation of Continuous Drive Stability)

Each organic EL element was wound around a cylinder With a radius of 5 cm, and was continuously driven or the wound state, then the luminance of light emission from each organic EL was measure with a spectrum radiation luminance meter CS-2000 (available from Konica Minolta Sensing Company) and the half-life period of the luminance (LT50) was obtained. In the drive condition, a current value was set to 4000 cd/m² at the time of start of continuation drive. The half life period of each organic EL element was determined as a relative value to that of Organic EL element 114 which was made to 1.00, and the half-life period is used as a scale for continuous drive stability. That is, it means that the larger the value of the half-life period is, the more excellent the continuous drive stability is.

(Evaluation of Chromaticity Stability)

In the evaluation of the above-mentioned continuous drive stability, the chromaticity at the time of start of continuous drive (t=0) and the chromaticity at LT50 being the half life of luminance were measured by a spectrum radiation luminance meter CS-2000 (available from Konica Minolta Sensing Company), and then, a chromaticity difference ΔExy was obtained from the measurements. The chromaticity difference is used as a scale for chromaticity stability. That is, it means that the smaller the value of ΔExy is, the more excellent the chromaticity stability is.

(Evaluation of Preservation Stability Under High Temperature)

Each organic EL element was preserved under the environment of 85° C. for 300 hours. The luminance was measured before and after the high temperature processing by a spectrum radiation luminance meter CS-2000 (available from Konica Minolta Sensing Company), and a Δluminance (%) as a luminance change ratio was determined in the following formula from the measurements. The luminance change ratio is used as a scale for preservation stability under high temperature. That is, it means that the smaller the Δluminance (%) is, the more excellent the preservation stability under high temperature is.

Δluminance (%)={(luminance before the high temperature processing−luminance after the high temperature processing)/luminance before the high temperature processing}×100

The results obtained in the above evaluations are shown in Table 3.

TABLE 3

| Organic EL element No. | Power efficiency | Continuous drive stability LT50 (hours) | Chromaticity stability ΔExy | Preservation stability under high temperature Δluminance (%) | Remarks |
|---|---|---|---|---|---|
| 101 | 2.20 | 1.52 | 0.007 | 5 | Inventive |
| 102 | 2.20 | 1.67 | 0.010 | 18 | Inventive |
| 103 | 2.00 | 1.41 | 0.012 | 3 | Inventive |
| 104 | 2.00 | 1.21 | 0.020 | 10 | Inventive |
| 105 | 1.80 | 1.52 | 0.008 | 5 | Inventive |
| 106 | 1.60 | 1.52 | 0.007 | 5 | Inventive |
| 107 | 1.52 | 1.52 | 0.006 | 5 | Inventive |
| 108 | 2.20 | 1.52 | 0.007 | 5 | Inventive |
| 109 | 2.20 | 1.52 | 0.007 | 5 | Inventive |
| 110 | 2.20 | 1.52 | 0.007 | 5 | Inventive |
| 111 | 2.20 | 1.52 | 0.007 | 5 | Inventive |
| 112 | 2.20 | 1.59 | 0.010 | 5 | Inventive |
| 113 | 2.20 | 1.44 | 0.009 | 5 | Inventive |
| 114 | 2.40 | 1.36 | 0.009 | 8 | Inventive |
| 115 | 2.40 | 1.36 | 0.010 | 9 | Inventive |
| 116 | 2.40 | 1.36 | 0.013 | 8 | Inventive |
| 117 | 2.40 | 1.36 | 0.013 | 8 | Inventive |
| 118 | 2.40 | 1.36 | 0.013 | 8 | Inventive |

TABLE 3-continued

| Organic EL element No. | Power efficiency | Continuous drive stability LT50 (hours) | Chromaticity stability ΔExy | Preservation stability under high temperature Δluminance (%) | Remarks |
|---|---|---|---|---|---|
| 119 | 2.40 | 1.36 | 0.013 | 8 | Inventive |
| 120 | 1.00 | 1.00 | 0.080 | 50 | Comparative |
| 121 | 0.80 | 0.83 | 0.065 | 30 | Comparative |
| 122 | 0.92 | 0.98 | 0.046 | 45 | Comparative |

As is clear from Table 3, the organic EL element of the present invention which includes an organic layer containing a compound having a dibenzofuran skeleton and a crown ether compound, has greatly-improved power efficiency and is excellent in continuous drive stability, chromaticity stability, and preservation stability under high temperature as compared with Comparative examples. In addition, it turns out that the addition of cesium acetate as an organic acid alkali metal salt improves more the continuous drive stability, the chromaticity stability, and the preservation stability under high temperature.

Example 2

<<Production of an Organic EL Element>>
[Production of Organic EL Element 201]

Organic EL element 201 was produced in the same way as that in Organic EL element 101 except that a glass substrate having an indium tin oxide (ITO) film on its surface was used in place of the polyethylenenaphthalate film as the substrate and heating treatment was applied at 100° C. for 10 minutes after the formation of the cathode. Subsequently, the vacuum-deposited surface side of the produced Organic EL element 201 was covered with a glass case, and Organic EL element 201 was sealed within a glove box under a nitrogen atmosphere (under an atmosphere of high-purity nitrogen gas with a purity of not less than 99.999%) without being brought in contact with air.

[Production of Organic EL Elements 202 to 206]

Organic EL elements 202 to 206 were produced in the same way as that in Organic EL elements 201 except that the kind of the host compound used for formation of a light emitting layer, the kind of the electron transporting material used for formation of the electron transporting layer, the kind of the crown ether compound, existence or none-existence of acetic acid Cs being an organic acid alkali metal salt and existence or none-existence of heating treatment after the formation of the cathode were changed into the combinations described in Table 4.

TABLE 4

| Organic EL element No. | Positive hole injection layer Upper stage: *1, Lower stage: thickness (nm) | Positive hole transporting layer Upper stage: *2, Lower stage: thickness (nm) | Light emitting layer Upper stage: *3, Lower stage: thickness (nm) | Electron transporting layer | | | Electron injection layer Upper stage: *6, Lower stage: thickness (nm) | Heating treatment after formation of a cathode Upper stage: temperature (° C.), Lower stage: time (minutes) | Remarks |
|---|---|---|---|---|---|---|---|---|---|
| | | | | Upper stage: *5, Lower stage: length (nm) | Upper stage: *4, Lower stage: Added amount (%) | Upper stage: Additive agent, Lower stage: Added amount (%) | | | |
| 201 | PEDOT/PSS 60 | Compound(60) 30 | Compound A-67 70 | Compound A-77 30 | Compound CN-1 1.0 | Acetic acid Cs 6.0 | NaF/KF 1.0/1.5 | 100 10 | Inv. |
| 202 | PEDOT/PSS 60 | Compound(60) 30 | Compound A-67 70 | Compound A-77 30 | Compound CN-1 0.5 | Acetic acid Cs 6.0 | NaF/KF 1.0/1.5 | — — | Inv. |
| 203 | PEDOT/PSS 60 | Compound(60) 30 | H-A 70 | E-B 30 | Compound CN-1 2.0 | Acetic acid Cs 6.0 | NaF/KF 1.0/1.5 | 100 10 | Comp. |
| 204 | PEDOT/PSS 60 | Compound(60) 30 | H-A 70 | E-B 30 | — | Acetic acid Cs 6.0 | NaF/KF 1.0/1.5 | 100 10 | Comp. |
| 205 | PEDOT/PSS 60 | Compound(60) 30 | Compound A-67 70 | Compound A-77 30 | — | — | NaF/KF 1.0/1.5 | — | Comp. |
| 206 | PEDOT/PSS 60 | Compound(60) 30 | H-A 70 | E-B 30 | Compound CN-1 1.0 | — | NaF/KF 1.0/1.5 | — | Comp. |

*1: Positive hole injecting material (PEDOT/PSS),
*2: Positive hole transporting material (Exemplary compound (60))
*3: Host material,
*4: Compound represented by Formula (B) or (C),
*5: Electron transporting material,
*6: Electron injection material
Inv.: Inventive,
Comp.: Comparative <<Evaluation of Organic EL Elements>>

Evaluation was performed for each Organic EL element produced in the above manners in terms of power efficiency, continuous drive stability, chromaticity stability and preservation stability under high temperature in the same ways as those in Example 1. In the evaluations of power efficiency and continuous drive stability, the evaluation was made with a relative value to that of Organic EL element 204 which was made to 1.00.

The results obtained in the above evaluations are shown in Table 5.

TABLE 5

| Organic EL element No. | Power efficiency | Continuous drive stability LT50 (hours) | Chromaticity stability ΔExy | Preservation stability under high temperature Δluminance (%) | Remarks |
|---|---|---|---|---|---|
| 201 | 2.20 | 1.82 | 0.025 | 5 | Inventive |
| 202 | 1.52 | 1.36 | 0.030 | 15 | Inventive |
| 203 | 1.20 | 1.27 | 0.040 | 30 | Comparative |
| 204 | 1.00 | 1.00 | 0.075 | 40 | Comparative |
| 205 | 0.80 | 1.45 | 0.055 | 30 | Comparative |
| 206 | 0.88 | 1.18 | 0.060 | 45 | Comparative |

As is clear from Table 5, even in the case of the glass substrate used as the substrate, the organic EL element of the present invention which includes an organic layer containing a compound having a dibenzofuran skeleton and a crown ether compound, has greatly-improved power efficiency and is excellent in continuous drive stability, chromaticity stability, and preservation stability under high temperature as compared with Comparative examples. In addition, as a result of the comparison between Table 3 in Example 1 and Table 5, it turns out that the employment of the film substrate as the substrate improves the chromaticity stability more.

EXPLANATION OF REFERENCE SYMBOLS

1 Flexible Substrate
2 Anode
3 Organic Layer
4 Cathode
5 Flexible sealing member
6 Adhesive for sealing
EL Organic EL element

The invention claimed is:

1. An organic electroluminescence element, comprising:
a substrate,
an anode and a cathode each disposed on the substrate; and
a plurality of organic layers which is disposed between the anode and the cathode and includes a light emitting layer,
wherein at least one organic layer of the plurality of organic layers contains a compound having a dibenzofuran skeleton and a crown ether compound.

2. The organic electroluminescence element according to claim 1, wherein the organic layer containing a compound having a dibenzofuran skeleton and a crown ether compound is a layer having an electron transporting property.

3. The organic electroluminescence element according to claim 2, wherein the layer having an electron transporting property is an electron transporting layer.

4. The organic electroluminescence element according to claim 1, wherein the organic layer containing a compound having a dibenzofuran skeleton and a crown ether compound is a light emitting layer.

5. The organic electroluminescence element according to claim 1, wherein the organic layer containing a compound having a dibenzofuran skeleton and a crown ether compound further contains an organic acid alkali metal salt.

6. The organic electroluminescence element according to claim 1, wherein the compound having a dibenzofuran skeleton is a compound represented by the following Formula (A),

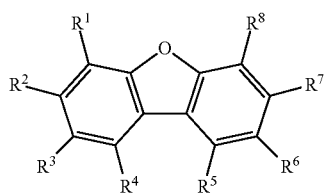

Formula (A)

where in Formula (A), $R^1$ to $R^8$ each represents a hydrogen atom, an alkyl group, an aryl group, a hetero aryl group, a carbazolyl group, an azacarbazolyl group, or a diaza carbazolyl group.

7. The organic electroluminescence element according to claim 6, wherein at least one of $R^1$ to $R^8$ is a carbazolyl group or an azacarbazolyl group.

8. The organic electroluminescence element according to claim 1, wherein the crown ether compound is at least one compound selected from the group consisting of compounds represented by Formula (B), Formula (C), and Formula (D) described below,

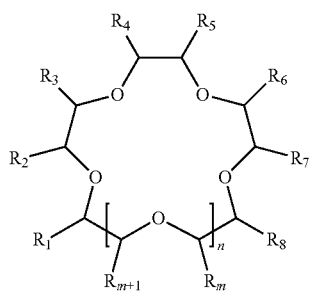

Formula (B)

where in Formula (B), n represents an integer of 0 to 4; $R_1$ to $R_8$, $R_m$, and $R_{m+1}$ each represents a hydrogen atom or a hydrocarbon group with 1 to 10 carbon atoms; m represents an odd number of 9 to 15 which is represented by a formula of (2n+7), where n is 1 to 4; the hydrocarbon group may be substituted with one or more functional groups selected from a group consisting of a straight chain or branch chain alkoxyl group with 1 to 10 carbon atoms, —OH group, —COOH group and —COO-alkyl ester group in which an alkyl portion is a straight chain or branch chain residue with 1 to 10 carbon atoms; and $R_2$ and $R_3$, or $R_4$ and $R_5$, or $R_6$ and $R_7$, or $R_8$ and $R_9$ may form a ring-shaped skeleton by linking with each other;

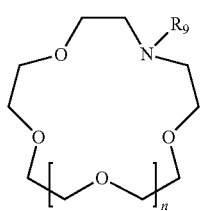

Formula (C)

where in Formula (C), $R_9$ represents a hydrogen atom, an alkyl group which may have a substituent or a phenyl group which may have a substituent, and "n" represents an integer of 0 to 5; and

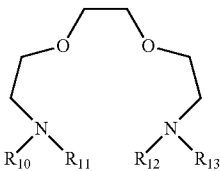

Formula (D)

where in Formula (D), $R_{10}$ to $R_{13}$ each represents independently a hydrogen atom, an alkyl group which may have a substituent or a phenyl group which may have a substituent; and, $R_{10}$ and $R_{12}$, or $R_{10}$ and $R_{13}$, or $R_{11}$ and $R_{12}$, or $R_{11}$ and $R_{13}$ are linked via an alkylene oxide group so as to form a ring-shaped compound.

9. A method for producing an organic electroluminescence element which has an anode and a cathode on a substrate and has a plurality of organic layers which is disposed between the anode and the cathode and includes a light emitting layer, wherein at least one organic layer of the plurality of organic layers contains a compound having a dibenzofuran skeleton and a crown ether compound, the method comprising:
   1) a process of disposing an electrode on a substrate;
   2) a process of disposing the plurality of organic layers including a light emitting layer;
   3) a process of disposing other electrode on the plurality of organic layers; and
   4) a process of heating at 40 to 150° C. after the disposing of the other electrode; sequentially in this order.

* * * * *